US009177960B2

(12) United States Patent
Seo

(10) Patent No.: US 9,177,960 B2
(45) Date of Patent: Nov. 3, 2015

(54) METHOD OF FORMING SEMICONDUCTOR DEVICE

(71) Applicant: SAMSUNG ELECTRONICS CO., LTD., Suwon-Si, Gyeonggi-Do (KR)

(72) Inventor: Jung-Woo Seo, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 64 days.

(21) Appl. No.: 14/016,254

(22) Filed: Sep. 3, 2013

(65) Prior Publication Data

US 2014/0154863 A1    Jun. 5, 2014

(30) Foreign Application Priority Data

Nov. 30, 2012 (KR) .................. 10-2012-0138254

(51) Int. Cl.
*H01L 29/66* (2006.01)
*H01L 21/336* (2006.01)
*H01L 27/108* (2006.01)
*H01L 49/02* (2006.01)

(52) U.S. Cl.
CPC .... *H01L 27/10814* (2013.01); *H01L 27/10852* (2013.01); *H01L 27/10876* (2013.01); *H01L 28/86* (2013.01); *H01L 28/90* (2013.01)

(58) Field of Classification Search
CPC ............ H01L 21/8238; H01L 27/0922; H01L 27/11807; H01L 2027/11807; H01L 21/76897; H01L 21/8224; H01L 21/8228; H01L 21/8234; H01L 21/823885; H01L 29/0847; H01L 29/42316; H01L 29/42384; H01L 29/66
USPC ......... 438/303, 591, 618, 421, 584, 637, 783, 438/763
See application file for complete search history.

(56) References Cited

U.S. PATENT DOCUMENTS

| 7,288,454 | B2 | 10/2007 | Lee et al. |
| 7,666,797 | B2 | 2/2010 | Shea et al. |
| 7,723,183 | B2 | 5/2010 | Cho et al. |
| 2006/0113580 | A1* | 6/2006 | Cho ................. H01L 27/10852 257/306 |
| 2010/0240191 | A1* | 9/2010 | Chung et al. .................. 438/386 |
| 2012/0064680 | A1* | 3/2012 | Oh et al. ........................ 438/239 |
| 2012/0086014 | A1* | 4/2012 | Kim et al. ....................... 257/76 |
| 2012/0086060 | A1* | 4/2012 | Taniguchi ..................... 257/296 |

FOREIGN PATENT DOCUMENTS

| KR | 10-0532202 B1 | 11/2005 |
| KR | 10-2007-0110747 A | 11/2007 |
| KR | 10-2007-0114952 A | 12/2007 |
| KR | 10-200-0000843 A | 1/2008 |

* cited by examiner

*Primary Examiner* — Robert Bachner
*Assistant Examiner* — Moin Rahman
(74) *Attorney, Agent, or Firm* — Volentine & Whitt, PLLC

(57) ABSTRACT

A method of forming semiconductor device includes forming a landing pad, forming a stopping insulating layer on the landing pad, forming a lower molding layer including a first material on the stopping insulating layer, forming an upper molding layer including a second material different from the first material on the lower molding layer, forming a hole vertically passing through the upper molding layer and the lower molding layer and exposing the landing pad, forming a first electrode in the hole, removing the upper molding layer to expose a part of a surface of the first electrode, removing the lower molding layer to expose another part of the surface of the first electrode, forming a capacitor dielectric layer on the exposed parts of the surface of the first electrode, and forming a second electrode on the dielectric layer.

20 Claims, 58 Drawing Sheets

METHOD OF FORMING SEMICONDUCTOR DEVICE

PRIORITY STATEMENT

This application claims priority under 35 U.S.C. §119 to Korean Patent Application No. 10-2012-0138254 filed on Nov. 30, 2012, the disclosure of which is hereby incorporated by reference in its entirety.

BACKGROUND

1. Field

The inventive concept relates to a method of forming a semiconductor device including a capacitor such as a DRAM.

2. Description of Related Art

As the integration of a semiconductor device increases, the area occupied by holes, plugs, contacts, and capacitors decreases, and the space between patterns becomes very narrow.

SUMMARY

In accordance with an aspect of the inventive concepts, there is provided a method of forming a semiconductor device which includes forming a landing pad, forming a stopping insulating layer on the landing pad, forming a lower molding layer including a first material on the stopping insulating layer, forming an upper molding layer including a second material of a different type from the first material on the lower molding layer, forming a hole passing vertically through the upper molding layer and the lower molding layer and exposing the landing pad, forming a first electrode in the hole, removing the upper molding layer to expose a part of a surface of the first electrode, removing the lower molding layer to expose another part of the surface of the first electrode, forming a dielectric layer on the exposed parts of the surface of the first electrode, and forming a second electrode on the dielectric layer.

In accordance with another aspect of the inventive concepts, there is provided a method of forming a semiconductor device that includes forming a buried type gate structure in a substrate, forming a bit line structure and a landing pad on the substrate, forming a stopping insulating layer on the bit line structure and the landing pad, forming a lower molding layer on the stopping insulating layer, forming an upper molding layer on the lower molding layer, forming a first supporter on the upper molding layer, forming holes each passing vertically through the first supporter, the upper molding layer, the lower molding layer, and the stopping insulating layer, and exposing the landing pad, respectively, forming storage electrodes in the holes, removing a part of the first supporter located between the storage electrodes to expose the upper molding layer between the storage electrodes, removing the upper molding layer to expose parts of surfaces of the storage electrodes, removing the lower molding layer to expose other parts of the surfaces of the storage electrodes, forming a capacitor dielectric layer on the exposed parts of the surfaces of the storage electrodes, a surface of the stopping insulating layer and a surface of the first supporter, and forming a plate electrode on the capacitor dielectric layer.

In accordance with still another aspect of the inventive concepts, there is provided a method of forming a semiconductor device that includes forming a pad of electrically conductive material, forming an etch stop layer of insulating material on the pad, forming a lower molding layer on the etch stop layer, forming an upper molding layer on the lower molding layer, selectively etching the upper molding layer, the lower molding layer and the etch stop layer to form a hole that exposes the pad, forming a first electrode in the hole after the hole has been extended to expose the pad, removing the upper molding layer after the first electrode is formed to form a space that exposes a part of a side surface of the first electrode, subsequently removing the lower molding layer to expand the space such that the expanded space also exposes another part of the side surface of the first electrode, forming a dielectric layer on the exposed parts of the side surface of the first electrode, and forming a second electrode on the dielectric layer. subsequently removing the lower molding layer. The upper molding layer is formed of material that has an etch selectivity with respect to the lower molding layer. Accordingly, the upper molding layer is removed using a first etchant that does not etch the lower molding layer, and the lower molding layer is removed with a different type of etchant.

BRIEF DESCRIPTION OF THE DRAWINGS

The foregoing and other features and advantages of the inventive concepts will be apparent from the more particular description of preferred embodiments of the inventive concepts, as illustrated in the accompanying drawings. The drawings are not necessarily to scale, emphasis instead being placed upon illustrating the principles of the inventive concepts.

In the drawings:

FIGS. 1A, 1B, 1C, 1D, 1E, 1F, 1G, 1H, 1I, 1J, 1K, 1L, 1M, 1N, 1O, 1P, 1Q, 1R, 1S, 1T, 1U and 1V are each a cross-sectional view of a semiconductor device during the course of its manufacture and together illustrate a first embodiment of a method of manufacturing a semiconductor device according to the inventive concepts;

FIGS. 2A, 2B, 2C, 2D, 2E, 2F, 2G, 2H, 2I, 2J, 2K, 2L, 2M, 2N, 2O, 2P, 2Q, 2R, 2S and 2T are each a cross-sectional view of a semiconductor device during the course of its manufacture and together illustrate another embodiment of a method of manufacturing a semiconductor device according to the inventive concepts;

DETAILED DESCRIPTION OF THE PREFERRED EMBODIMENTS

Figure 1A:
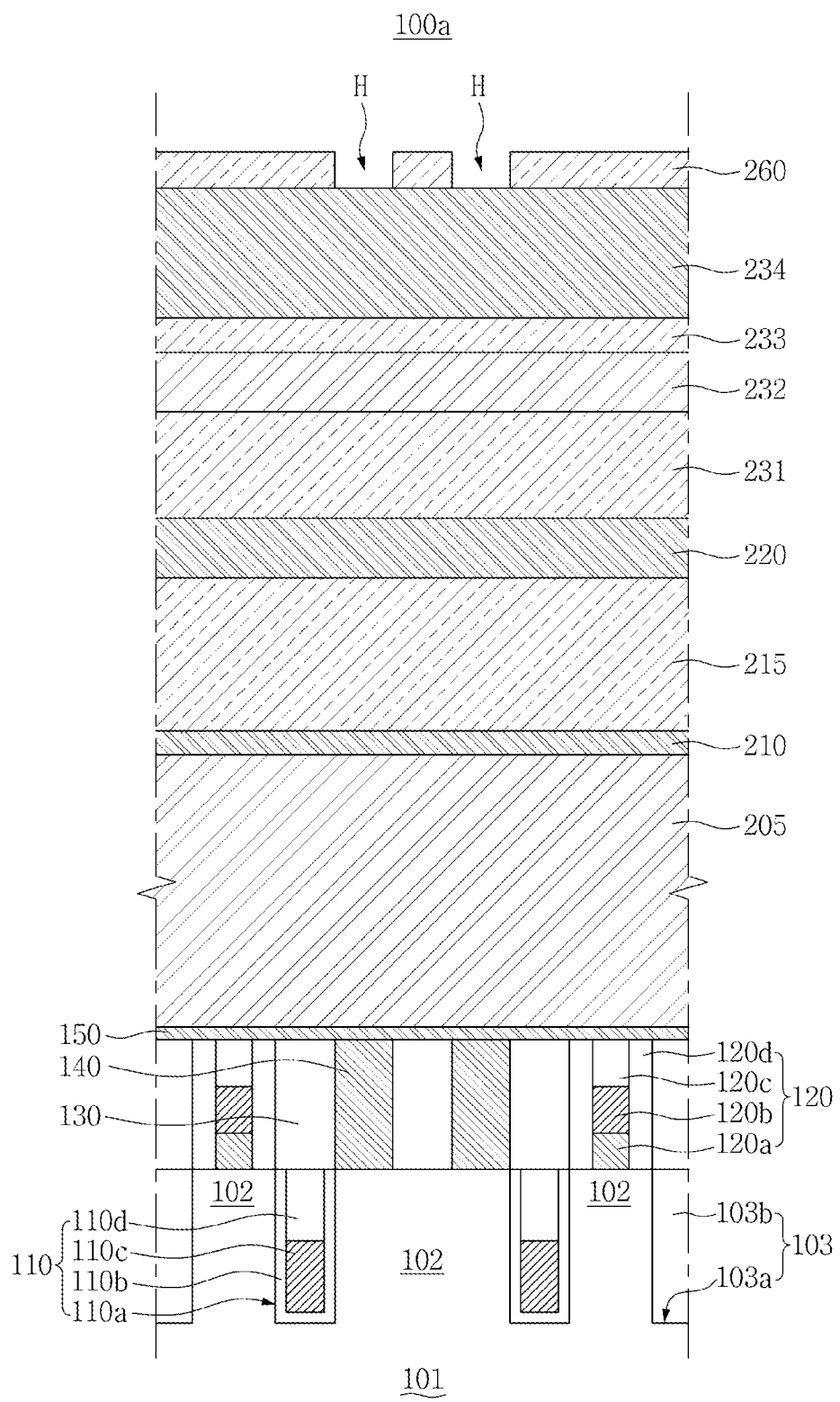

Various embodiments and examples of embodiments of the inventive concept will be described more fully hereinafter with reference to the accompanying drawings. In the drawings, the sizes and relative sizes and shapes of elements, layers and regions, such as implanted regions, shown in section may be exaggerated for clarity. In particular, the cross-sectional illustrations of the semiconductor devices and intermediate structures fabricated during the course of their manufacture are schematic. Also, like numerals are used to designate like elements throughout the drawings.

It will be understood that although the terms first, second, third etc. are used herein to describe various elements, regions, layers, etc., these elements, regions, and/or layers are not limited by these terms. These terms are only used to distinguish one element, layer or region from another. Furthermore, as used herein, the term "and/or" includes any and all practical combinations of one or more of the associated listed items.

Furthermore, spatially relative terms, such as "above," and "beneath" are used to describe an element's and/or feature's relationship to another element(s) and/or feature(s) as illustrated in the figures. Thus, the spatially relative terms may apply to orientations in use which differ from the orientation depicted in the figures. Obviously, though, all such spatially relative terms refer to the orientation shown in the drawings for ease of description and are not necessarily limiting as embodiments according to the inventive concept can assume orientations different than those illustrated in the drawings when in use. In addition, the terms "upper" or "bottom" as used to describe a surface generally refer not only to the orientation depicted in the drawings but to the fact that the surface is the uppermost or bottommost surface in the orientation depicted, as would be clear from the drawings and context of the written description.

It will also be understood that when an element or layer is referred to as being "on" another element or layer, the element or layer can be directly the other element or layer or intervening elements or layers may be present.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes, as distinguished from the terms "consists" or "consisting". Furthermore, the term "includes" ("including") is used to mean either comprises (comprising) or consists (consisting). Thus, for example, when a layer is referred to as including certain material and only one material is specified, that layer may be understood as consisting of the specified material. Also, when a material is described as being of a different "type" than another material, this generally refers to the materials being composed of different combinations of elements.

A method of forming a semiconductor device in accordance with the inventive concepts will now be described in detail with reference to FIGS. 1A to 1V.

Referring first to FIG. 1A, the method of forming the semiconductor device 100a in accordance with the inventive concepts may include forming a field region 103 defining an active region 102 in a substrate 101, forming a buried type gate structure 110 in the substrate 101, forming a bit line structure 120 on the active region 102 of the substrate 101, and forming a landing pad 140. The method may further include forming a stopping insulating layer 150 on the bit line structure 120 and the landing pad 140, forming a lower molding layer 205 on the stopping insulating layer 150, forming a lower supporter 210 on the lower molding layer 205, forming an upper molding layer 215 on the lower supporter 210, forming an upper supporter 220 on the upper molding layer 215, forming a first buffer layer 231 on the upper supporter 220, forming a second buffer layer 232 on the first buffer layer 231, forming a third buffer layer 233 on the second buffer layer 232, forming a fourth buffer layer 234 on the third buffer layer 233, and forming a first mask pattern 260 on the fourth buffer layer 234.

The substrate 101 may include a single crystalline silicon wafer, a silicon-on-insulator (SOI) wafer, a silicon-germanium wafer or the like.

The forming the field region 103 in the substrate 101 may include forming a field trench 103a in the substrate 101 and filling the field trench 103a with a field insulating material 103b. The field insulating material 103b may include silicon oxide.

The forming of the gate structure 110 may include forming a gate trench 110a in the active region 102 of the substrate 101, forming a gate insulating layer 110b on an inner wall defining the gate trench 110a, forming a gate electrode 110c on the gate insulating layer 110b in the gate trench 110a, and forming a gate capping layer 110d to fill the gate trench 110a. The gate insulating layer 110b may include oxidized silicon or a metal oxide such as hafnium oxide or aluminum oxide. The gate electrode 110c may include a metal or a metal compound. For example, the gate electrode 110c may include TiN, W, or multiple metal layers and/or metal compound. The gate capping layer 110d may include silicon nitride or silicon oxide.

The forming of the bit line structure 120 may include forming a bit line contact plug 120a connected to the active region 102 of the substrate 101, forming a bit line electrode 120b on the bit line contact plug 120a, forming a bit line capping layer 120c on the bit line electrode 120b, and forming a bit line spacer 120d on side surfaces of the bit line capping layer 120c and the bit line electrode 120b. The bit line spacer 120d may surround side surfaces of the bit line contact plug 120a. The forming the bit line contact plug 120a may include forming a conductive material in direct contact with the active region 102. For example, the forming the bit line contact plug 120a may include forming single crystalline silicon from the active region 102 using an epitaxial growth process. Alternatively, the forming the bit line contact plug 120a may include forming a silicide layer or a metal layer on the active region 102. The forming of the bit line electrode 120b may include forming a conductive material such as a metal on the bit line contact plug 120a. A bit line barrier layer may also be formed on the bit line contact plug 120a before the bit line electrode 120b is formed. Accordingly, the bit line barrier layer may be interposed between the bit line contact plug 120a and the bit line electrode 120b. The forming the bit line barrier layer may include forming Ti, TiN, Ta, TaN, TiW, WSi, or another barrier metal using a deposition process. The forming of the bit line electrode 120b may include forming a metal such as W. The forming of the bit line capping layer 120c may include forming silicon nitride using a deposition process. The forming of the bit line spacer 120d may include forming silicon nitride using a deposition process, and performing an etch-back process.

The forming of the landing pad 140 may include forming single crystalline silicon from the active region 102 using an epitaxial growth process. Alternatively, the forming of the landing pad 140 may include forming a silicide layer or a metal layer on the active region 102. Also, the forming of the landing pad 140 may include forming an interlayer insulating layer 130 on the substrate 101. The forming the interlayer insulating layer 130 may include depositing silicon oxide. The interlayer insulating layer 130 surrounds the bit line structure 120 and contacts the bit line spacer 120d, and the conductive material that constitutes the landing pad 140 passes through the interlayer insulating layer 130 and contacts the active region 102.

The forming of the stopping insulating layer 150 may include forming a silicon nitride layer on the bit line structure 120, the interlayer insulating layer 130, and the landing pad 140 using a deposition process. The stopping insulating layer 150 may include a material having etch selectivity with respect to the interlayer insulating layer 130.

The forming of the lower molding layer 205 may include forming a silicon oxide layer on the stopping insulating layer 150 using a deposition process or a coating process. The lower molding layer 205 is of a material having etch selectivity with respect to the stopping insulating layer 150.

The forming of the lower supporter 210 may include forming a silicon nitride layer on the lower molding layer 205 using a deposition process. The lower supporter 210 includes an insulating material having etch selectivity with respect to the lower molding layer 205. In addition, the lower supporter 210 may include an insulating material that is harder than the lower molding layer 205.

The forming of the upper molding layer 215 may include forming a polysilicon layer or an amorphous silicon layer using a deposition process. The upper molding layer 215 includes an insulating material having etch selectivity with respect to the lower molding layer 205 and the lower supporter 210.

The forming of the upper supporter 220 may include forming a silicon nitride layer on the upper molding layer 215 using a deposition process. The upper supporter 220 includes an insulating material having etch selectivity with respect to the upper molding layer 215. In this respect, the upper supporter 220 may be of the same material as the lower supporter 210.

The forming of the first buffer layer 231 may include forming a polysilicon layer or an amorphous silicon layer on the upper supporter 220 using a deposition process. The first buffer layer 231 includes a material having etch selectivity with respect to the upper supporter 220.

The forming of the second buffer layer 232 may include forming a silicon oxide layer on the first buffer layer 231 using a deposition process. The second buffer layer 232 includes a material having etch selectivity with respect to the first buffer layer 231.

The forming of the third buffer layer 233 may include forming a polysilicon layer or an amorphous silicon layer on the second buffer layer 232 using a deposition process. The third buffer layer 233 includes a material having etch selectivity with respect to the second buffer layer 232.

The forming of the fourth buffer layer 234 may include forming a silicon nitride layer on the third buffer layer 233 using a deposition process. The fourth buffer layer 234 includes a material having etch selectivity with respect to the third buffer layer 233.

In these respects, the lower molding layer 205 and the second buffer layer 232 may be of the same material, the lower supporter 210, the upper supporter 220, and the fourth buffer layer 234 may be of the same material, and the upper molding layer 215, the first buffer layer 231, and the third buffer layer 233 may be of the same material.

The forming of the first mask pattern 260 includes forming a material having etch selectivity with respect to silicon nitride on the fourth buffer layer 234 using a deposition process, and forming holes H selectively exposing the fourth buffer layer 234 by performing a photolithography process. For example, the first mask pattern 260 may be formed by forming a layer of photoresist, a polysilicon layer, an amorphous silicon layer, a silicon oxide layer, an SOH layer, a silicon oxynitride layer, or a high molecular weight organic material layer on the fourth buffer layer 234, and then patterning the layer to form the holes H therethrough.

Figure 1B:
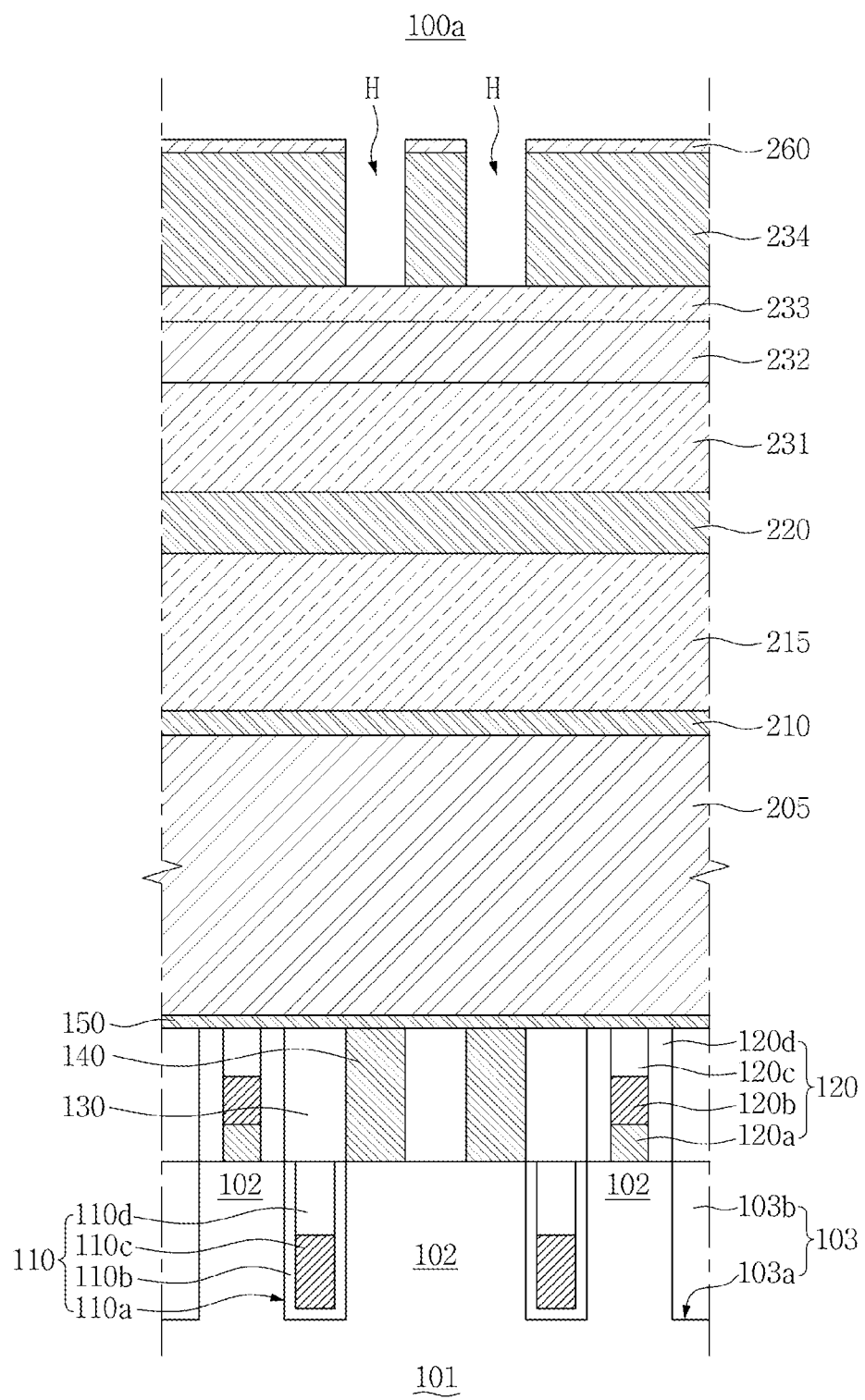

Referring to FIG. 1B, the fourth buffer layer 234 is selectively etched using the first mask pattern 260 as an etch mask to extend the holes H deeper into the structure. An upper surface of the third buffer layer 233 becomes exposed in the holes H. In the illustrated example of this etch process, the first mask pattern 260 is etched as well to become thinner.

Figure 1C:
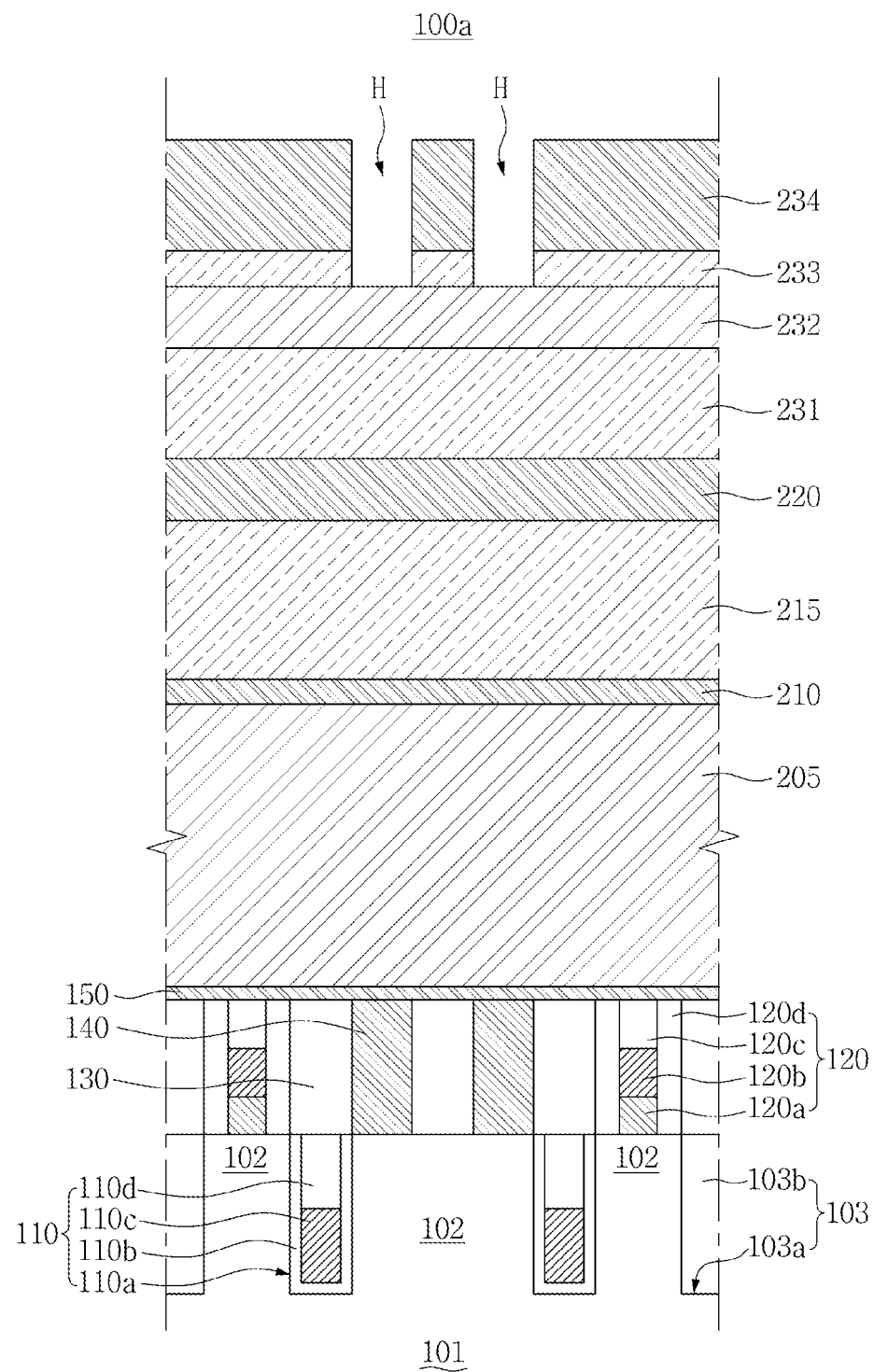

Referring to FIG. 1C, the third buffer layer 233 is selectively etched using the first mask pattern 260 and the fourth buffer layer 234 as an etch mask to again extend the holes H. When the first mask pattern 260 and the third buffer layer 234 are of the same material, the first mask pattern 260 alone would not function effectively as the etch mask. An upper surface of the second buffer layer 232 becomes exposed by the holes H. In the illustrated example of this etch process, the first mask pattern 260 is completely removed, and the fourth buffer layer 234 is etched so as to become thinner.

Figure 1D:
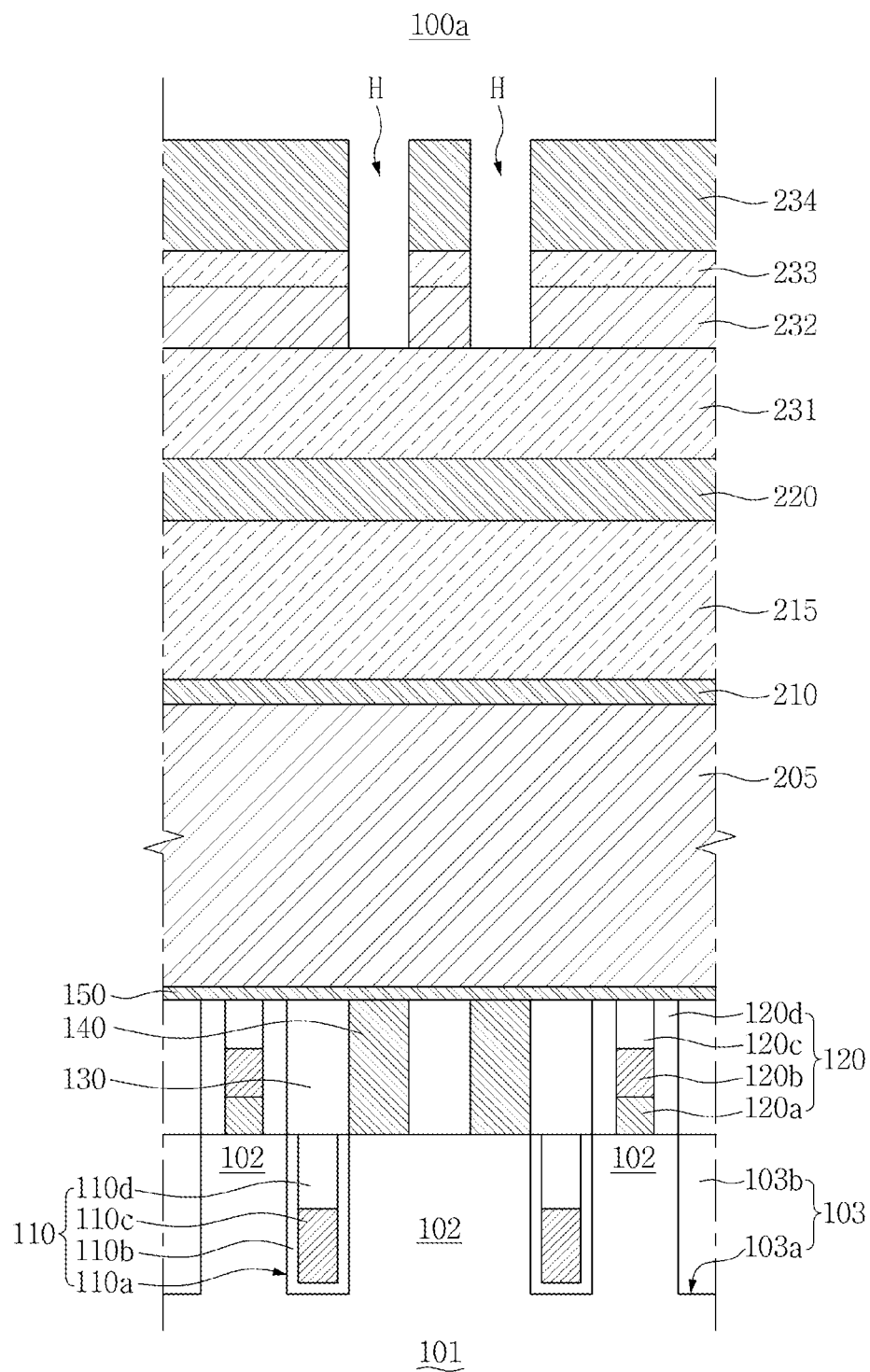

Referring to FIG. 1D, the second buffer layer 232 is selectively etched using the fourth buffer layer 234 as an etch mask to once again extend the holes H. The first buffer layer 231 becomes exposed in the holes H. In the illustrated example of this process, the fourth buffer layer 234 is etched so as to become thinner.

Figure 1E:
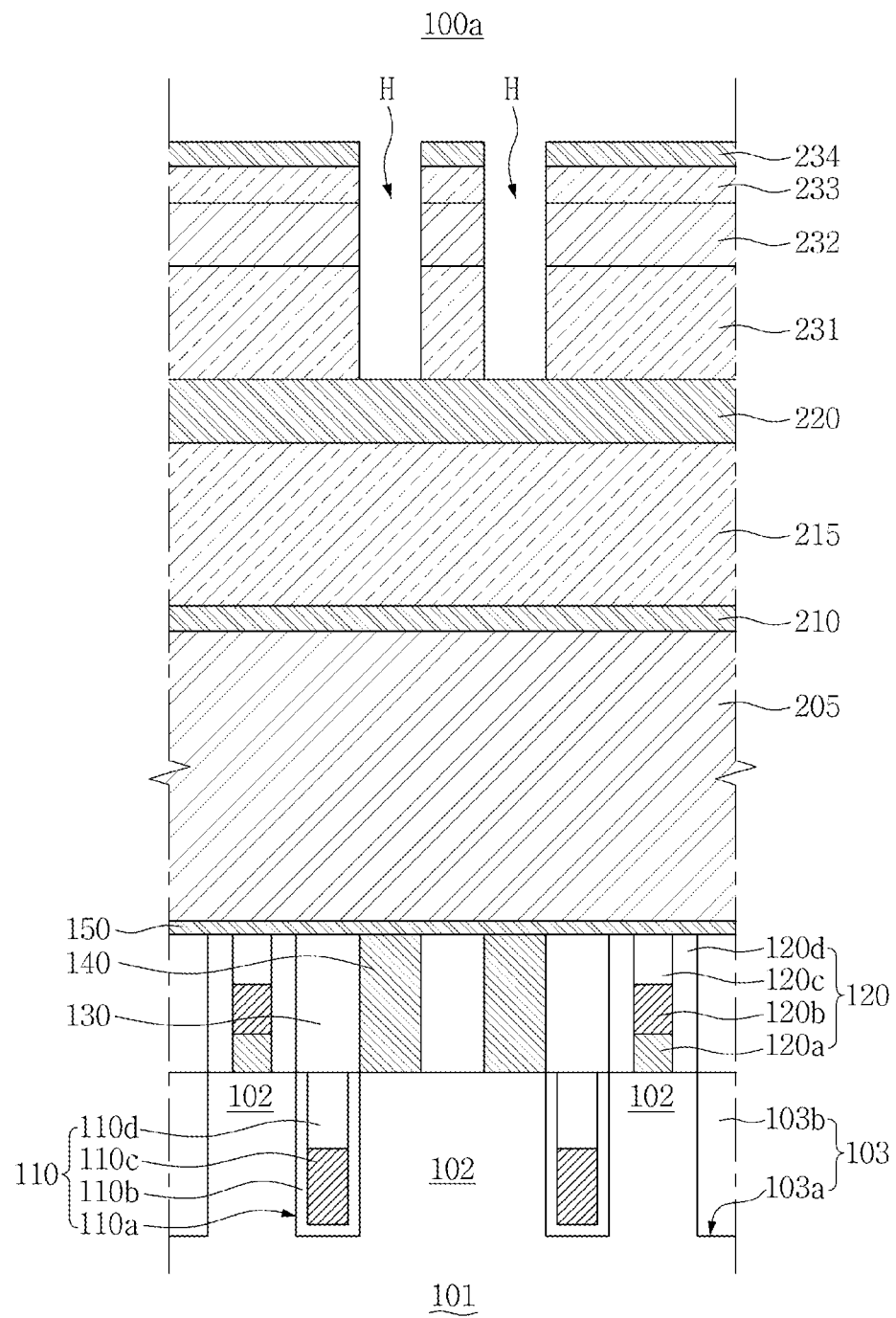

Referring to FIG. 1E, the first buffer layer 231 is selectively etched using the fourth buffer layer 234 as an etch mask to extend the holes H. The upper supporter 220 becomes exposed by the holes H. In this process, the fourth buffer layer 234 may be etched to become even thinner. The first buffer layer 231 and the second buffer layer 232 may be selectively etched in common using the fourth buffer layer 234 as the etch mask.

Figure 1F:
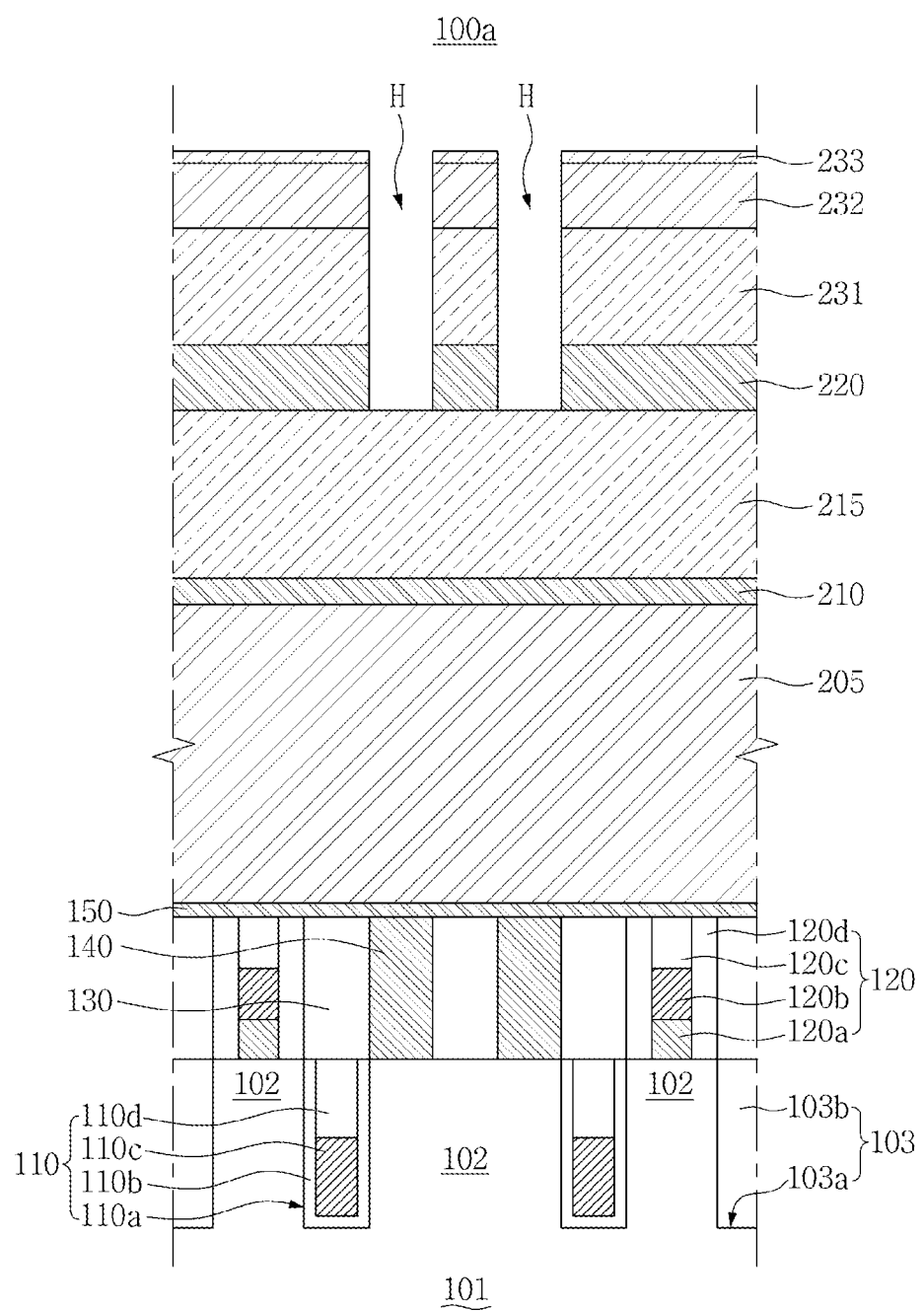

Referring to FIG. 1F, the upper supporter 220 is selectively etched using the fourth buffer layer 234 and the third buffer layer 233 as an etch mask to extend the holes H. When the fourth buffer layer 234 and the upper supporter 220 are of the same material, the fourth buffer layer 234 alone would not function effectively as the etch mask. The upper molding layer 215 becomes exposed by the holes H. In the illustrated example of this process, the fourth buffer layer 234 is completely removed, and the third buffer layer 233 becomes thinner.

Figure 1G:
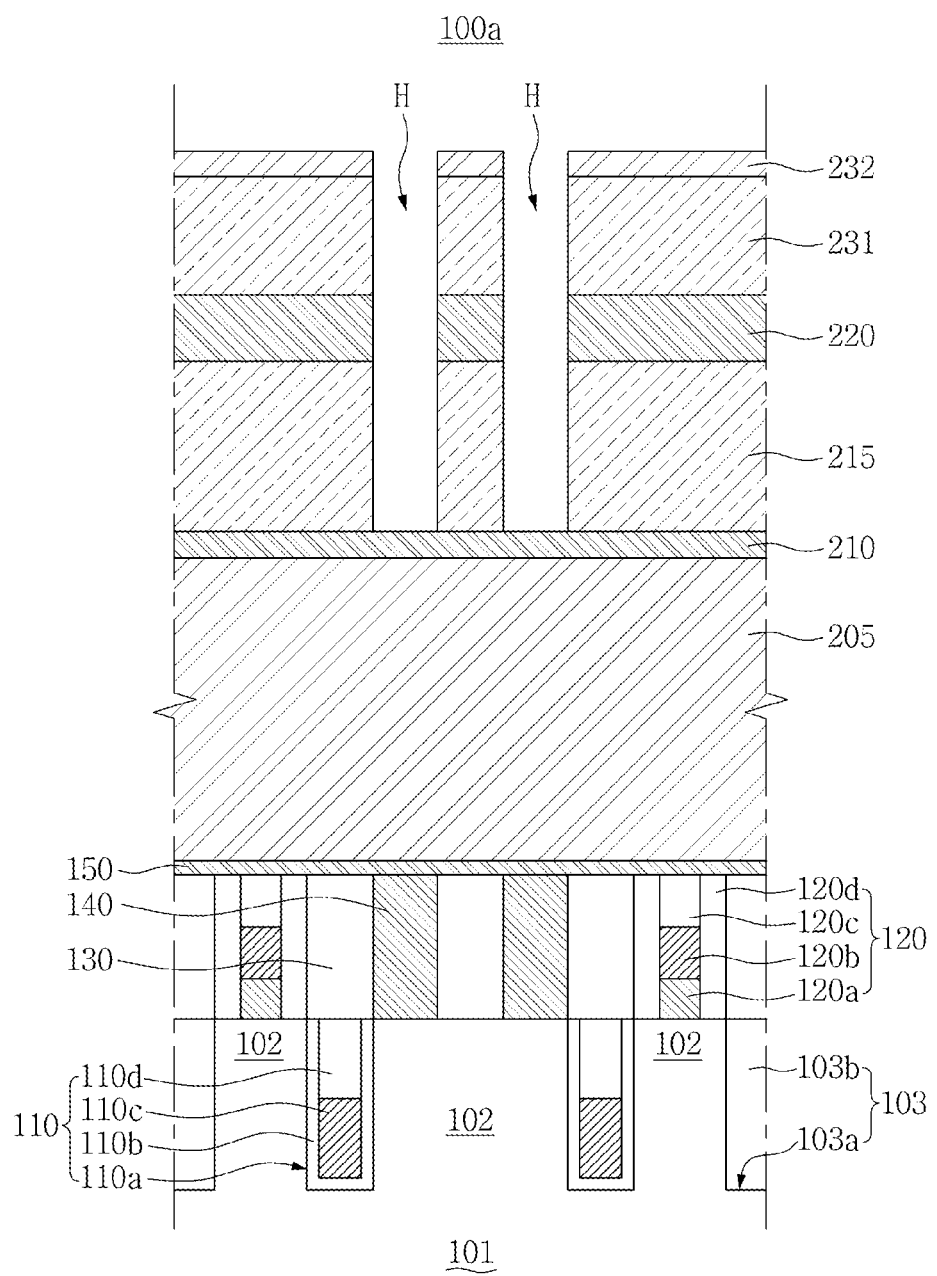

Referring to FIG. 1G, the upper molding layer 215 is selectively etched using the third buffer layer 233 and the second buffer layer 232 as an etch mask. When the third buffer layer 233 and the upper molding layer 215 are of the same material, the third buffer layer 233 alone would not function effectively as the etch mask. The lower supporter 210 becomes exposed by the holes H. In this process, the third buffer layer 233 is completely removed, and the second buffer layer 232 may become thinner.

Figure 1H:
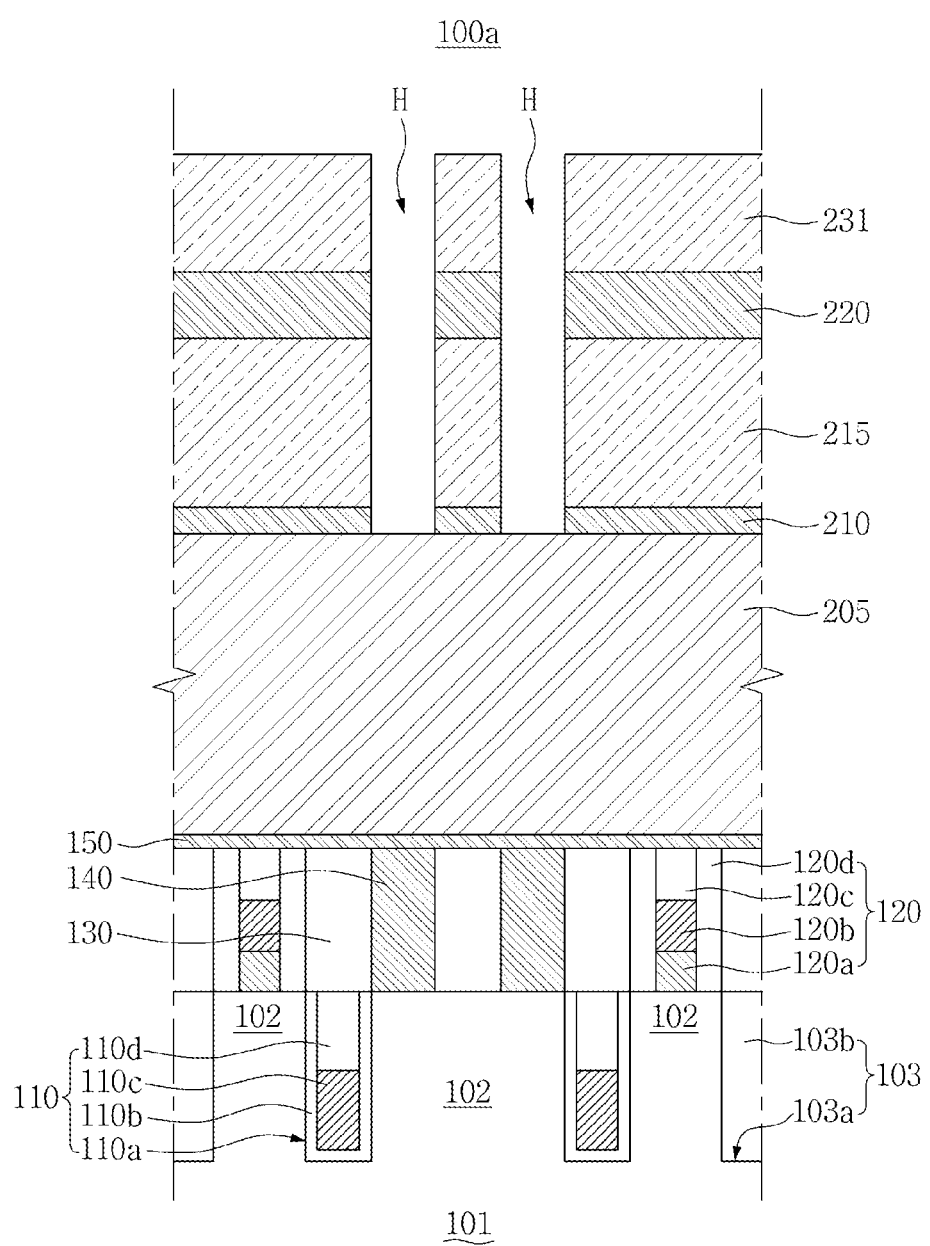

Referring to FIG. 1H, the lower supporter 210 are selectively etched using the second buffer layer 232 and the first buffer layer 231 as an etch mask to extend the holes H again. The lower molding layer 205 becomes exposed by the holes H. In the illustrated example of this process, the second buffer layer 232 is completely removed.

Figure 1I:
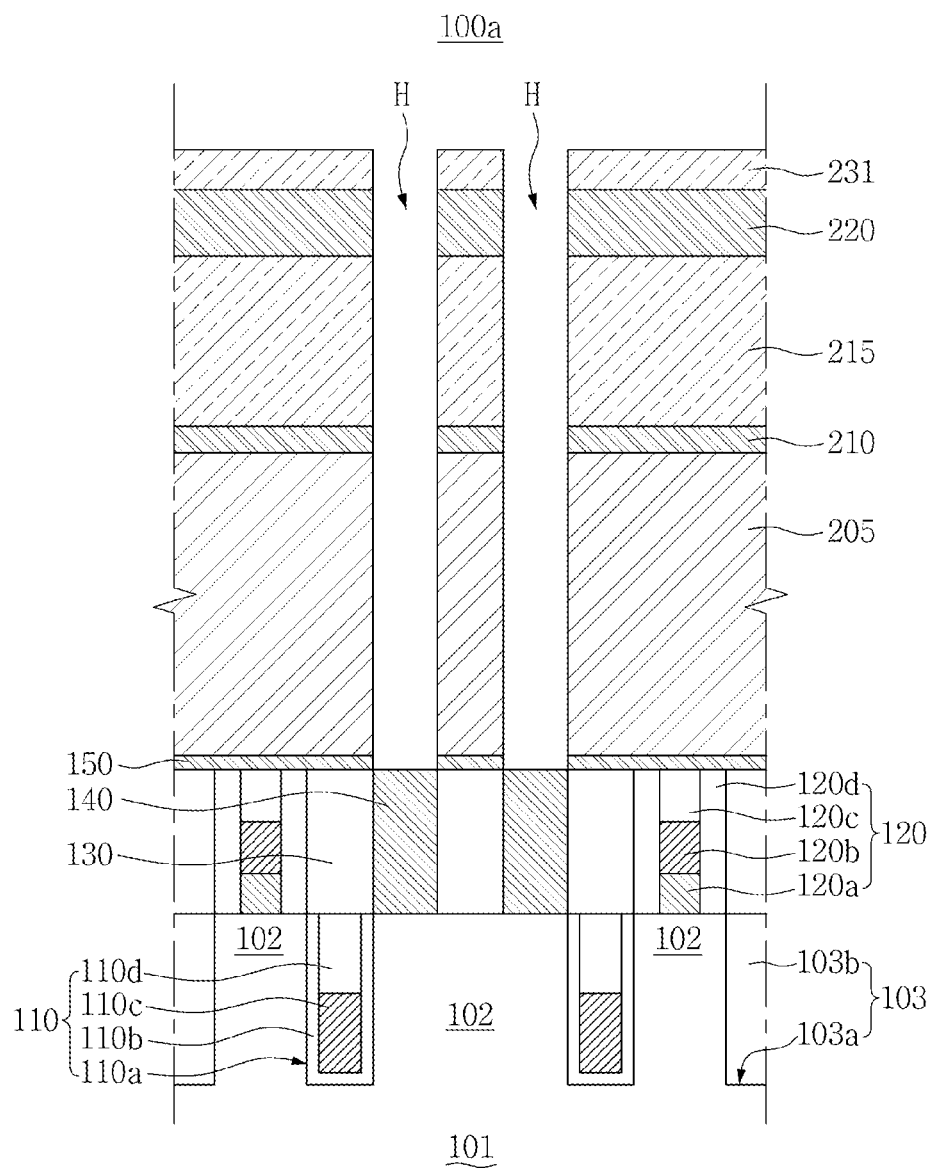

Referring to FIG. 1I, the lower molding layer 205 and the stopping insulating layer 150 are selectively etched using the first buffer layer 231 as an etch mask. At this time, the holes H pass vertically through the first buffer layer 231, the upper supporter 220, the upper molding layer 215, the lower supporter 210, the lower molding layer 205, and the stopping insulating layer 150 to expose an upper surface of the landing pad 140. In the illustrated example of this process, the first buffer layer 231 is etched to become thinner.

Figure 1J:
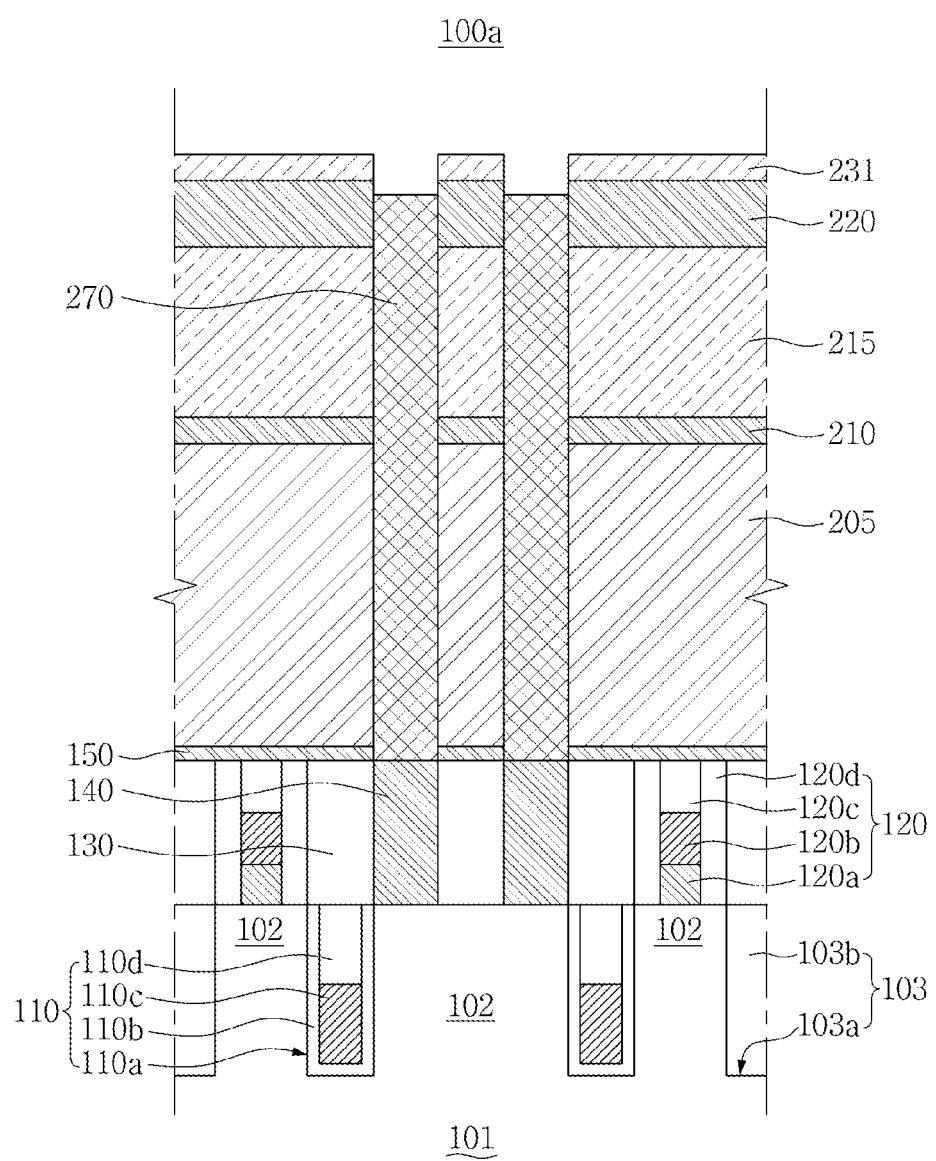

Referring to FIG. 1J, the holes H are filled with a sacrificial layer 270. The sacrificial layer 270 may be recessed using an etchback process such that its upper surface is situated below level of that of the upper supporter 220. The sacrificial layer 270 may include a material having etch selectivity with respect to silicon, silicon oxide, and silicon nitride. For example, the sacrificial layer 270 may include an insulating layer such as a spin-on-hard mask (SOH) including carbon (C) or the like.

Figure 1K:
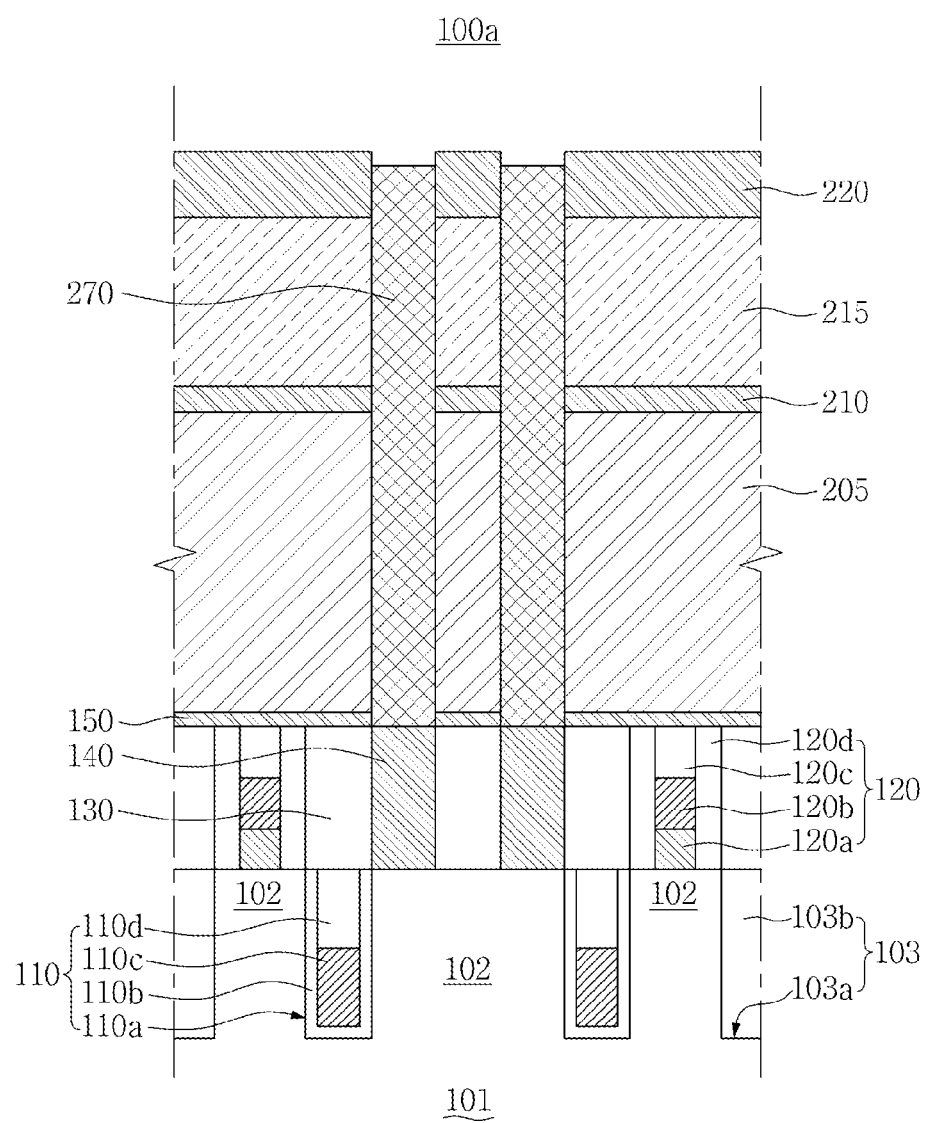

Referring to FIG. 1K, the first buffer layer 231 is removed. The removal of the first buffer layer 231 may include performing a wet etch process using an etchant solution including hydrogen peroxide, or a dry etch process using an etchant gas including Cl or F.

Figure 1L:
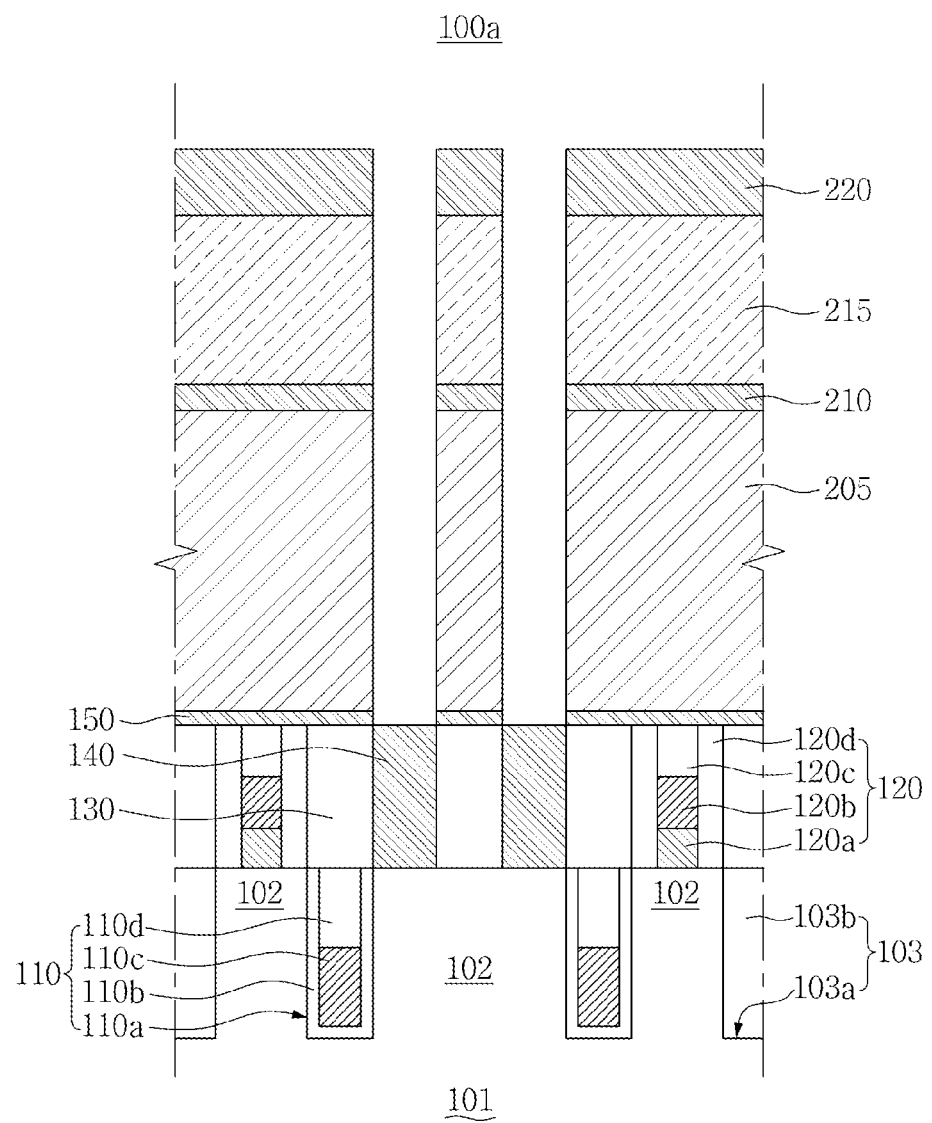

Referring to FIG. 1L, the sacrificial layer 270 is removed to empty the holes H. The removal of the sacrificial layer 270 may include performing an ashing process using $O_2$ gas.

Figure 1M:
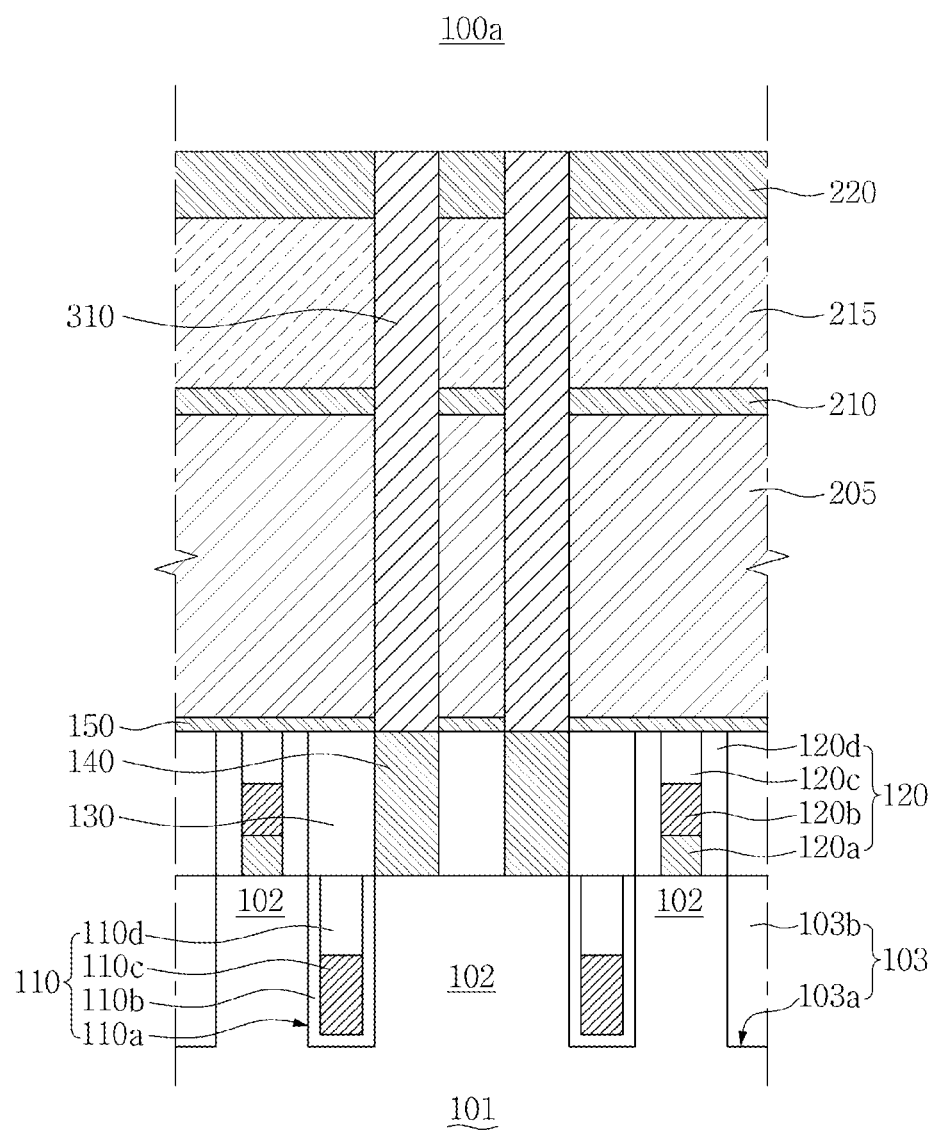

Referring to FIG. 1M, storage electrodes 310, which are bottom electrodes of capacitors, are formed in the empty holes H. The forming of the storage electrodes 310 may include filling the holes H with a blanket layer of silicon, a silicide, a metal, or a metal compound, and physically separating the blanket layer by performing a planarization process such as a CMP or an etchback into electrically isolated ones of the storage electrodes 310.

Figure 1N:
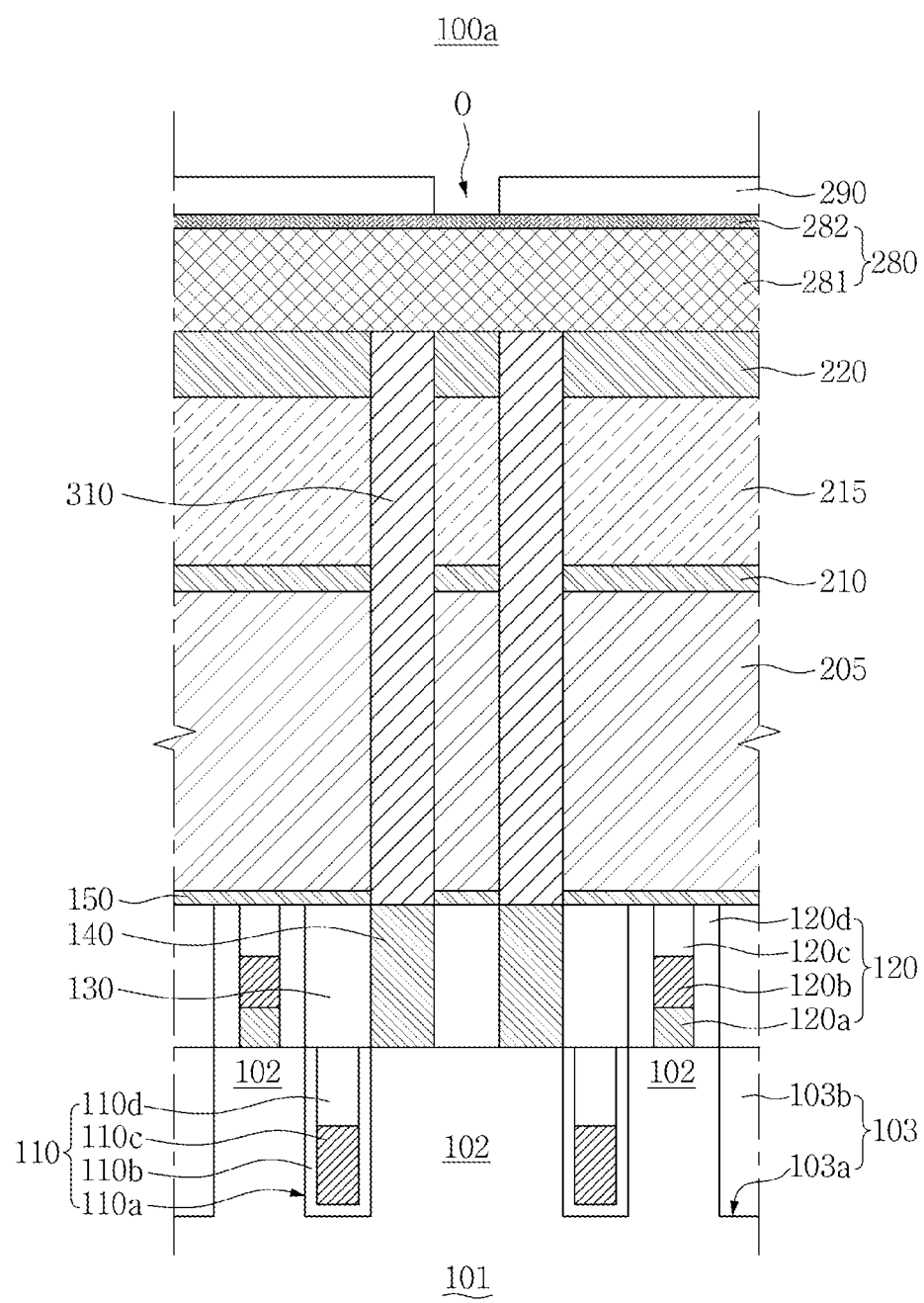
Figure 10:
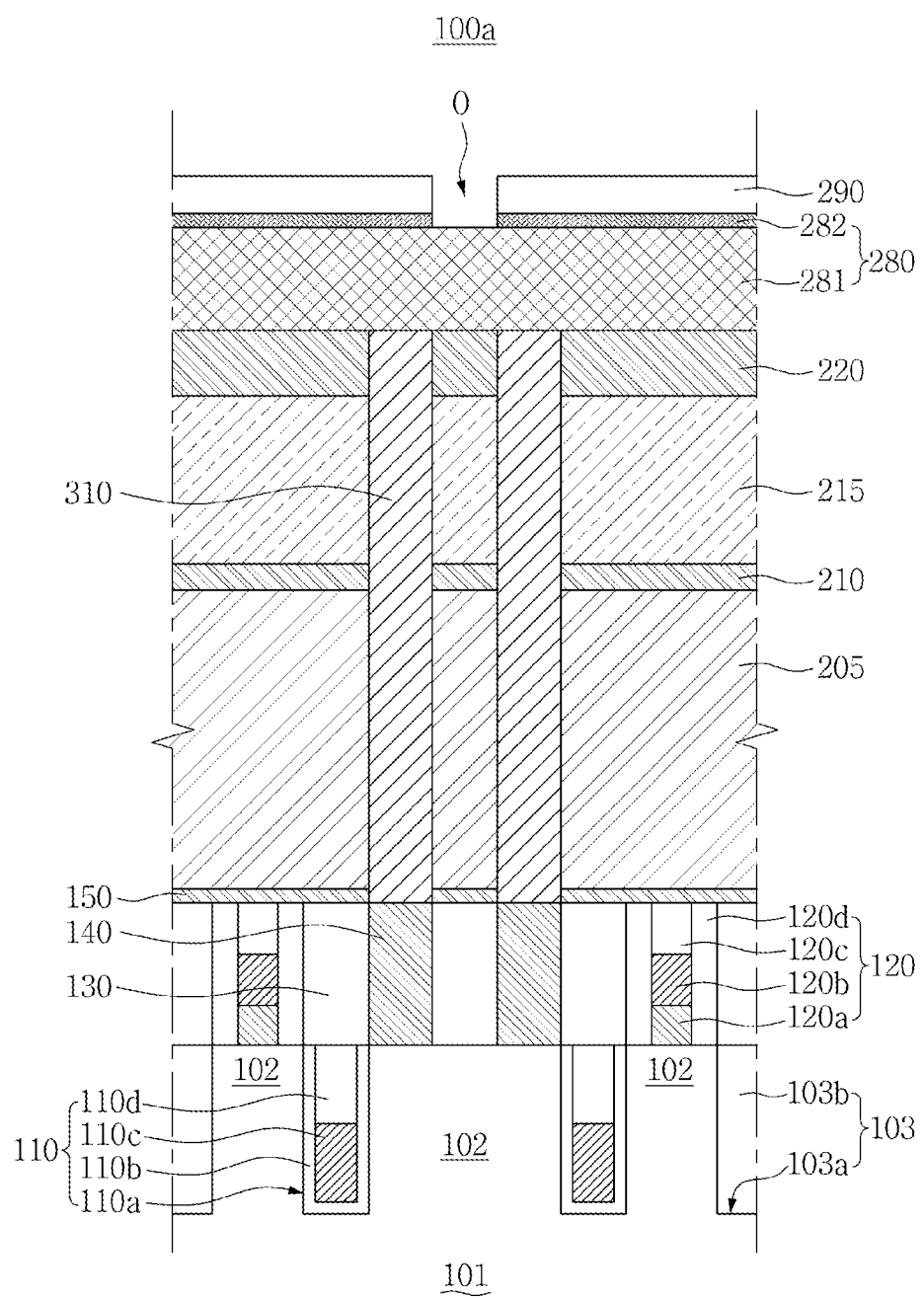

Referring to FIG. 1N, a hard mask 280 and a second mask pattern 290 are formed on the storage electrodes 310 and the upper supporter 220. The hard mask 280 may include a lower hard mask layer 281 and an upper hard mask layer 282. The lower hard mask layer 281 may be of a material having etch selectivity with respect to silicon, silicon oxide, and/or silicon nitride. For example, the lower hard mask layer 281 may be a SOH layer including C, or a layer of polymer. The upper hard mask layer 282 is of a material having etch selectivity with respect to the lower hard mask 281. For example, the upper hard mask 282 may be a PE-SiON layer, i.e., a silicon oxynitride layer formed by a plasma process. The second mask pattern 290 has openings O each aligned with a region between adjacent ones of the storage electrodes 310, and exposing an upper surface of the upper hard mask layer 282. The second mask pattern 290 includes a material having etch selectivity with respect to the upper hard mask layer 282. For example, the second mask pattern 290 may include a photoresist or silicon layer.

Referring to FIG. 1O, the upper hard mask layer 282 is selectively etched using the second mask pattern 290 as an etch mask to extend the openings O deeper into the structure. An upper surface of the lower hard mask layer 281 becomes exposed by the openings O.

Figure 1P:
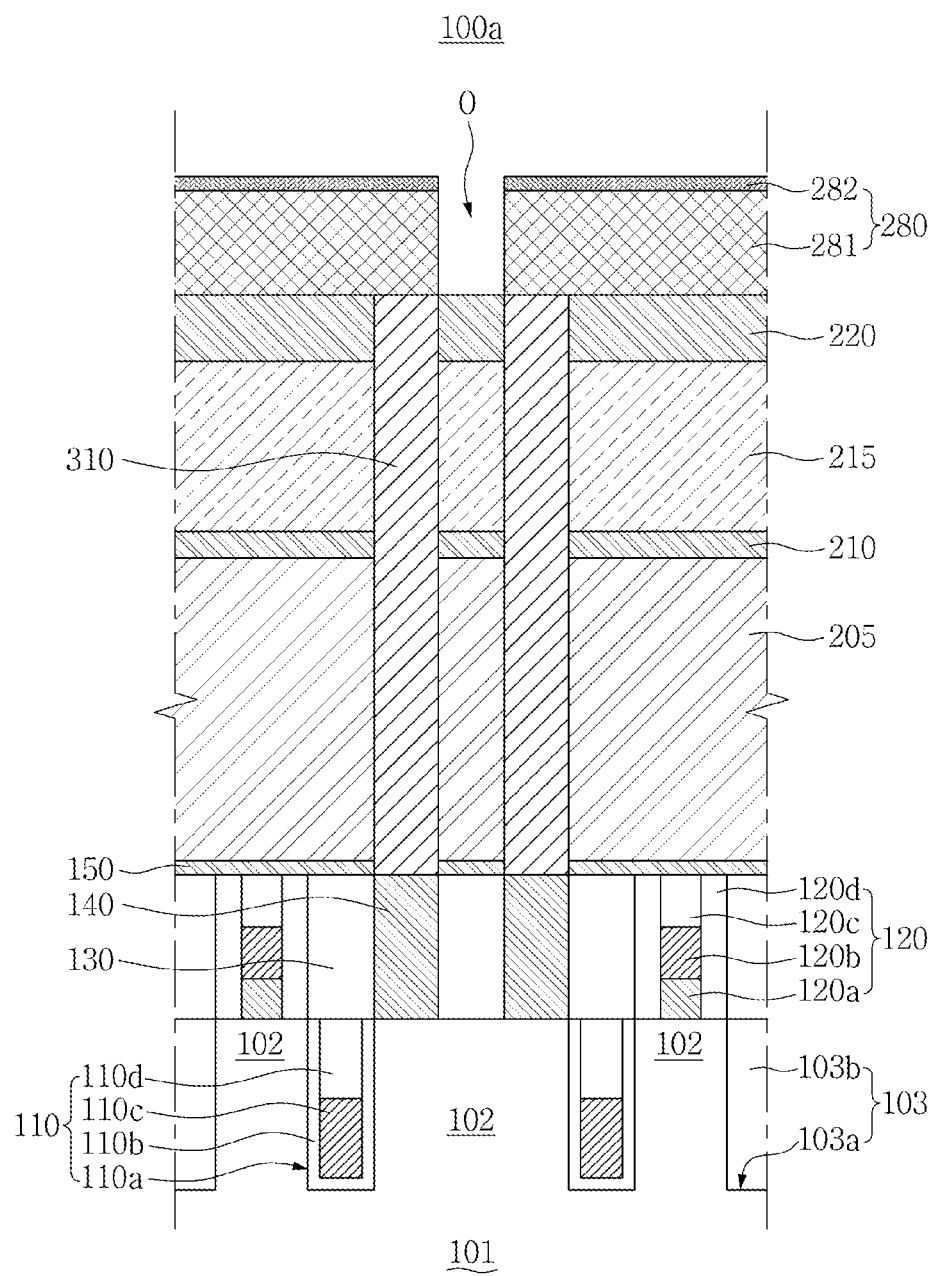

Referring to FIG. 1P, the lower hard mask layer 281 is selectively etched using the second mask pattern 290 and the upper hard mask layer 282 as an etch mask to again extend the openings O. An upper surface of the upper supporter 220 becomes exposed in the openings O. In the illustrated example of this process, the second mask pattern 290 may be removed.

Figure 1Q:
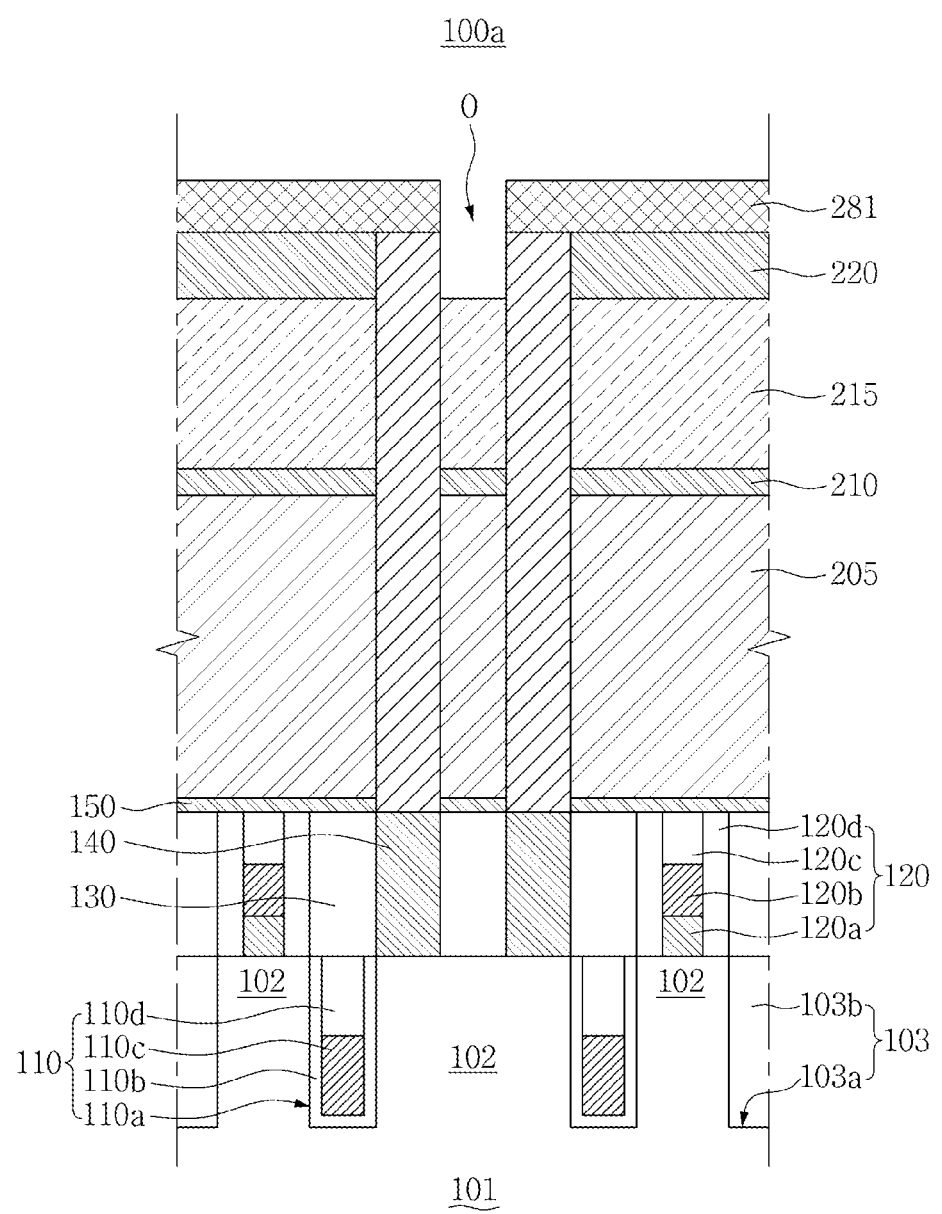

Referring to FIG. 1Q, the upper supporter 220 is selectively etched using the upper hard mask layer 282 and the lower hard mask layer 281 as an etch mask to extend the openings O. An upper surface of the upper molding layer 215 and parts of side surfaces of the storage electrodes 310 are exposed by the openings O. In the illustrated example of this process, the upper hard mask 282 is completely removed, and the lower hard mask layer 281 is etched to become thinner.

Figure 1R:
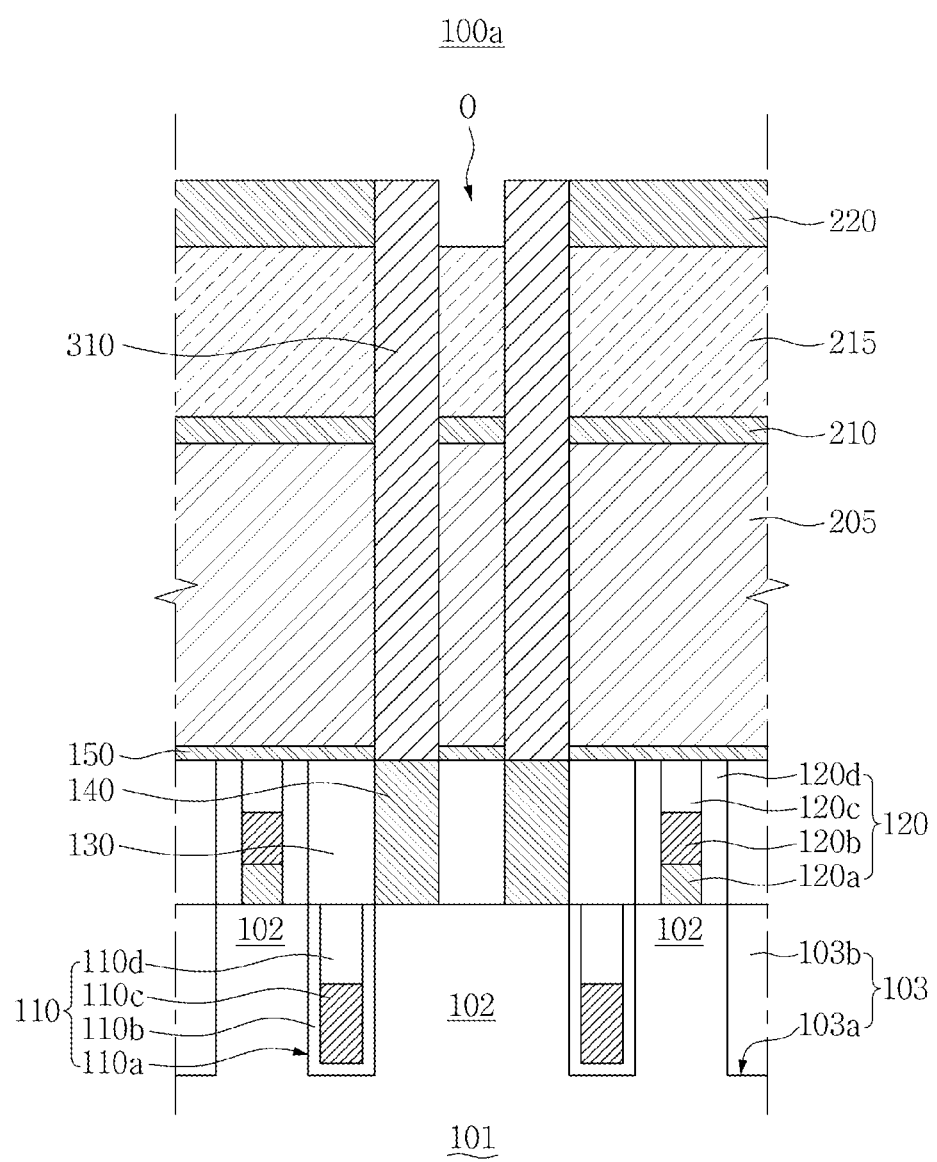

Referring to FIG. 1R, the lower hard mask layer 281 is removed. The removal of the lower hard mask layer 281 may include performing an ashing process using $O_2$ gas.

Figure 1S:
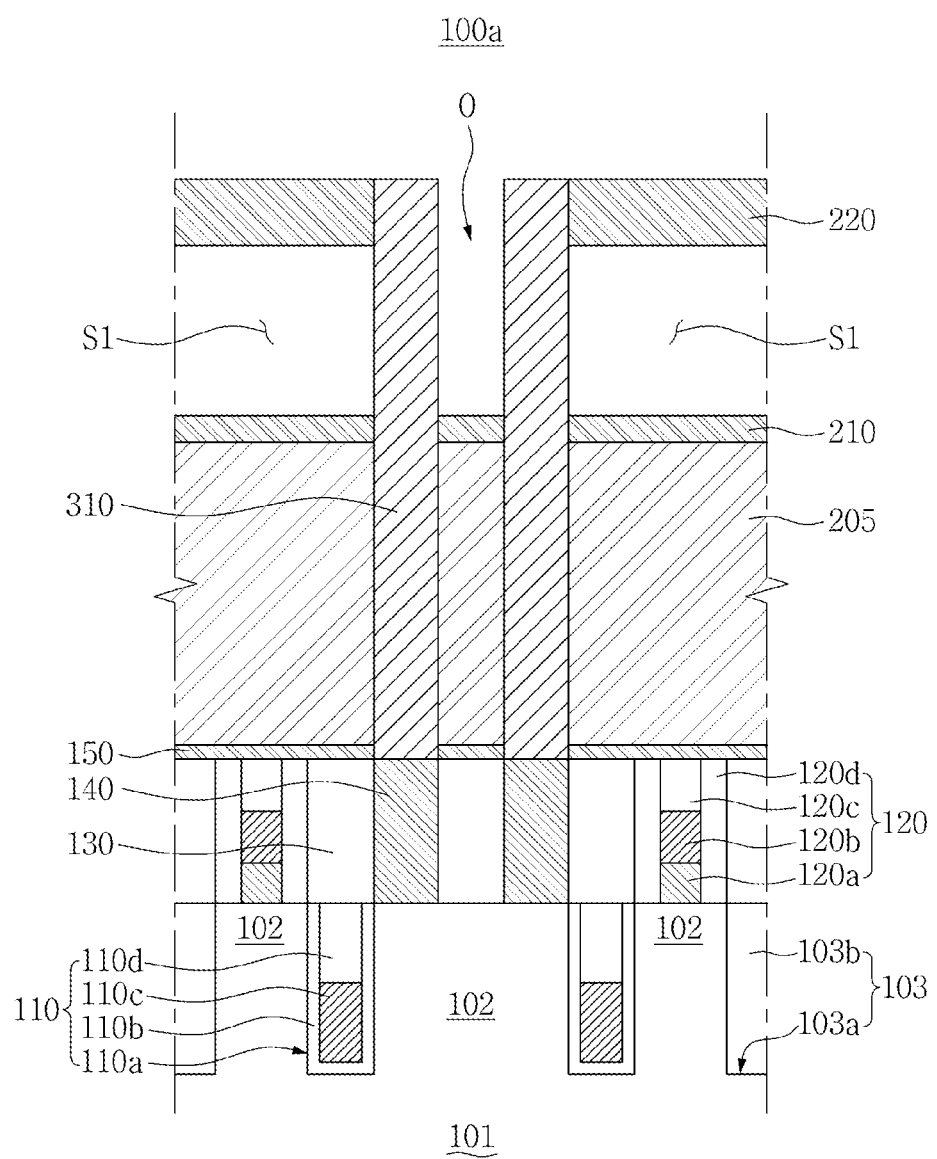

Referring to FIG. 1S, the upper molding layer 215 is removed to form an upper space S1 exposing the upper surface of the lower supporter 210 and the side surfaces of the storage electrodes 310. The upper molding layer 215 may be removed by wet etching the layer 215 through the openings O using an etchant solution including hydrogen peroxide.

Figure 1T:
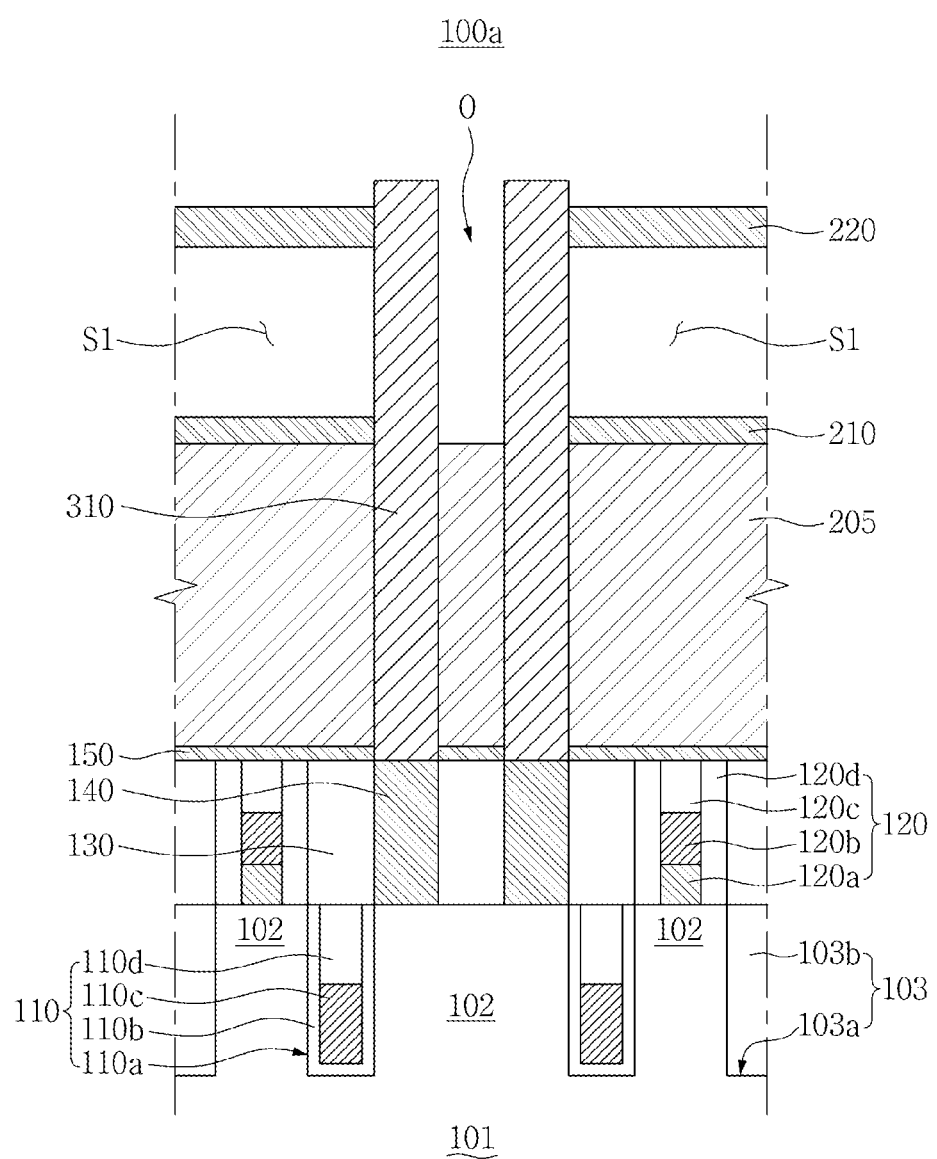

Referring to FIG. 1T, the lower supporter 210 is selectively etched through the openings O. Thus, additional parts of the side surfaces of the storage electrodes 310 are exposed. The process may include performing an anisotropic dry etch process to prevent or eliminate damage of the lower supporter 210 exposed in the upper space S1. In the illustrated example of this process, the upper supporter 220 is etched to become thinner.

Figure 1U:
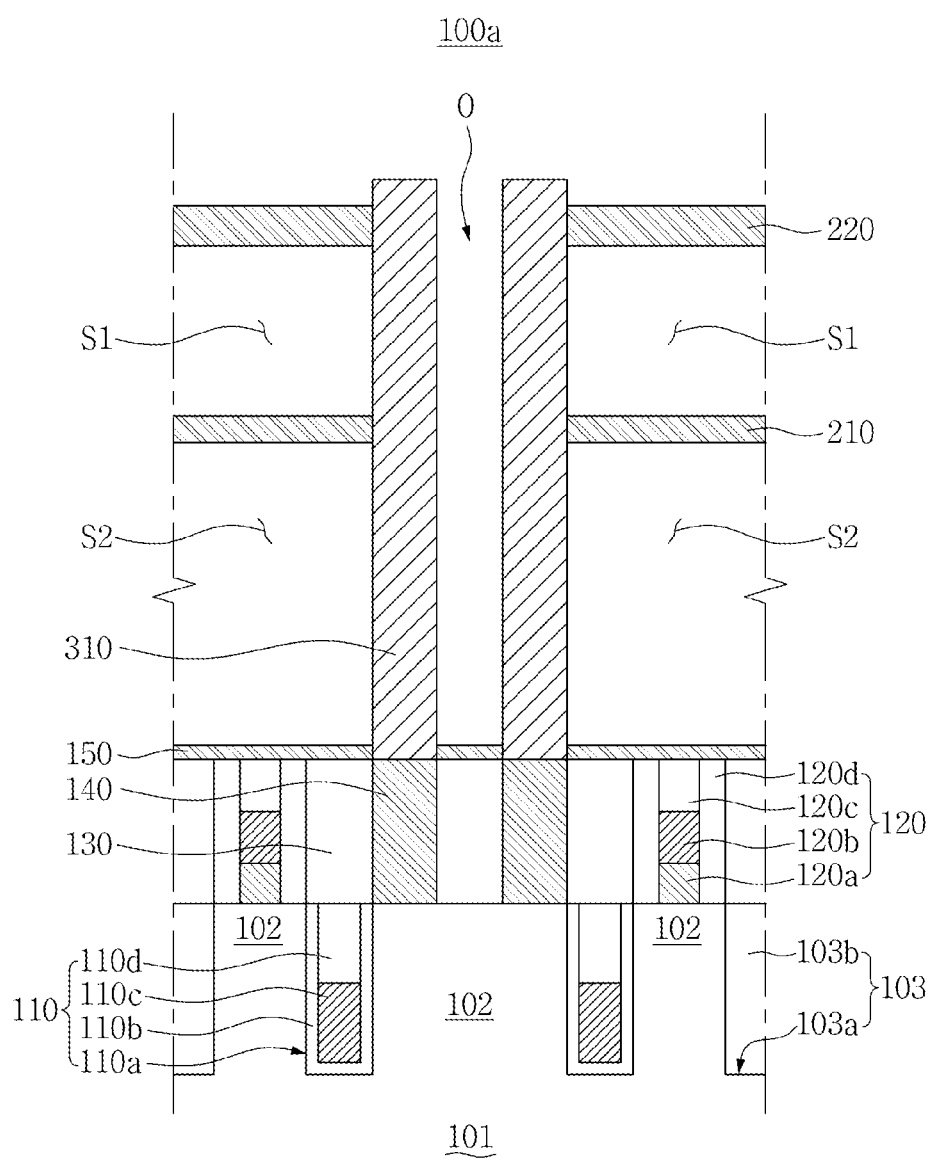

Referring to FIG. 1U, the lower molding layer 205 is removed to form a lower space S2 exposing the upper surface of the stopping insulating layer 150 and additional parts of the side surfaces of the storage electrodes 310. This process may include performing a wet etch process using an etchant solution including HF to remove the lower molding layer 205 through the openings O.

Figure 1V:
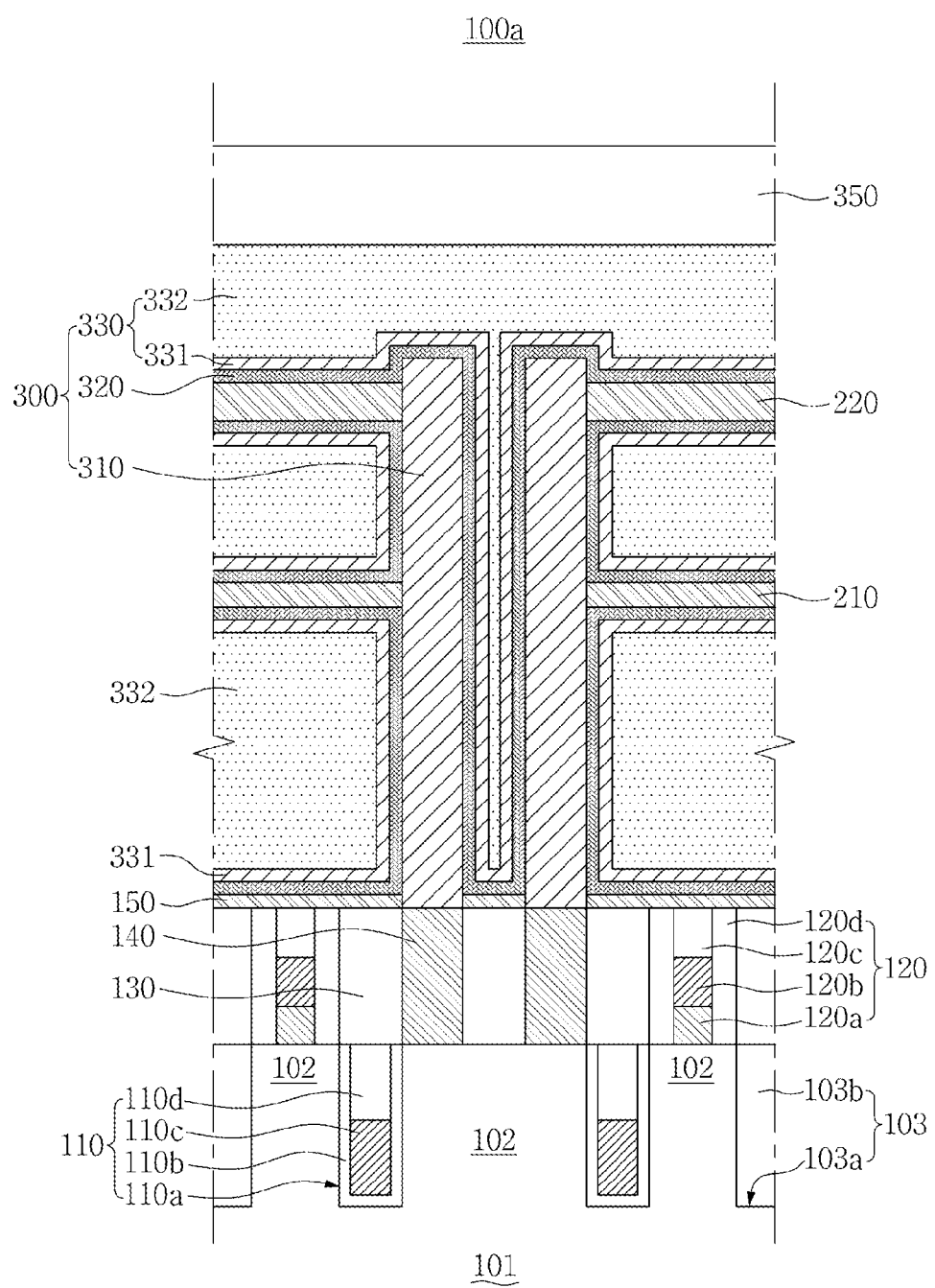

Referring to FIG. 1V, a capacitor 300 is then completed. For example, the method includes forming a capacitor dielectric layer 320, and a plate electrode 330. The forming of the capacitor dielectric layer 320 may include conformally forming a dielectric layer on the exposed surfaces of the storage electrodes 310, the stopping insulating layer 150, the lower supporter 210, and the upper supporter 220. The plate electrode 330 serves as a top electrode of the capacitor 300. The plate electrode 330 may include a first plate electrode layer 331 and a second plate electrode layer 332. The forming the first plate electrode layer 331 may include conformally forming a barrier metal layer such as TiN on the capacitor dielectric layer 320. The forming of the second plate electrode layer 332 may include forming a conductive material to fill the openings O, the upper space S1, and the lower space S2. For example, the second plate electrode layer 332 may be of polysilicon or amorphous silicon. Also, a cell capping insulating layer 350 may be formed on the capacitor 300. The forming of the cell capping insulating layer 350 may include forming an insulating layer such as silicon oxide on the second plate electrode 332 to cover the capacitor 300.

A method of forming another semiconductor device in accordance with the inventive concepts will be described in detail with reference to FIGS. 2A to 2T.

Figure 2A:
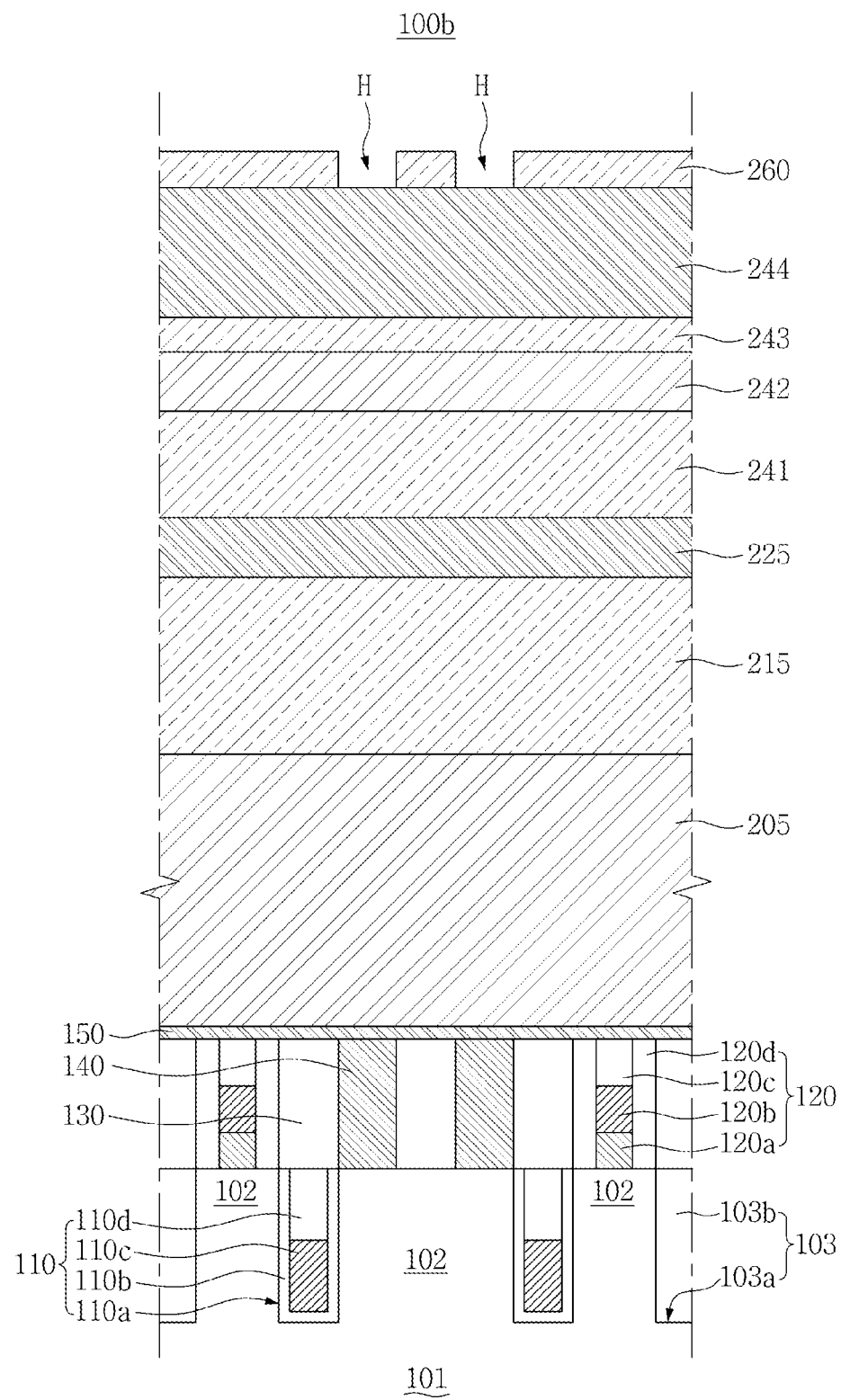

Referring first to FIG. 2A, the method of forming a semiconductor device 100b may include forming a field region 103 defining an active region 102 in a substrate 101, forming a gate structure 110 in the active region 102, forming a bit line structure 120 and a landing pad 140 on the substrate 101, and forming a stopping insulating layer 150 on the bit line structure 120 and the landing pad 140, all in the same manner as described above with reference to FIG. 1A.

The method further includes forming a lower molding layer 205 on the stopping insulating layer 150, forming an upper molding layer 215 on the lower molding layer 205, forming a supporter 225 on the upper molding layer 215, forming a first buffer layer 241 on the supporter 225, forming a second buffer layer 242 on the first buffer layer 241, forming a third buffer layer 243 on the second buffer layer 242, forming a fourth buffer layer 244 on the third buffer layer 243, and forming a first mask pattern 260 on the fourth buffer layer 244.

The forming of the supporter 225 may include forming a silicon nitride layer on the upper molding layer 215 by performing a deposition process. The supporter 225 includes an insulating material having etch selectivity with respect to the upper molding layer 215.

The forming of the first buffer layer 241 may include forming a polysilicon layer or an amorphous silicon layer on the supporter 225 by performing a deposition process. The first buffer layer 241 includes a material having etch selectivity with respect to the supporter 225.

The forming of the second buffer layer 242 may include forming a silicon oxide layer on the first buffer layer 241 by performing a deposition process. The second buffer layer 242 includes a material having etch selectivity with respect to the first buffer layer 241.

The forming of the third buffer layer 243 may include forming a polysilicon layer or an amorphous silicon layer on the second buffer layer 242 by performing a deposition process. The third buffer layer 243 includes a material having etch selectivity with respect to the second buffer layer 242.

The forming of the fourth buffer layer 244 may include forming a silicon nitride layer on the third buffer layer 243 by performing a deposition process. The fourth buffer layer 244 includes a material having etch selectivity with respect to the third buffer layer 243.

Thus, in these respects, the lower molding layer 205 and the second buffer layer 242 may be of the same material, the supporter 225 and the fourth buffer layer 244 may be of the same material, and the upper molding layer 215, the first buffer layer 241, and the third buffer layer 243 may be of the same material.

The forming the first mask pattern 260 may include forming a material having etch selectivity with respect to silicon nitride on the fourth buffer layer 244 by performing a deposition process, and forming holes H exposing the fourth buffer layer 244 by performing a photolithography process. For example, the first mask pattern 260 may be a layer of photoresist, a polysilicon layer, an amorphous silicon layer, a silicon oxide layer, an SOH layer, a silicon oxynitride layer, or a high molecular weight organic material layer.

Figure 2B:
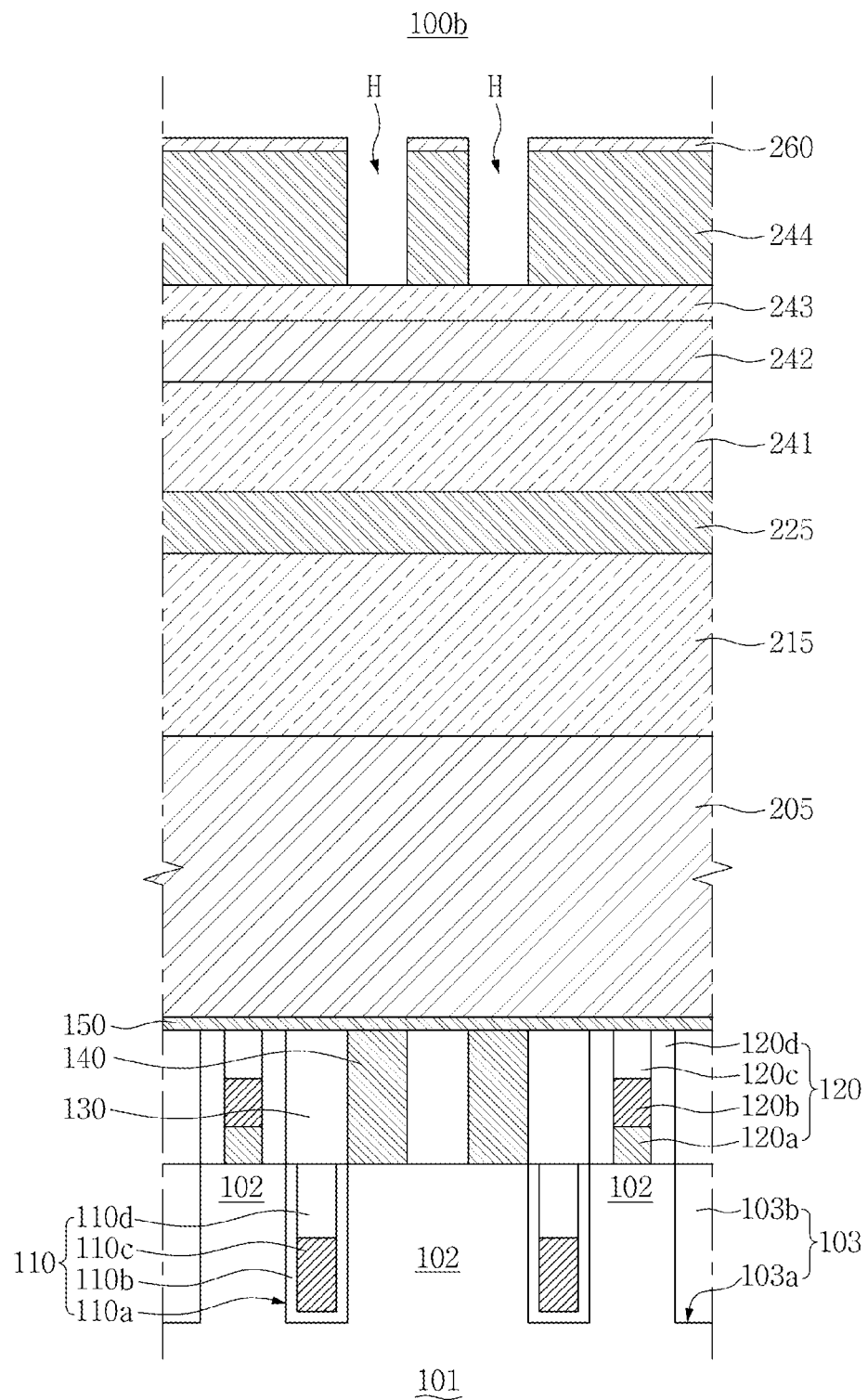

Referring to FIG. 2B, the fourth buffer layer 244 is selectively etched using the first mask pattern 260 as an etch mask to extend the holes H deeper into the structure. An upper surface of the third buffer layer 243 becomes exposed in the holes H. In the illustrated example of this process, the first mask pattern 260 is etched to become thinner.

Figure 2C:
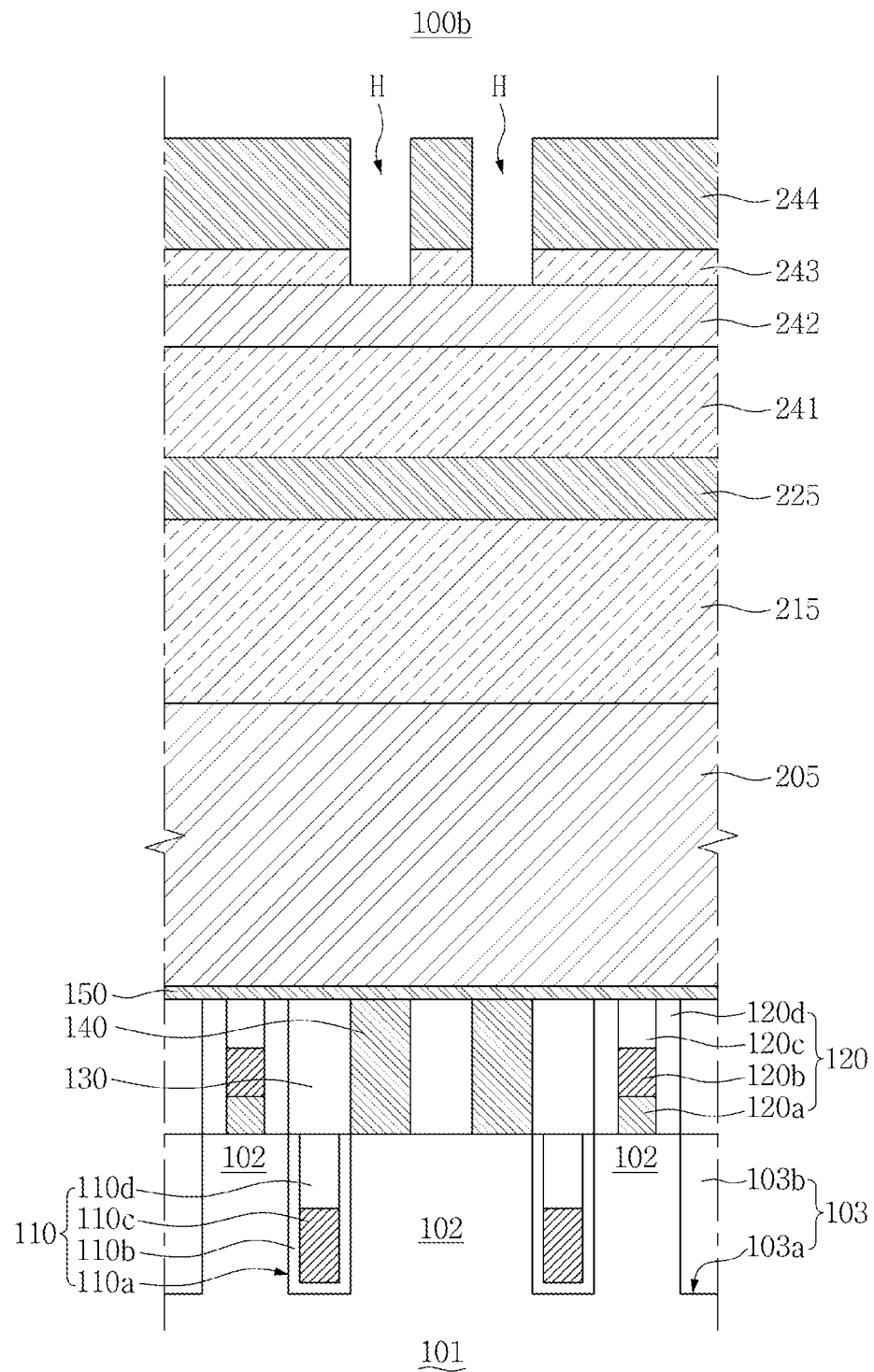

Referring to FIG. 2C, the third buffer layer 243 is selectively etched using the first mask pattern 260 and the fourth buffer layer 244 as an etch mask. When the first mask pattern 260 and the third buffer layer 243 are of the same material, the first mask pattern 260 alone would not function effectively as the etch mask. An upper surface of the second buffer layer 242 becomes exposed in the holes H. In the illustrated example of this process, the first mask pattern 260 is completely removed, and the fourth buffer layer 244 becomes thinner.

Figure 2D:
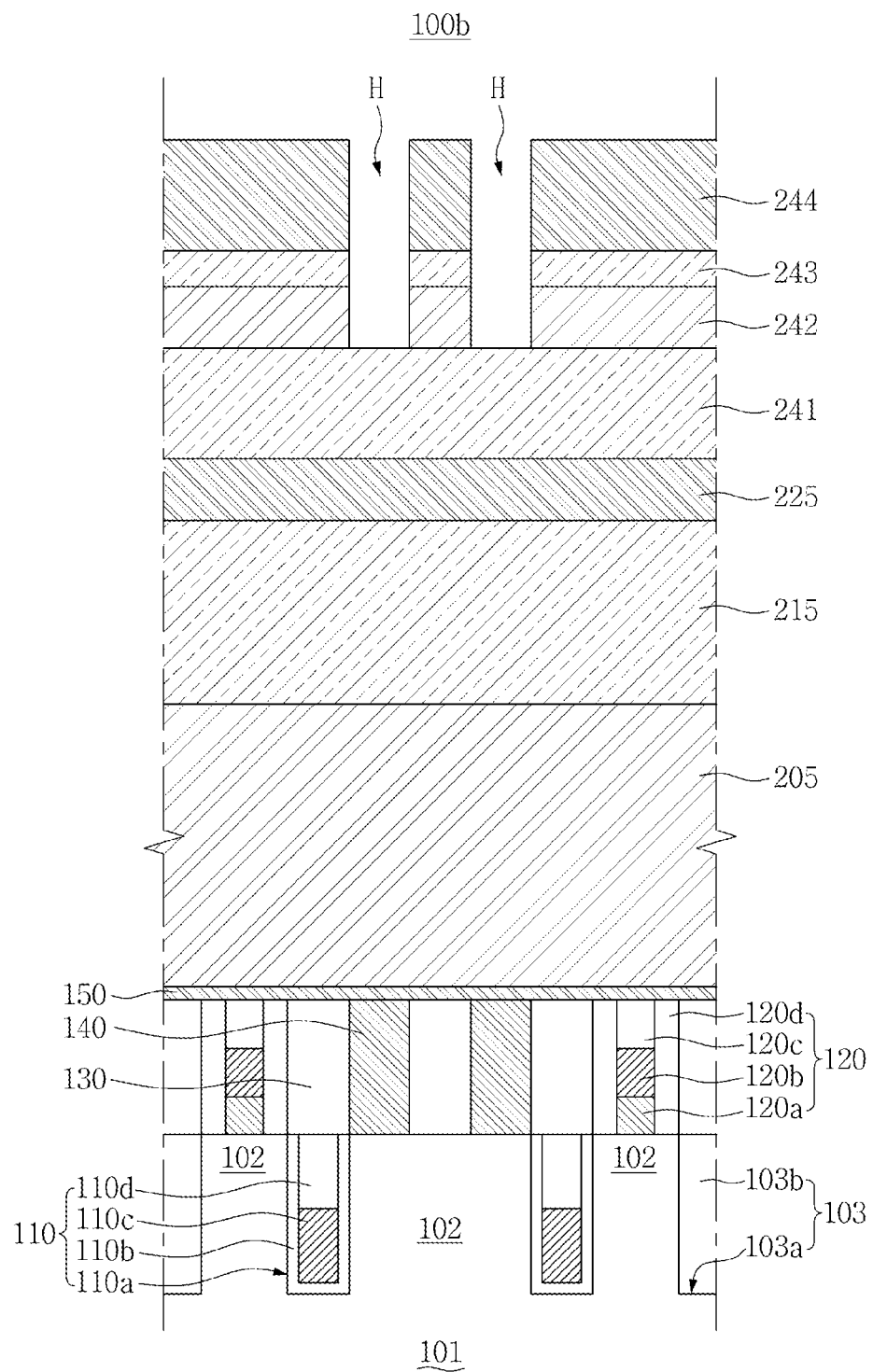

Referring to FIG. 2D, the second buffer layer 242 is selectively etched using the fourth buffer layer 244 as an etch mask to extend the holes H further. The first buffer layer 241 becomes exposed in the holes H. In the illustrated example of this process, the fourth buffer layer 244 becomes thinner.

Figure 2E:
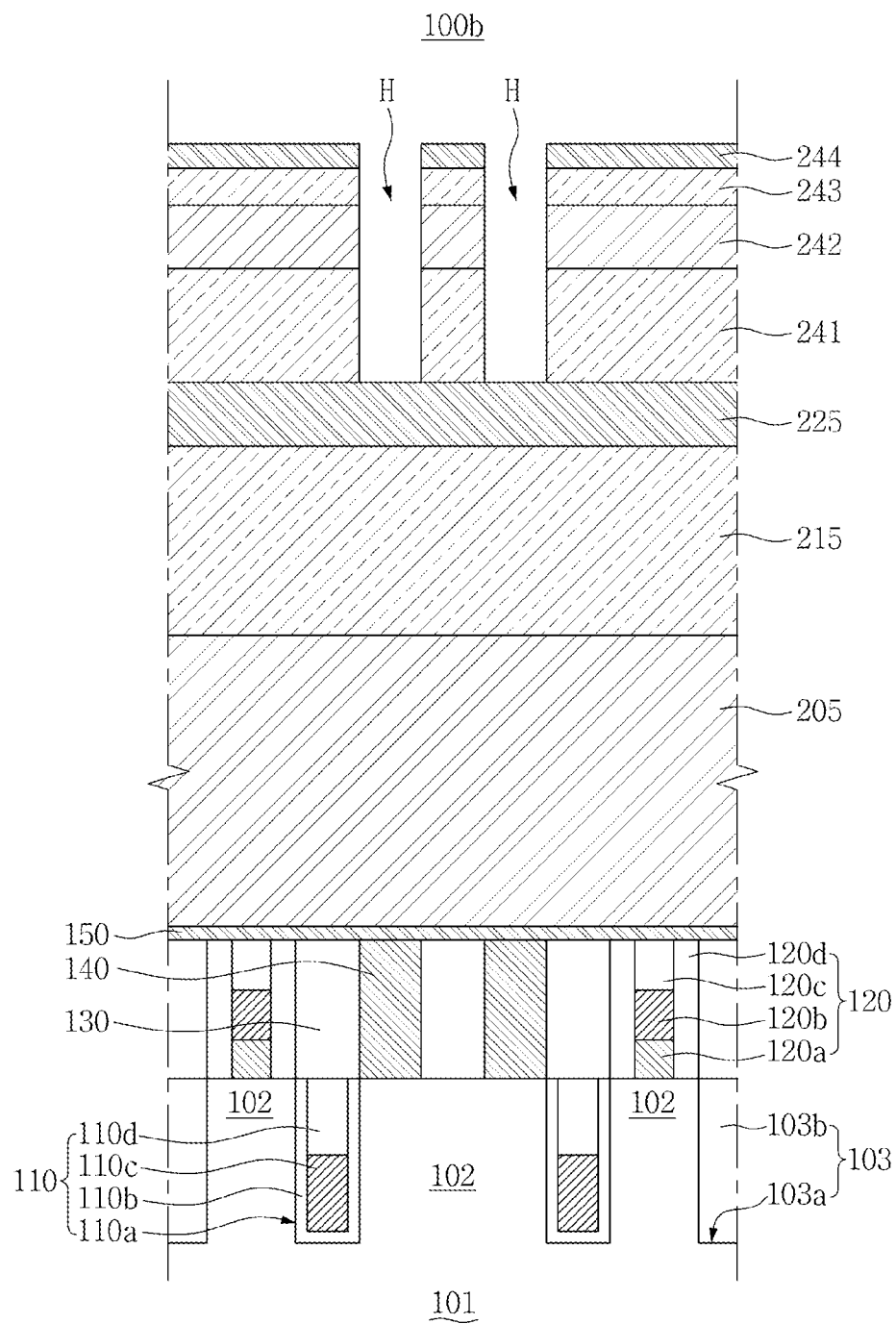

Referring to FIG. 2E, the first buffer layer 241 is selectively etched using the fourth buffer layer 244 as an etch mask to extend the holes. The supporter 225 is exposed by the holes. In the illustrated example of this process, the fourth buffer layer 244 becomes thinner.

Figure 2F:
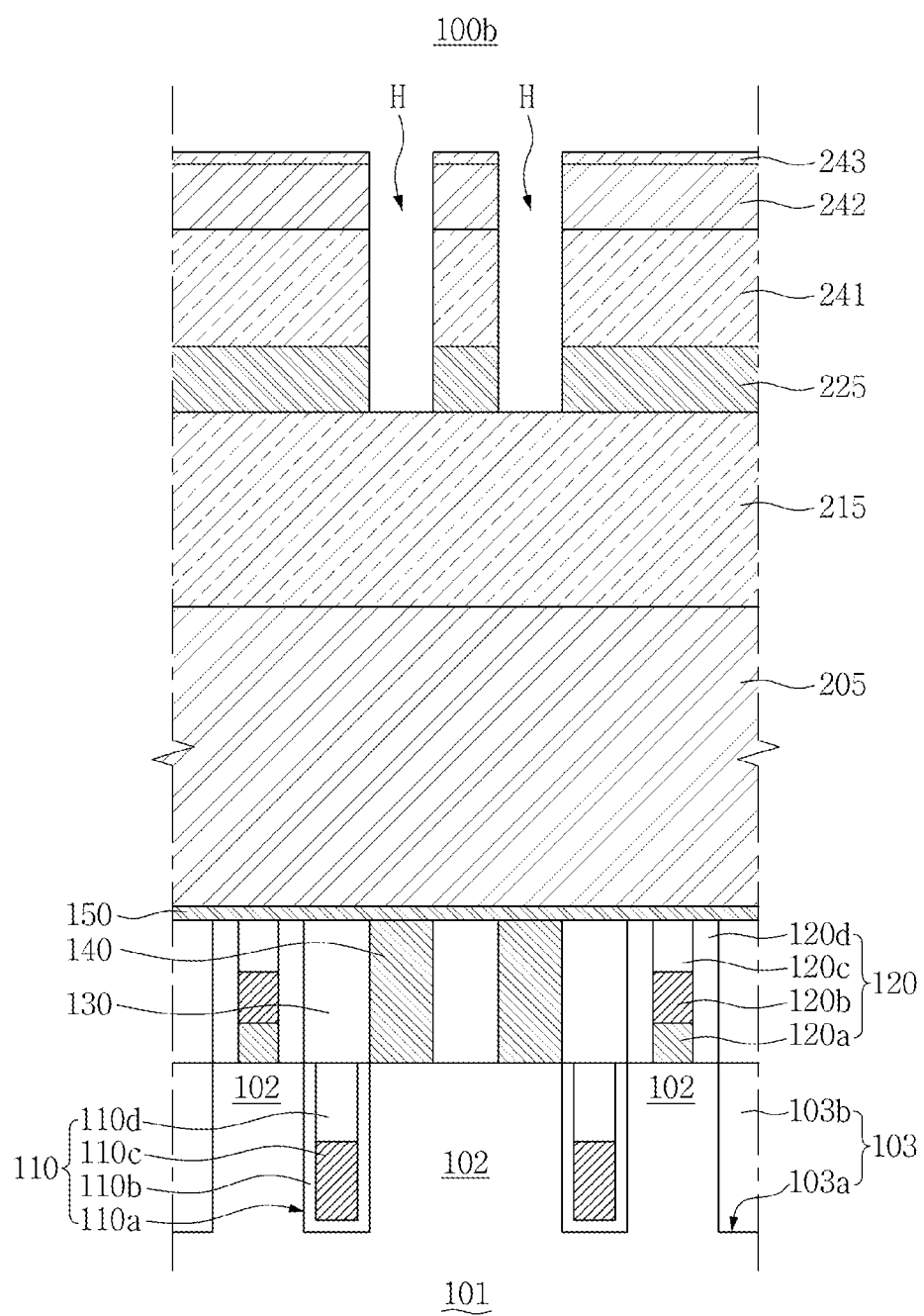

Referring to FIG. 2F, the supporter 225 is selectively etched using the fourth buffer layer 244 and the third buffer layer 243 as an etch mask to again extend the holes H. When the fourth buffer layer 244 and the supporter 225 are of the same material, the fourth buffer layer 244 alone would not function effectively as the etch mask. The upper molding layer 215 is exposed by the holes H. In the illustrated example of this process, the fourth buffer layer 244 is completely removed, and the third buffer layer 243 becomes thinner.

Figure 2G:
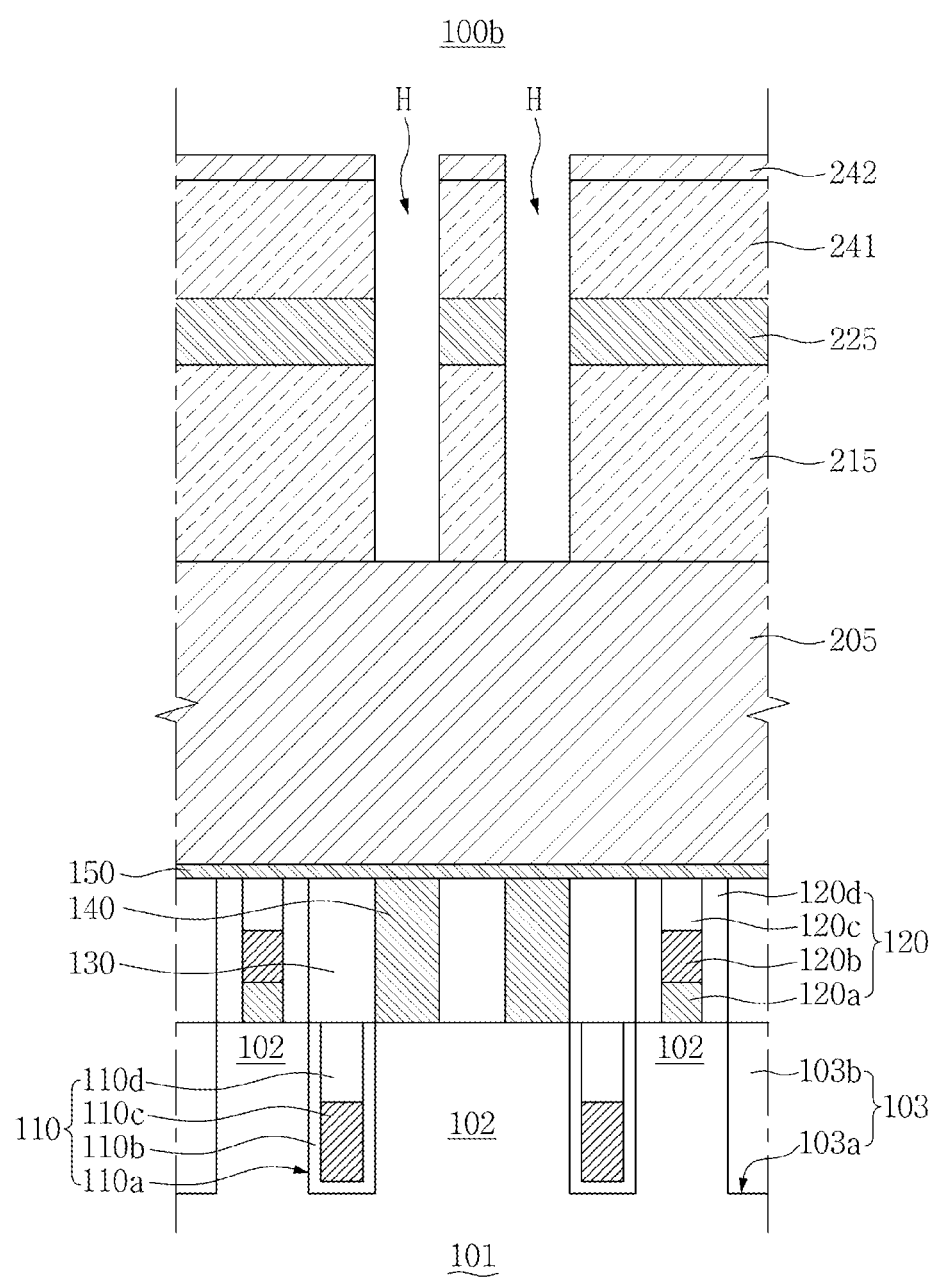

Referring to FIG. 2G, the upper molding layer 215 is selectively etched using the third buffer layer 243 and the second buffer layer 242 as an etch mask to extend the holes H. When the third buffer layer 243 and the upper molding layer 215 are of the same material, the third buffer layer 243 alone would not function effectively as the etch mask. The lower molding layer 205 becomes exposed in the holes H. In the illustrated example of this process, the second buffer layer 242 is completely removed.

Figure 2H:
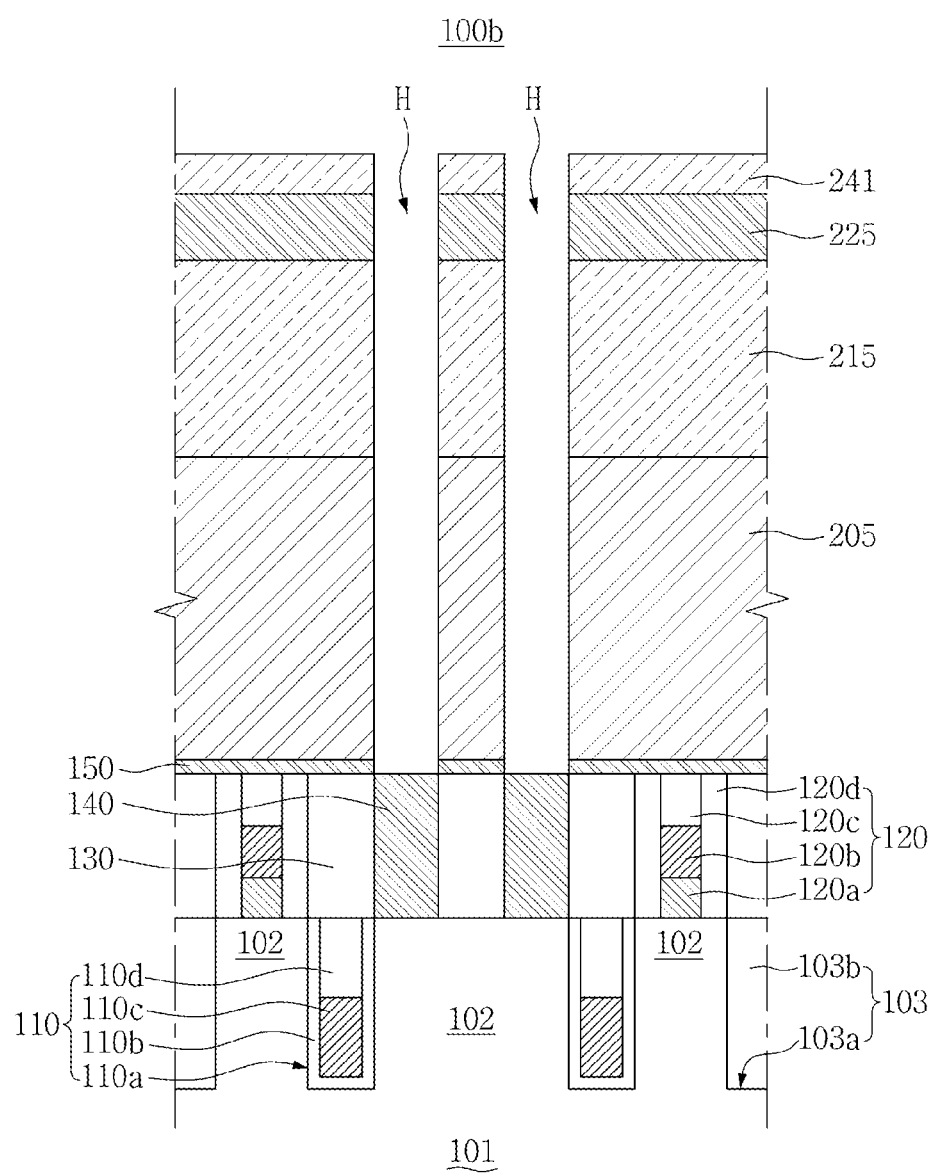

Referring to FIG. 2H, the lower molding layer 205 and the stopping insulating layer 150 are selectively etched using the second buffer layer 242 and the first buffer layer 241 as an etch mask to extend the holes H. When the second buffer layer 242 and the lower molding layer 205 are of the same material, the second buffer layer 242 alone would not function effectively as the etch mask. An upper surface of the landing pad 140 becomes exposed by the holes H. In the illustrated example of this process, the first buffer layer 241 becomes thin.

Figure 2I:
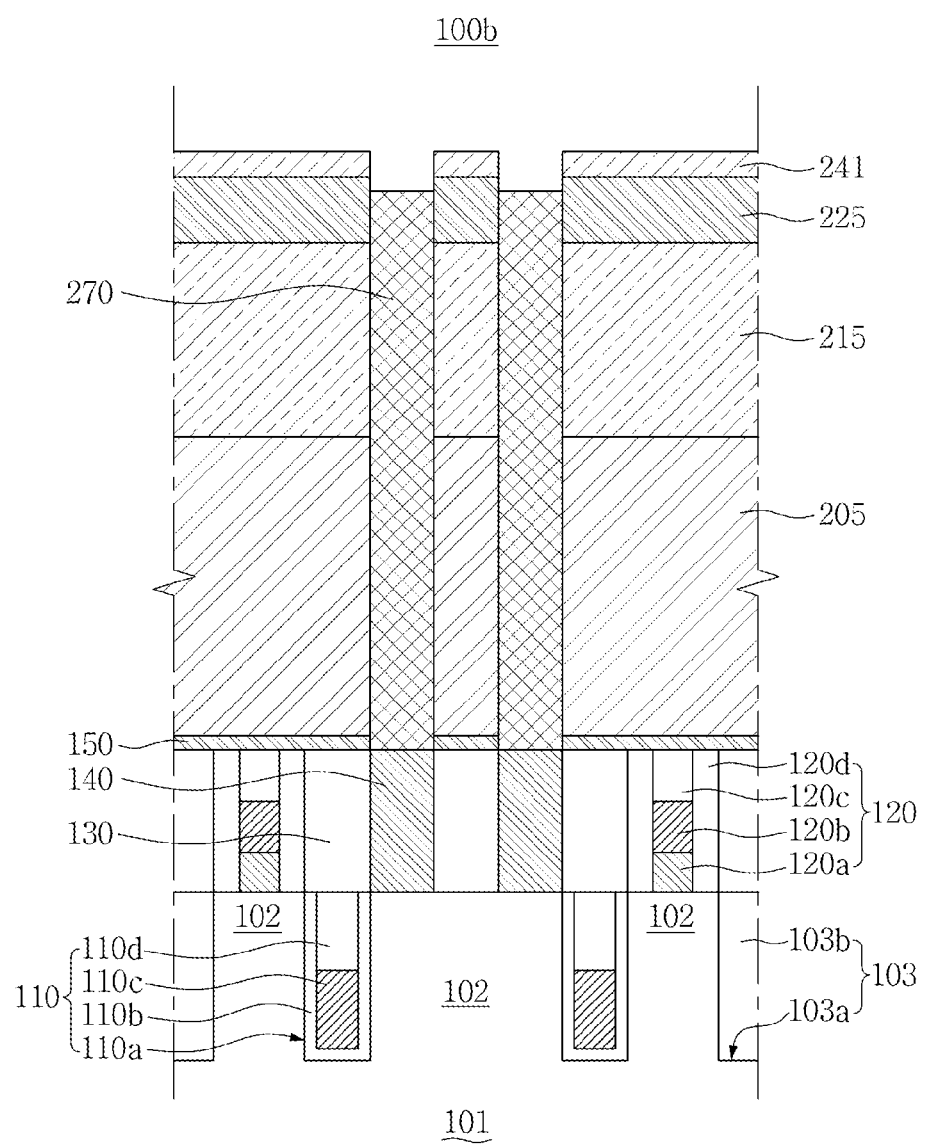

Referring to FIG. 2I, the holes H are filled with a sacrificial layer 270. The sacrificial layer 270 may be recessed by an etchback process so that its upper surface becomes situated at a level lower than that of the supporter 225 in the structure. The sacrificial layer 270 includes a material having etch selectivity with respect to silicon, silicon oxide, and silicon nitride. For example, the sacrificial layer 270 includes an insulating material such as SOH including C or the like.

Figure 2J:
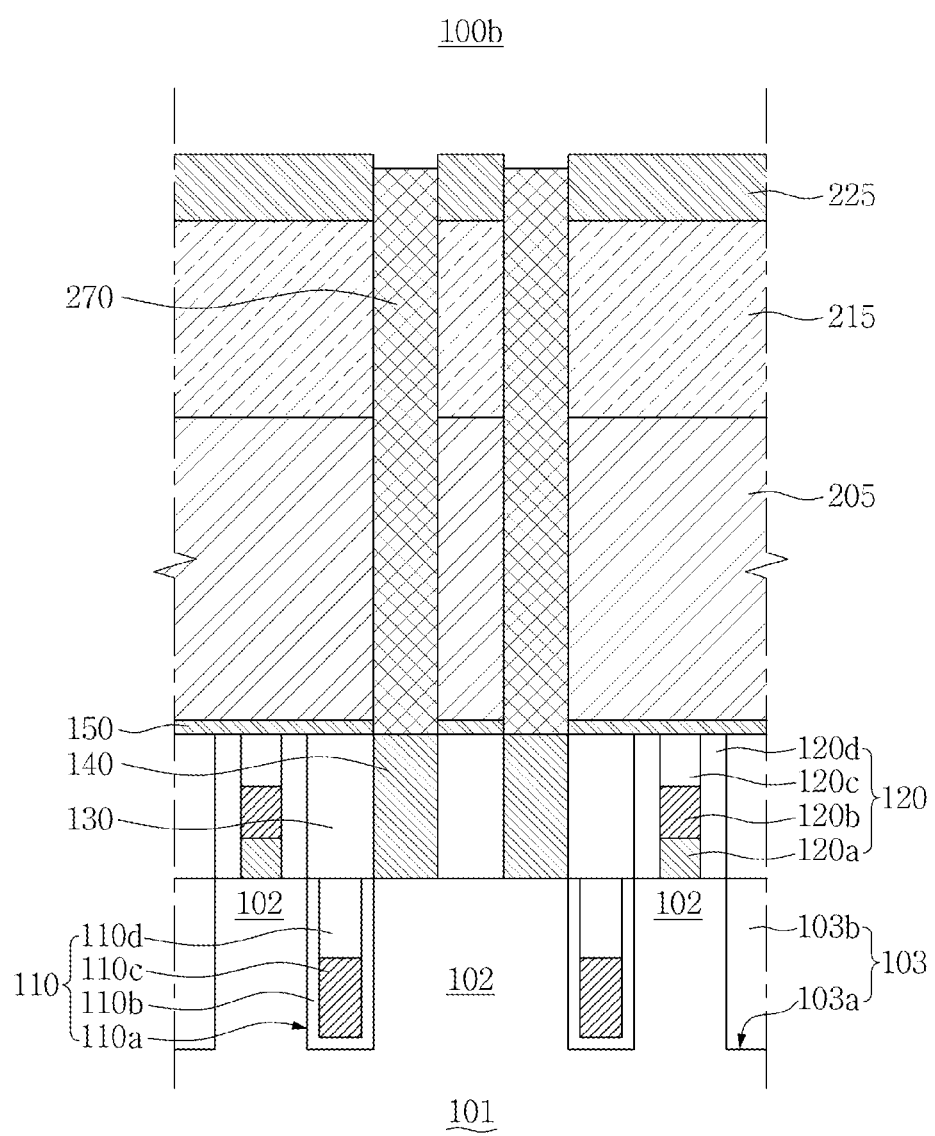

Referring to FIG. 2J, the first buffer layer 241 is removed.

Figure 2K:
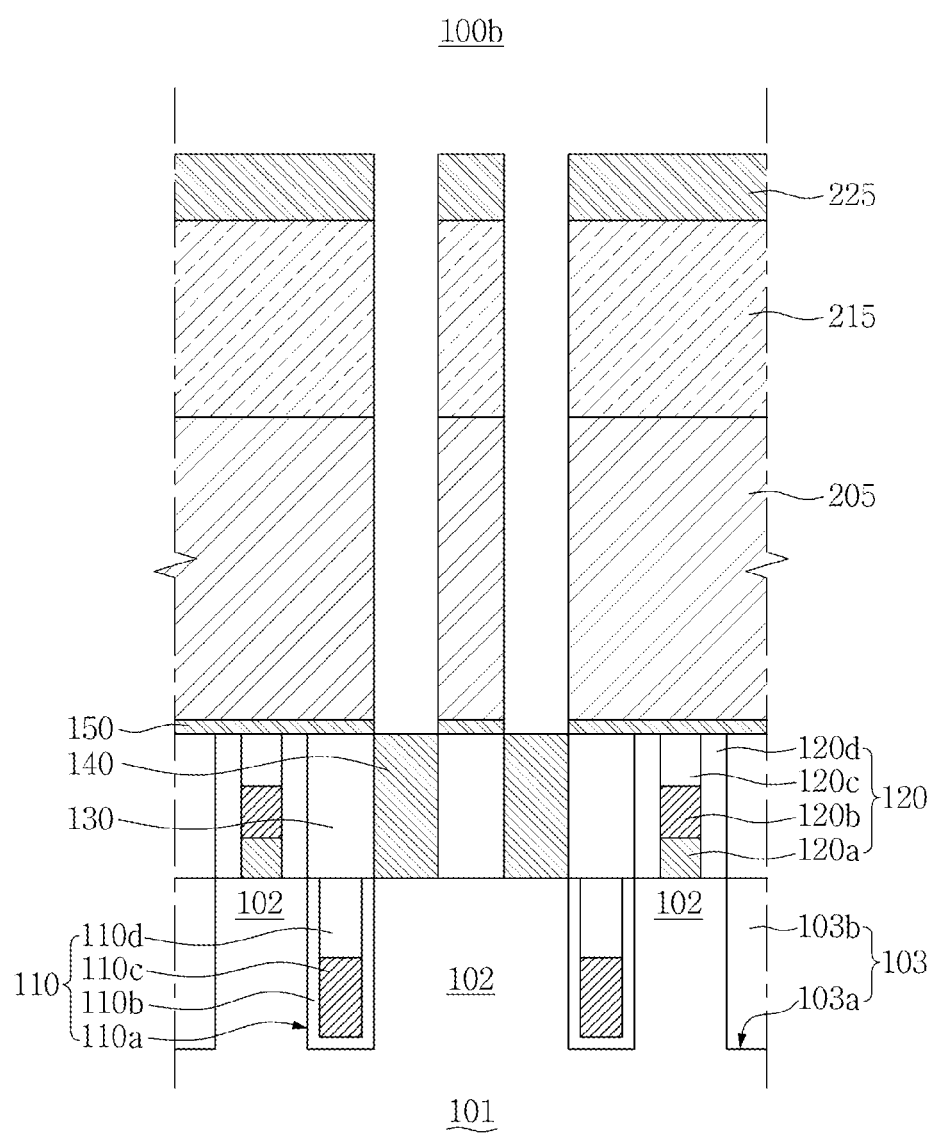

Referring to FIG. 2K, the sacrificial layer 270 is removed to empty the holes H.

Figure 2L:
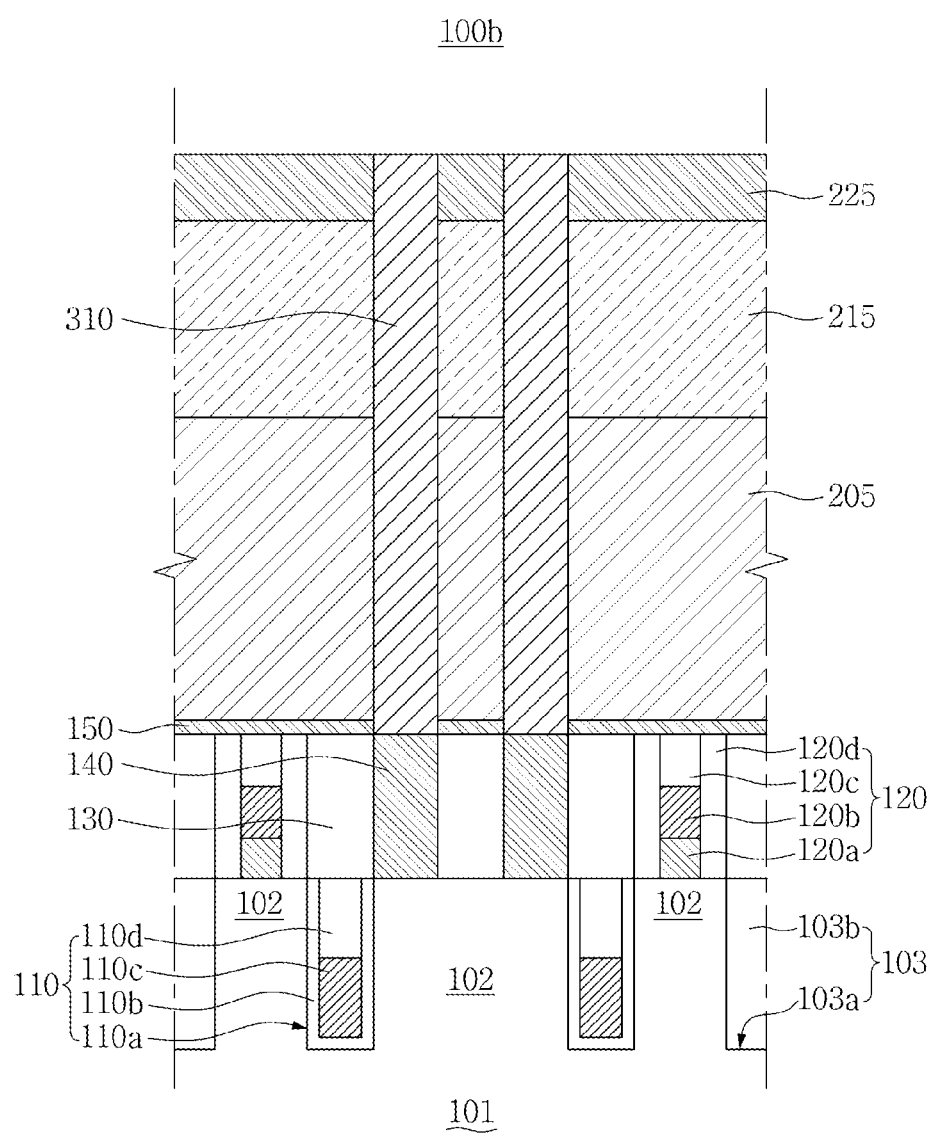

Referring to FIG. 2L, storage electrodes 310 are formed in the holes H.

Figure 2M:
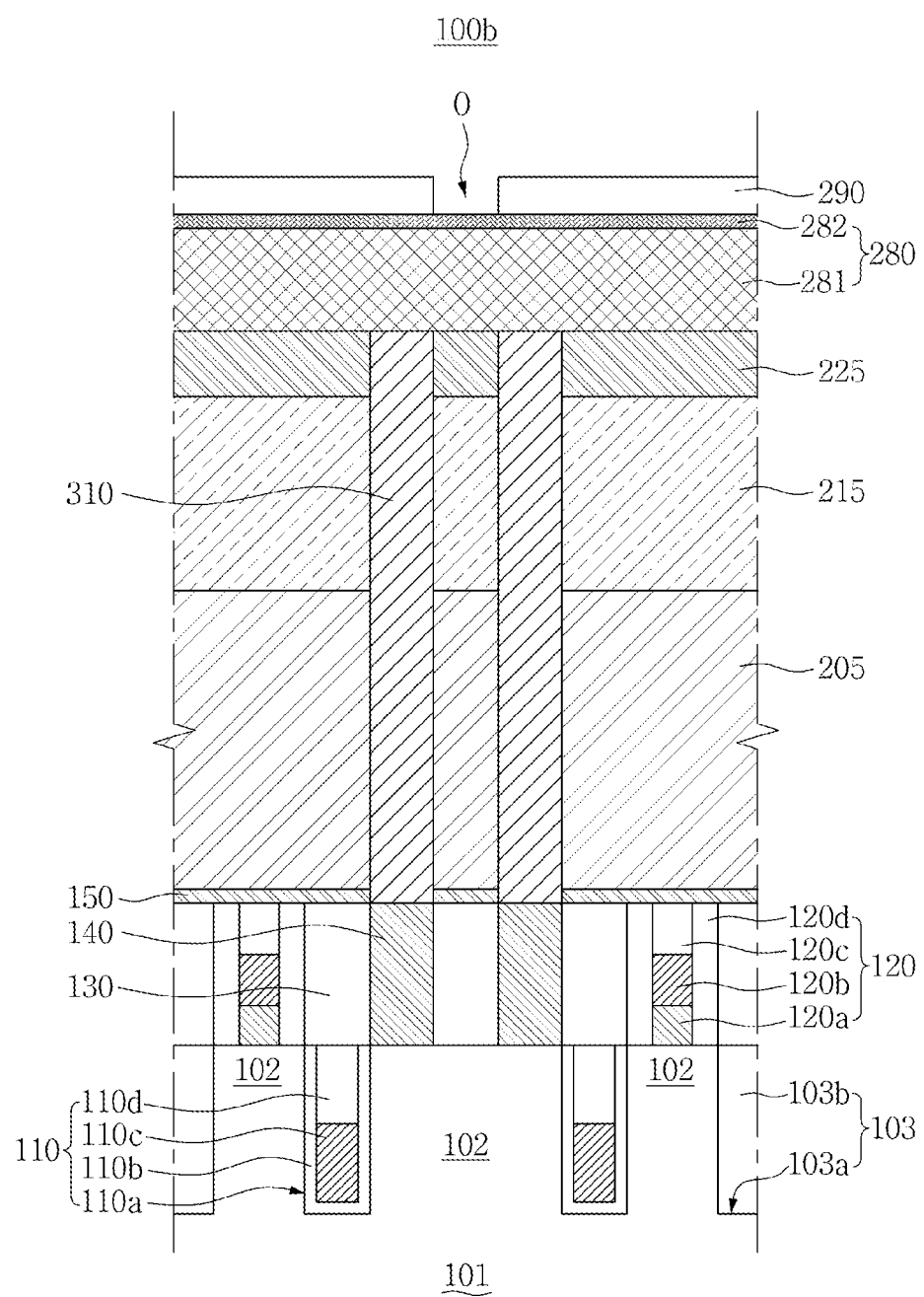

Referring to FIG. 2M, a hard mask 280 and a second mask pattern 290 are formed on the storage electrodes 310 and the supporter 225. The hard mask 280 may include a lower hard mask layer 281 and an upper hard mask layer 282. The lower hard mask layer 281 includes a material having etch selectivity with respect to silicon, silicon oxide, and/or silicon nitride. For example, the lower hard mask 281 may include SOH including C or the like, or a polymer. The upper hard mask layer 282 includes a material having etch selectivity with respect to the lower hard mask layer 281. For example, the upper hard mask layer 282 may include PE-SiON, i.e., silicon oxynitride formed by a plasma process. The second mask pattern 290 has openings O each aligned with a region between adjacent ones of the storage electrodes 310. An upper surface of the upper hard mask layer 282 is exposed by the openings O. The second mask pattern 290 includes a material having etch selectivity with respect to the upper hard mask layer 282. For example, the second mask pattern 290 may include a photoresist or silicon layer.

Figure 2N:
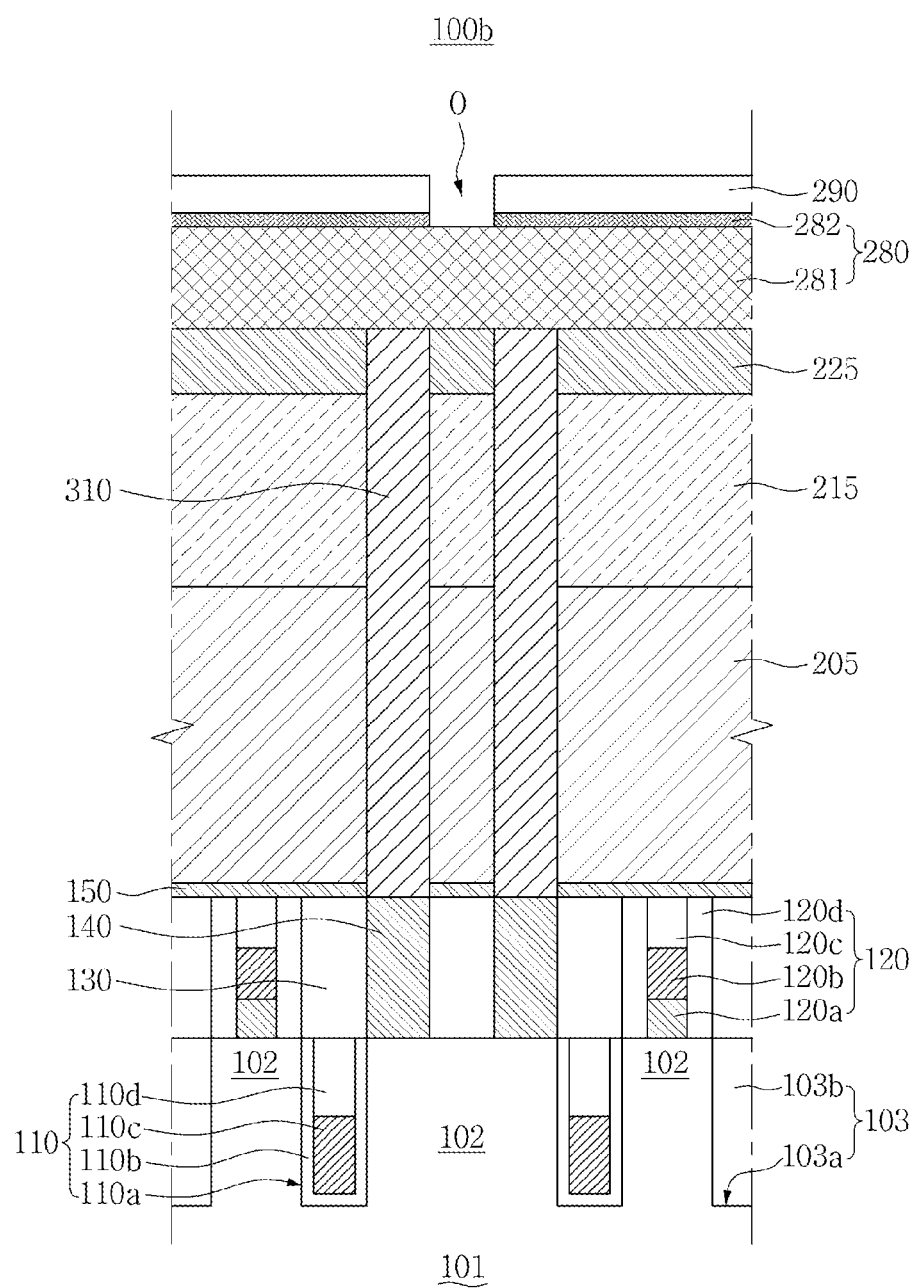
Figure 20:
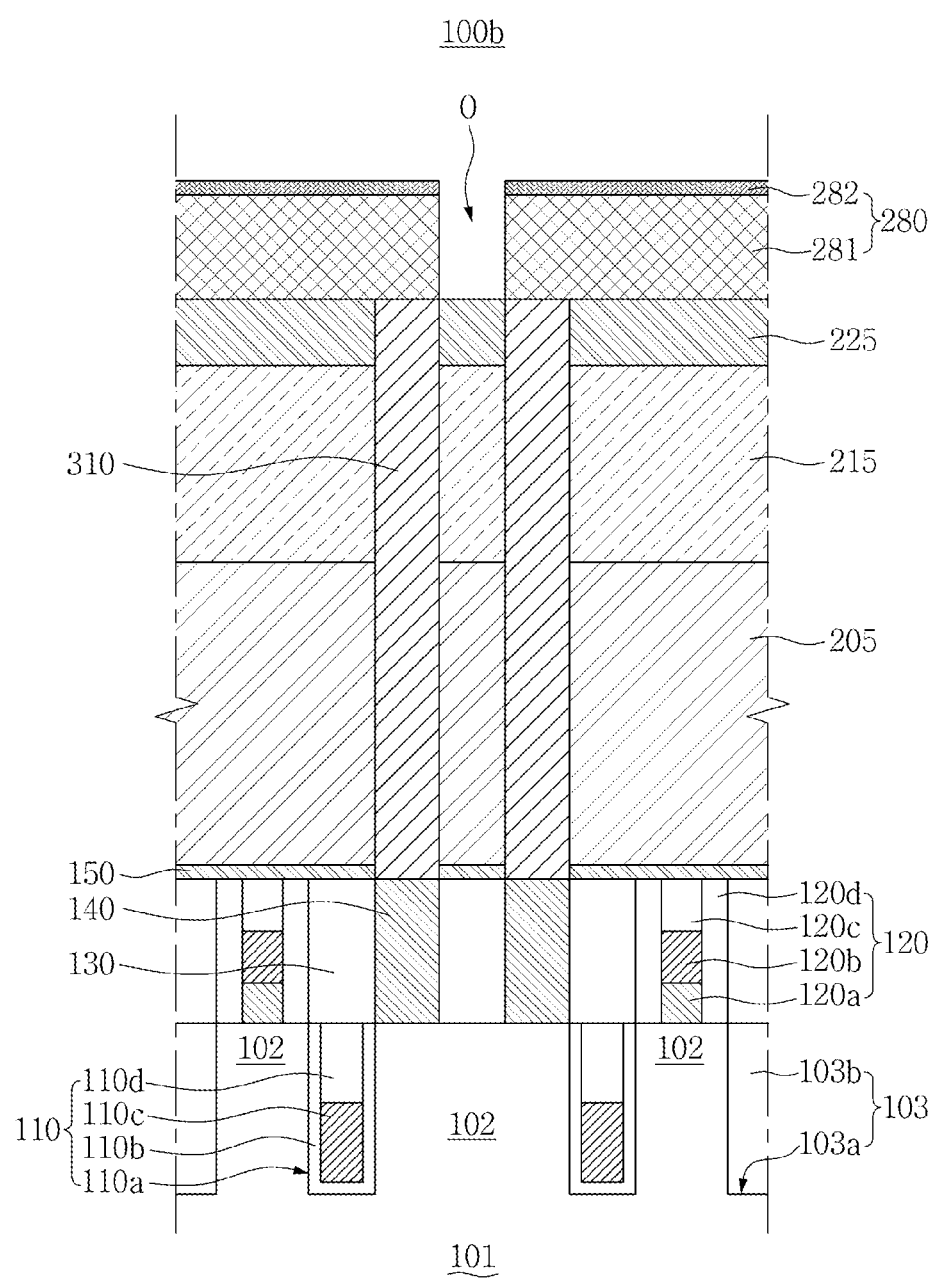

Referring to FIG. 2N, the upper hard mask layer 282 is selectively etched using the second mask pattern 290 as an etch mask to extend the openings O deeper into the structure. An upper surface of the lower hard mask layer 281 becomes exposed by the openings O.

Referring to FIG. 2O, the lower hard mask layer 281 is selectively etched using the second mask pattern 290 and the upper hard mask layer 282 as an etch mask to further extend the openings O. An upper surface of the supporter 225 is exposed by the openings O. In the illustrated example of this process, the second mask pattern 290 is removed.

Figure 2P:
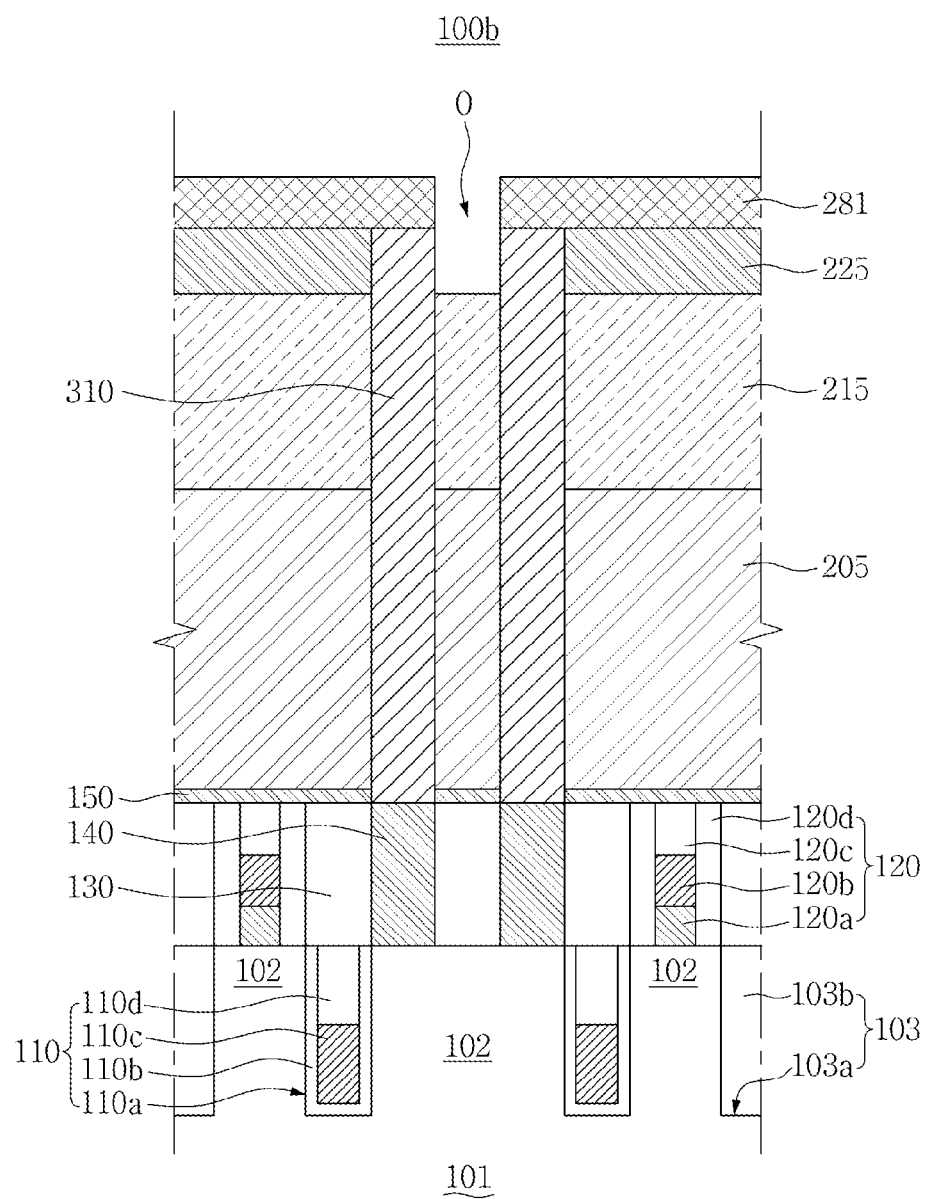

Referring to FIG. 2P, the supporter 225 is selectively etched using the upper hard mask layer 282 and the lower hard mask layer 281 as an etch mask to extend the openings O. An upper surface of the upper molding layer 215 is exposed by the openings O. In the illustrated example of this process, the upper hard mask layer 282 is completely removed, and the lower hard mask 281 becomes thinner.

Figure 2Q:
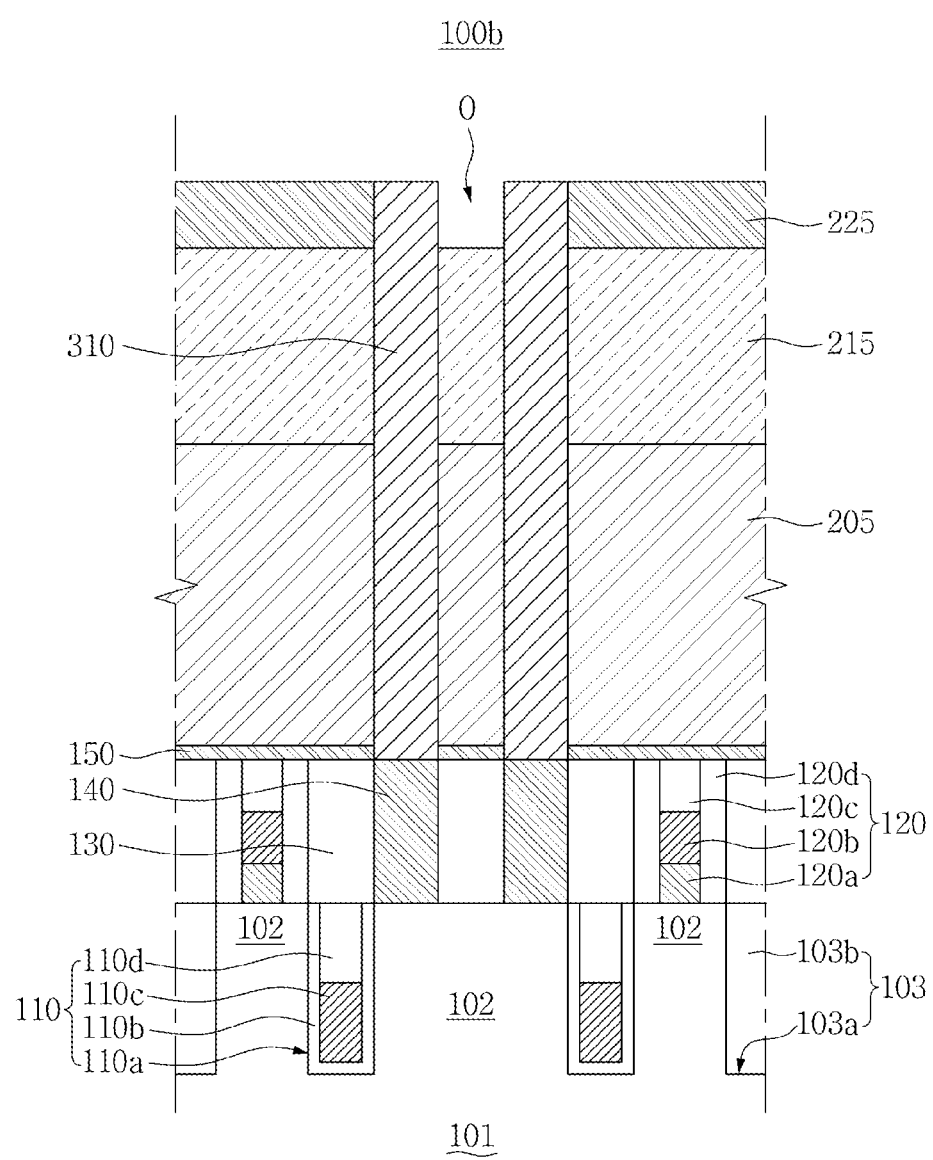

Referring to FIG. 2Q, the lower hard mask layer 281 is removed.

Figure 2R:
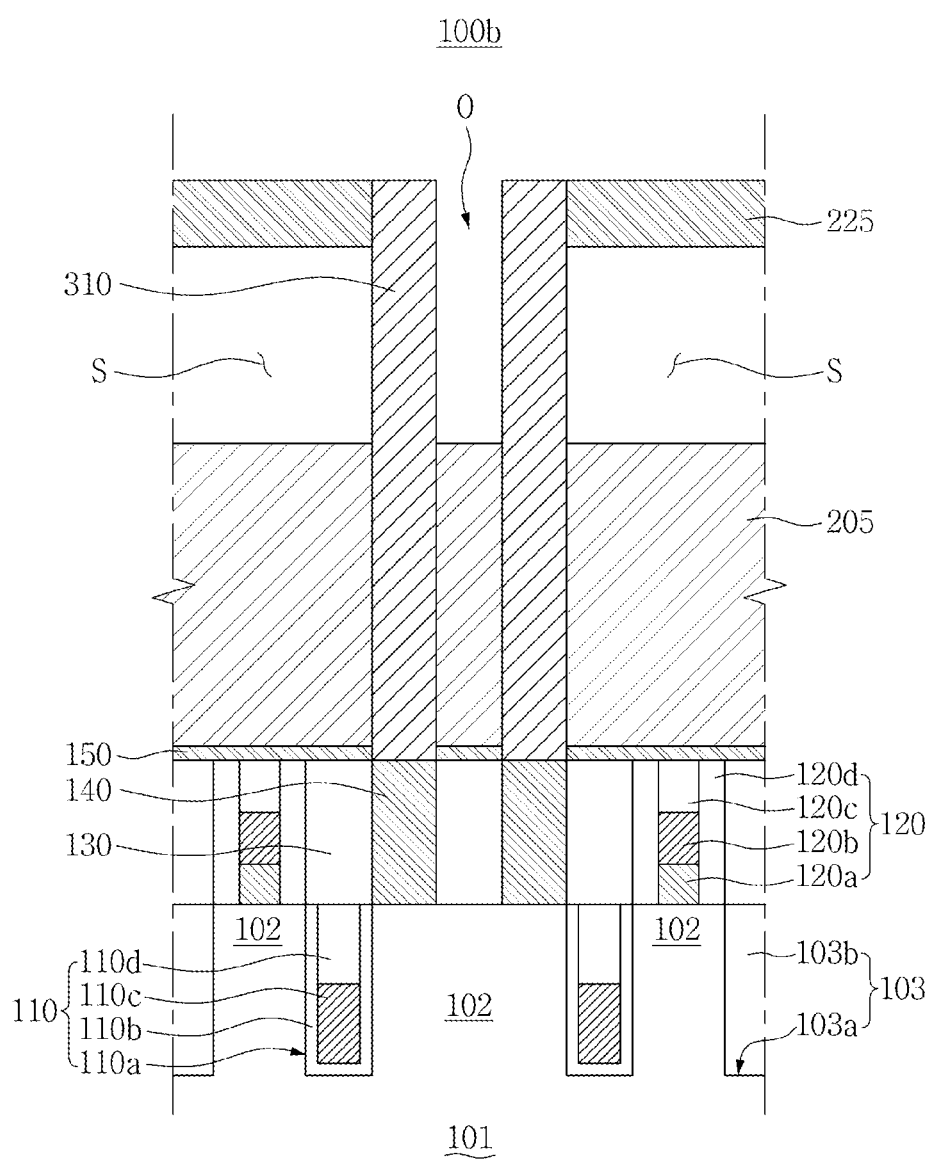

Referring to FIG. 2R, the upper molding layer 215 is removed to form a space S exposing the upper surface of the lower molding layer 205. The upper molding layer 215 may be removed by introducing etchant into the openings O.

Figure 2S:
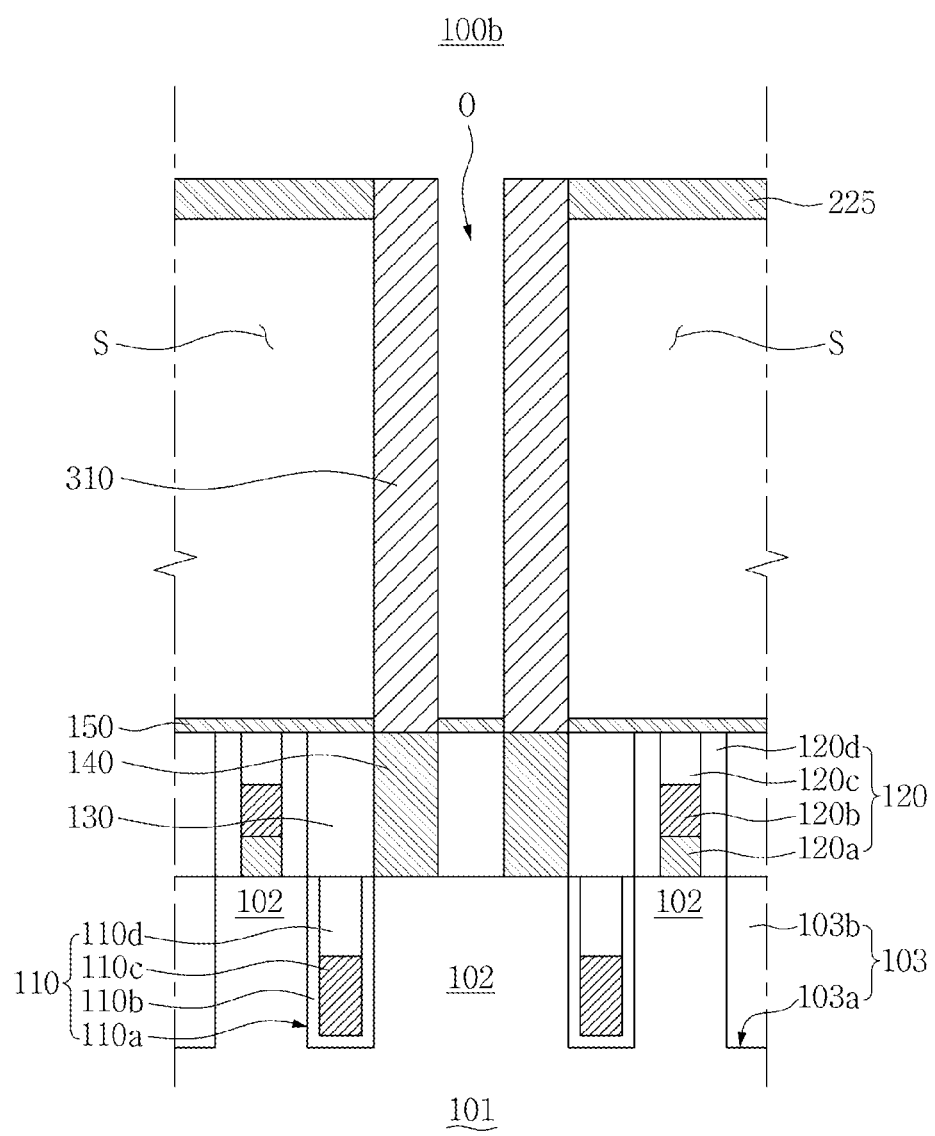

Referring to FIG. 2S, the lower molding layer 205 is removed to expand the space S. As a result, the upper surface of the stopping insulating layer 150 is exposed. In this case, the molding layer 205 may be removed by introducing etchant into the original space S via the openings O.

Figure 2T:
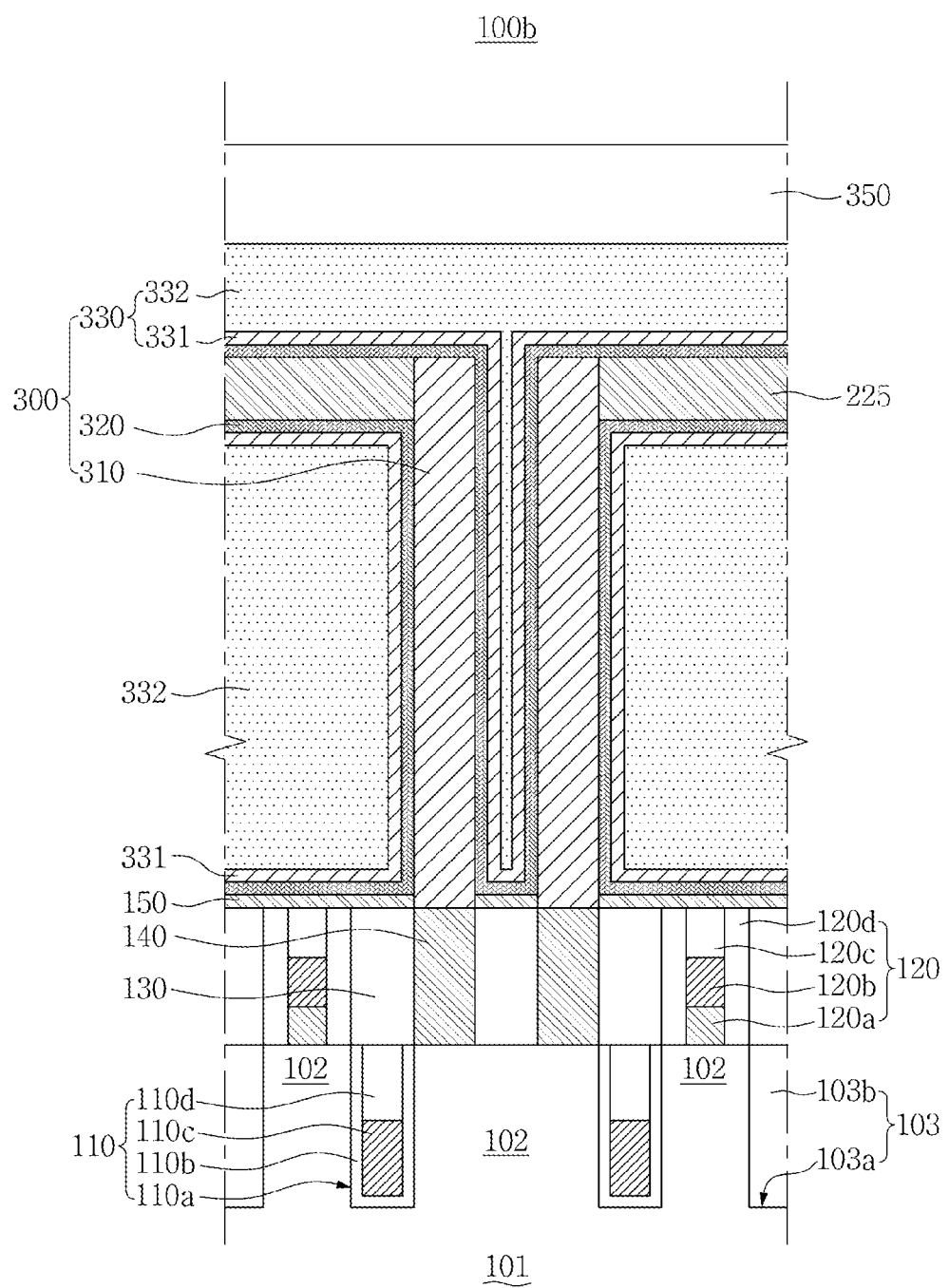

Referring to FIG. 2T, a capacitor structure 300 is completed. For example, a capacitor dielectric layer 320 and a plate electrode 330 are formed. The forming of the capacitor dielectric layer 320 may include conformally forming a dielectric material on the exposed surfaces of the storage electrodes 310, the stopping insulating layer 150, and the supporter 225. The plate electrode 330 may include a first plate electrode layer 331 and a second plate electrode layer 332. The forming the first plate electrode layer 331 may include conformally forming a barrier metal layer such as TiN on the capacitor dielectric layer 320. The forming the second plate electrode layer 332 may include forming a conductive material to fill the openings O and the space S. For example, the second plate electrode layer 332 may be a layer of polysilicon or amorphous silicon. In addition a cell capping insulating layer 350 may be formed on the capacitor 300. The forming of the cell capping insulating layer 350 may include forming an insulating layer such as a layer of silicon oxide on the second plate electrode 332 to cover the capacitor 300.

Another method of forming a semiconductor device in accordance with the inventive concepts will be described with reference to FIGS. 3A to 3M.

Figure 3A:
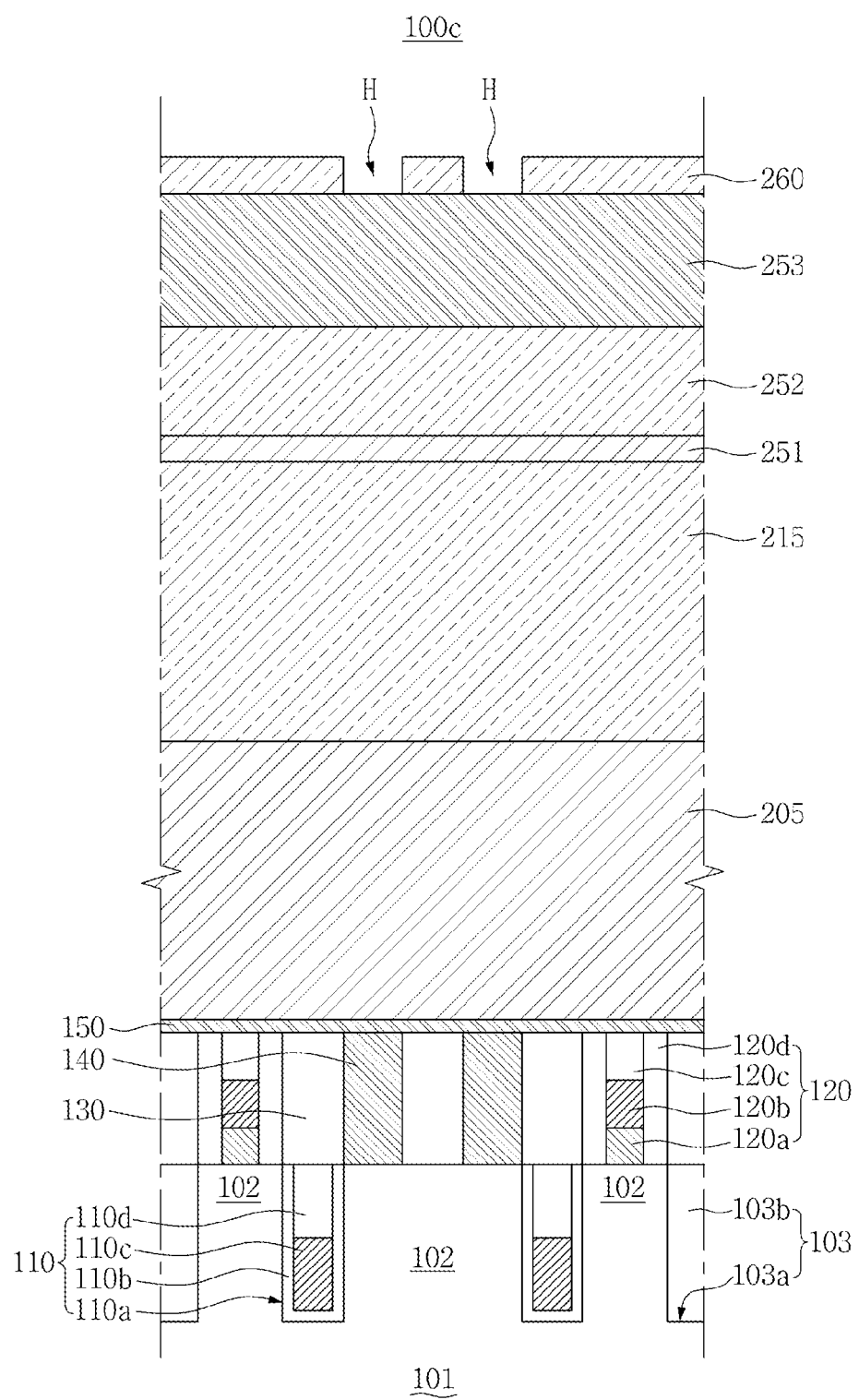
FIGS. 3A, 3B, 3C, 3D, 3E, 3F, 3G, 3H, 3I, 3J, 3K, 3L and 3M are each a cross-sectional view of a semiconductor device during the course of its manufacture and together illustrate still another embodiment of a method of manufacturing a semiconductor device according to the inventive concepts.

Referring first to FIG. 3A, the method of forming the semiconductor device 100c may include forming a field region 103 defining an active region 102 in a substrate 101, forming a gate structure 110 in the active region 102, forming a bit line structure 120 and a landing pad 140 on the substrate 101, and forming a stopping insulating layer 150 on the bit line structure 120 and the landing pad 140, all in the same manner as described above with reference to FIG. 1A.

The method further includes forming a lower molding layer 205 on the stopping insulating layer 150, forming an upper molding layer 215 on the lower molding layer 205, forming a first buffer layer 251 on the upper molding layer 215, forming a second buffer layer 252 on the first buffer layer 251, forming a third buffer layer 253 on the second buffer layer 252, and forming a first mask pattern 260 on the third buffer layer 253.

The forming of the first buffer layer 251 may include forming a silicon oxide layer on the upper molding layer 215 by performing a deposition process. The first buffer layer 251 includes a material having etch selectivity with respect to the upper molding layer 215. In this respect, the first buffer layer 251 may be of the same material as the lower molding layer 205.

The forming of the second buffer layer 252 may include forming a polysilicon layer or an amorphous silicon layer on the first buffer layer 251 by performing a deposition process. The second buffer layer 252 includes a material having etch selectivity with respect to the first buffer layer 251. In this respect, the second buffer layer 252 may be of the same material as the upper molding layer 215.

The forming of the third buffer layer 253 may include forming a silicon nitride layer on the second buffer layer 252 by performing a deposition process. The third buffer layer 253 includes a material having etch selectivity with respect to each of the first buffer layer 251 and the second buffer layer 252.

The forming the first mask pattern 260 includes forming a material having etch selectivity with respect to silicon nitride on the third buffer layer 253 by performing a deposition process, and forming holes H exposing the third buffer layer 253 by performing a photolithography process. The first mask pattern 260 may be a photoresist layer, a polysilicon layer, an amorphous silicon layer, a silicon oxide layer, an SOH layer, a silicon oxynitride layer, or a high molecular weight organic material layer.

Figure 3B:
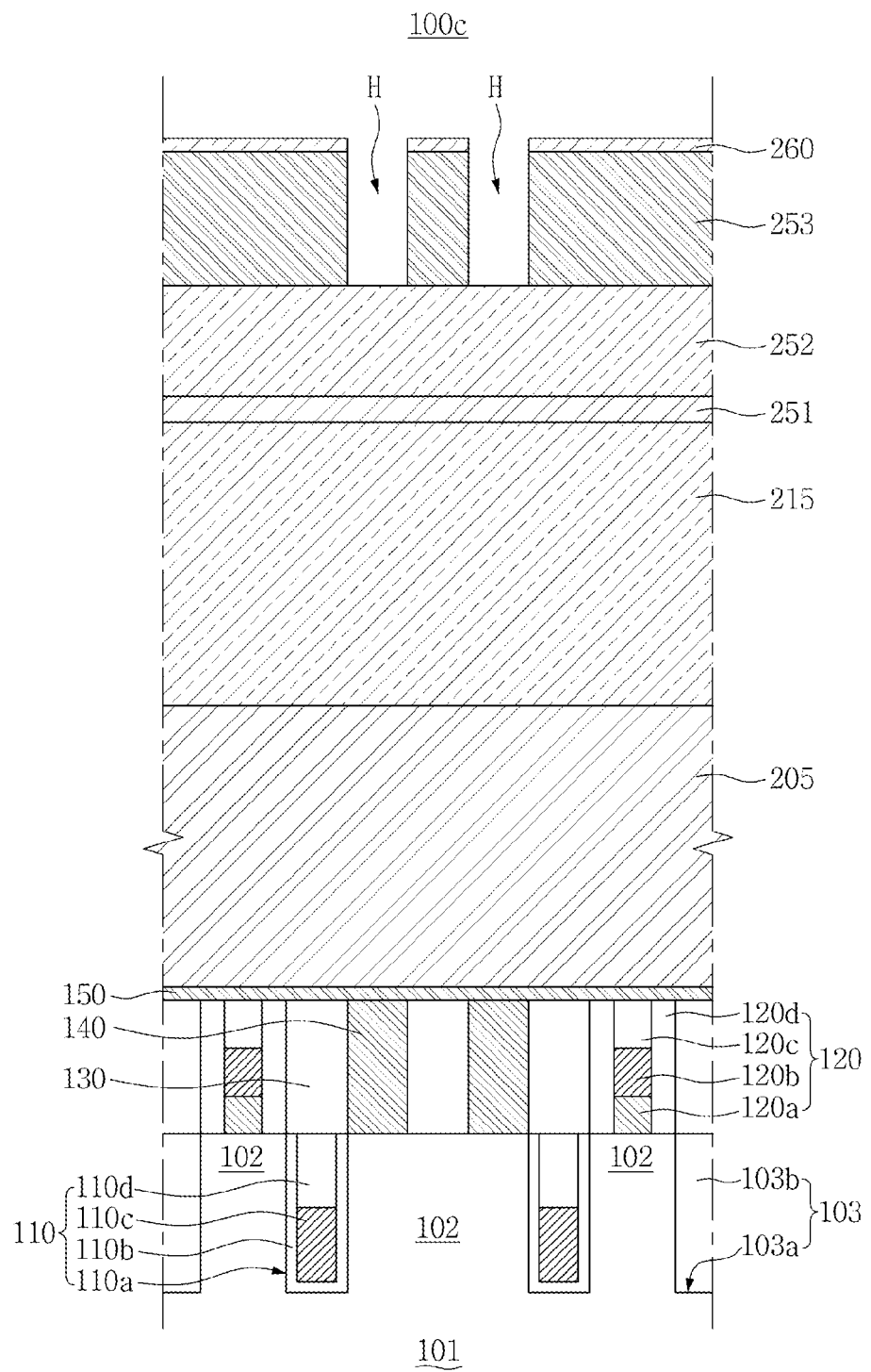

Referring to FIG. 3B, the third buffer layer 253 is selectively etched using the first mask pattern 260 as an etch mask to extend the holes H deeper into the structure. An upper surface of the second buffer layer 252 becomes exposed by the holes H. In the illustrated example of this process, the first mask pattern 260 is etched to become thinner.

Figure 3C:
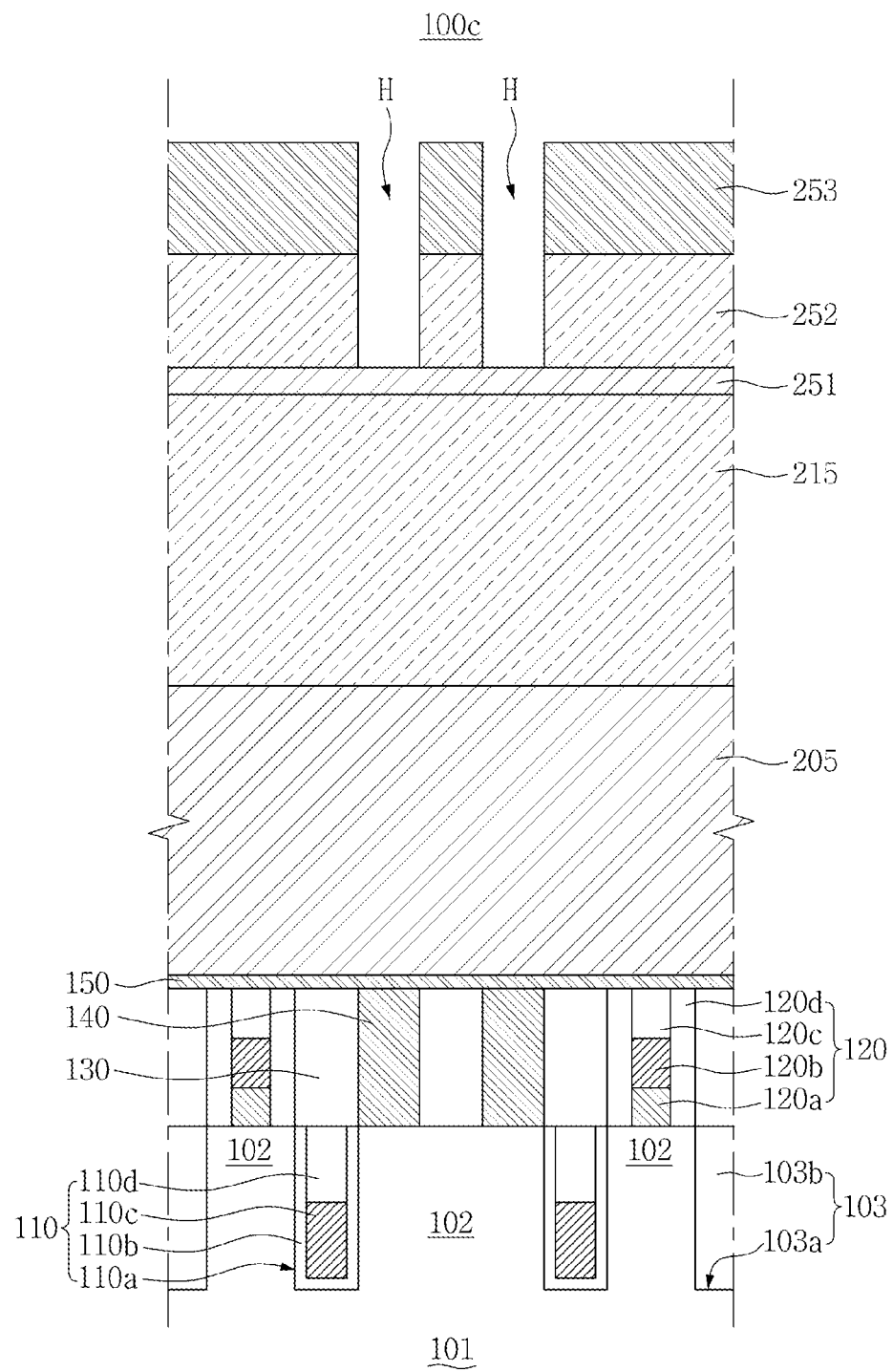

Referring to FIG. 3C, the second buffer layer 252 is selectively etched using the first mask pattern 260 and the third buffer layer 253 as an etch mask to extend the holes H further. An upper surface of the first buffer layer 251 becomes exposed by the holes H. In the illustrated example of this process, the first mask pattern 260 is completely removed, and the third buffer layer 253 becomes thinner.

Figure 3D:
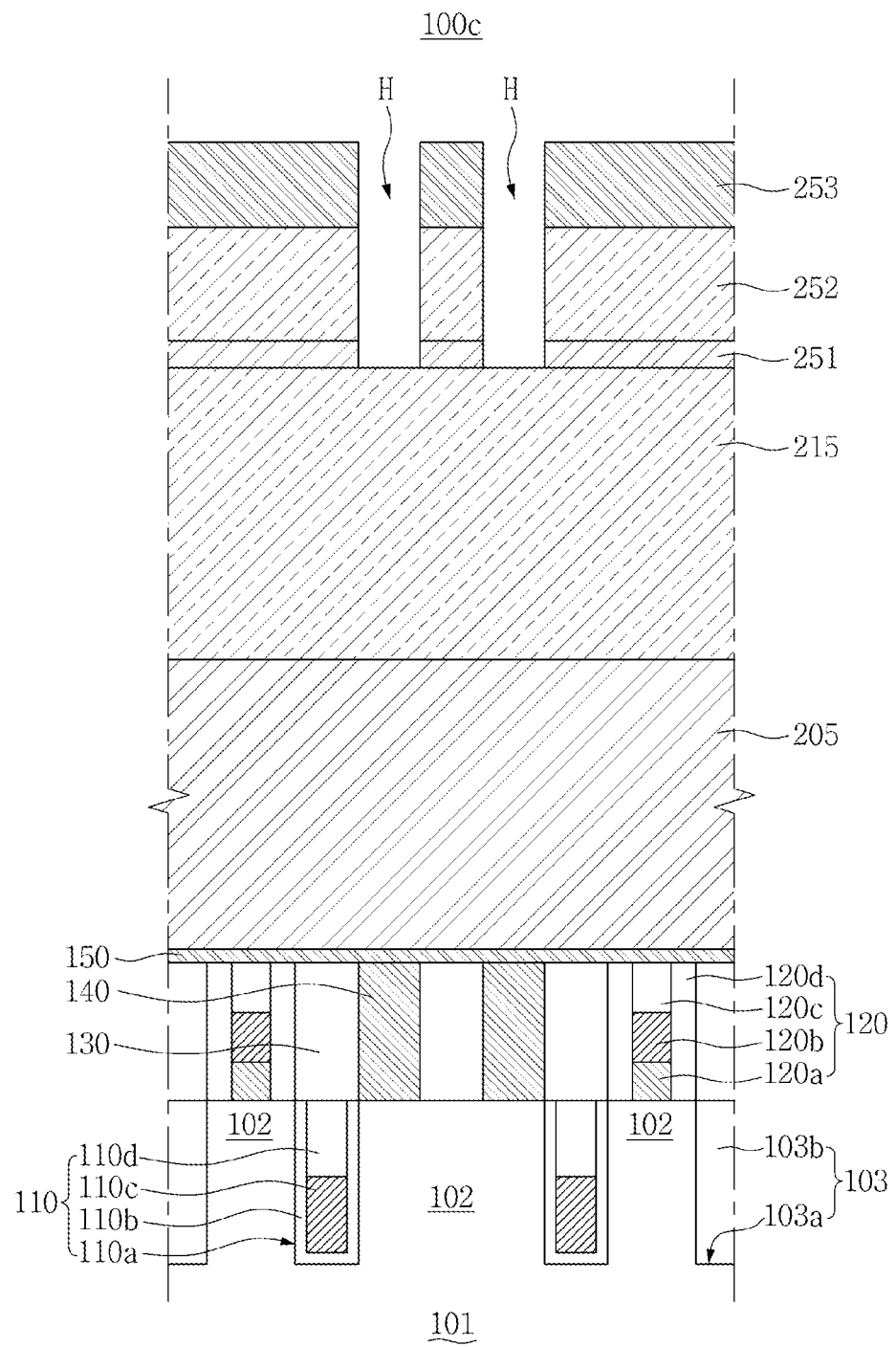

Referring to FIG. 3D, the first buffer layer 251 is selectively etched using the third buffer layer 253 as an etch mask to extend the holes H. An upper surface of the upper molding layer 215 becomes exposed by the holes H. In the illustrated example of this process, the third buffer layer 253 becomes thinner.

Figure 3E:
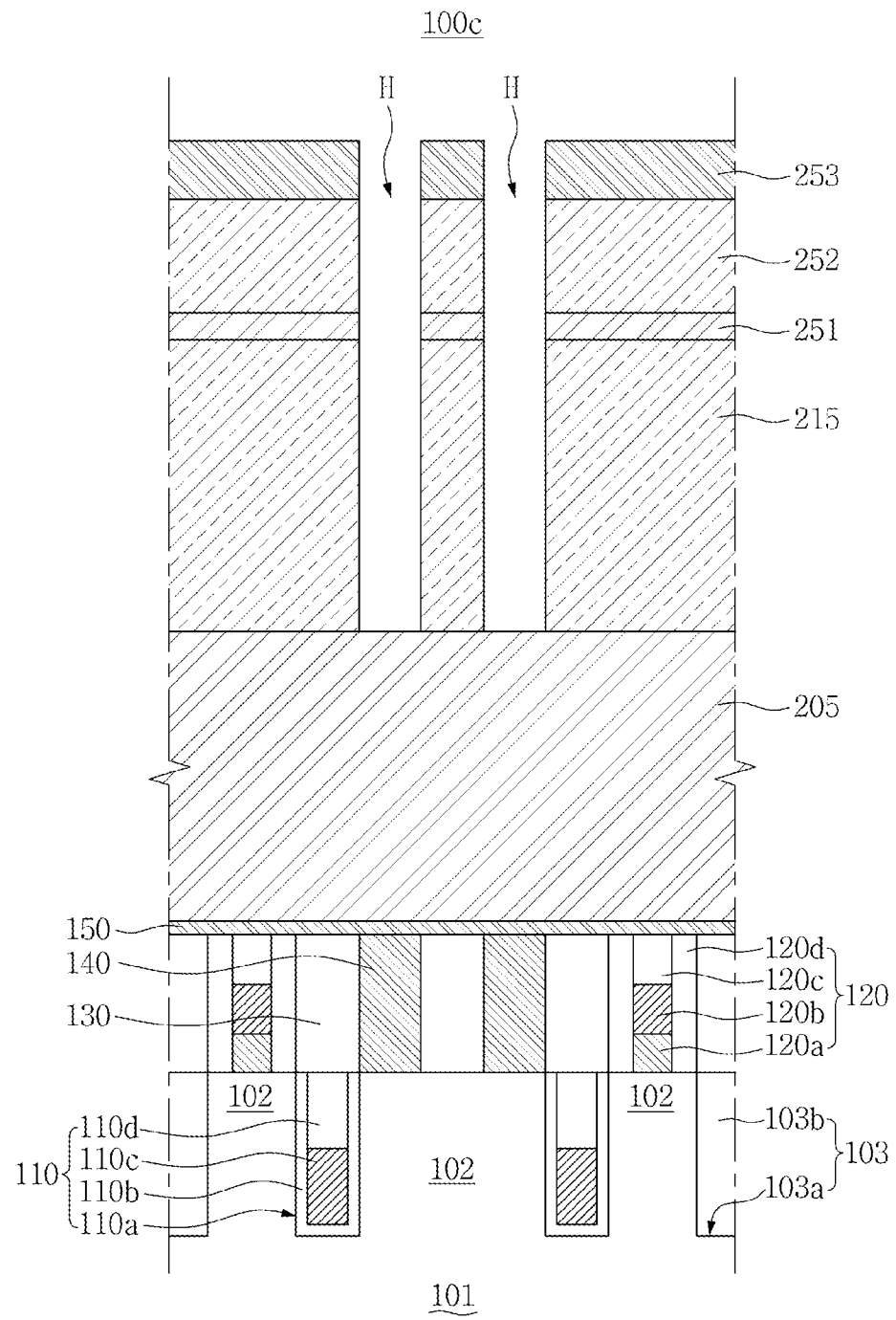

Referring to FIG. 3E, the upper molding layer 215 is selectively etched using the third buffer layer 253 as an etch mask to extend the holes H. The lower molding layer 205 becomes exposed in the holes H. In the illustrated example of this process, the third buffer layer 253 becomes thinner.

Figure 3F:
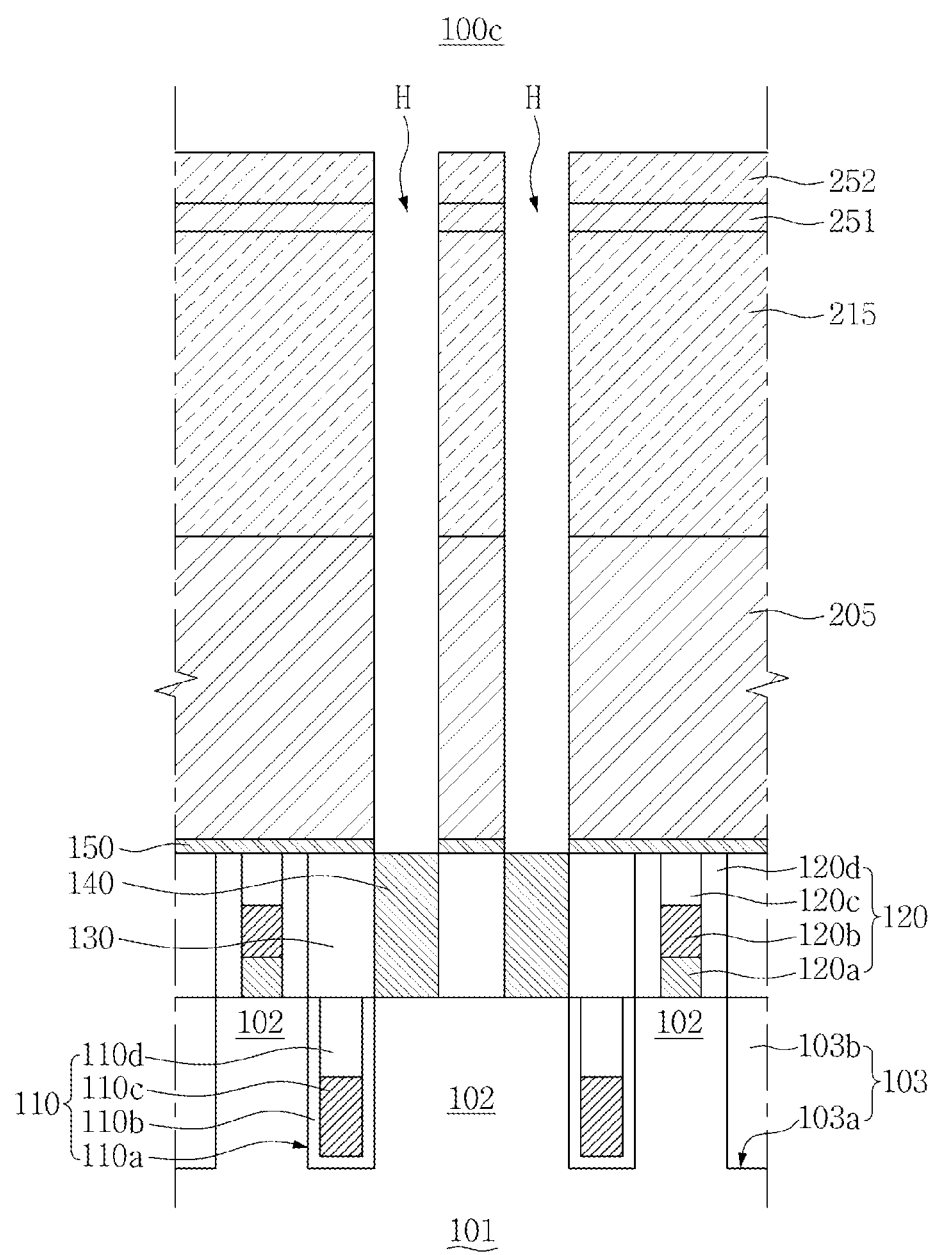

Referring to FIG. 3F, the lower molding layer 205 and the stopping insulating layer 150 are selectively etched using the third buffer layer 253 and the second buffer layer 252 as an etch mask to extend the holes H. An upper surface of the landing pad 140 becomes exposed by the holes H. In the illustrated example of this process, the third buffer layer 253 is completely removed, and the second buffer layer 252 becomes thinner.

Figure 3G:
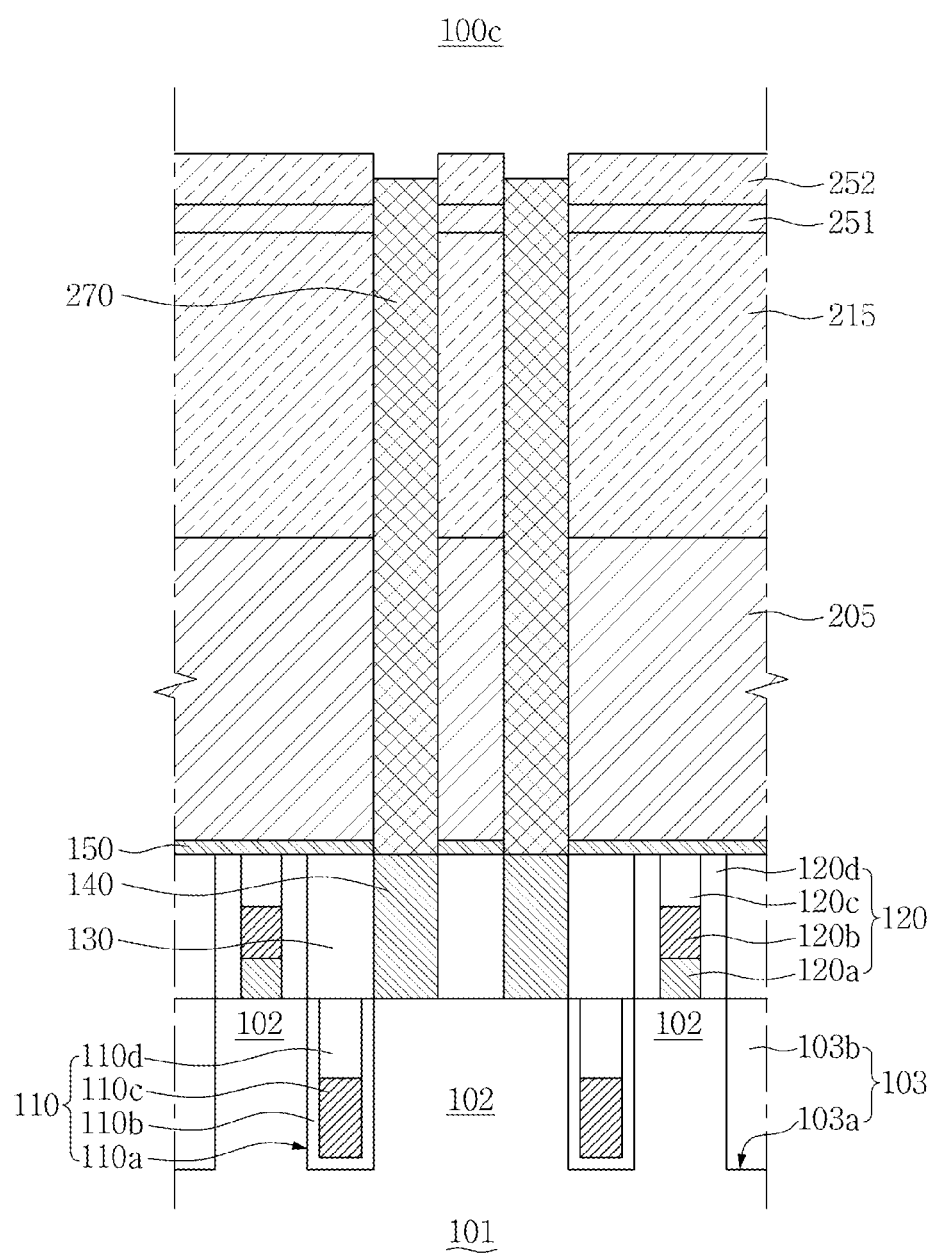

Referring to FIG. 3G, the holes H are filled with a sacrificial layer 270. Also, the sacrificial layer 270 may be recessed by performing an etchback process such that an upper surface thereof becomes situated at a level lower than that of the second buffer layer 252. The sacrificial layer 270 may include a material having etch selectivity with respect to silicon, silicon oxide, and silicon nitride. For example, the sacrificial layer 270 may include an insulating material such as SOH including C or the like.

Figure 3H:
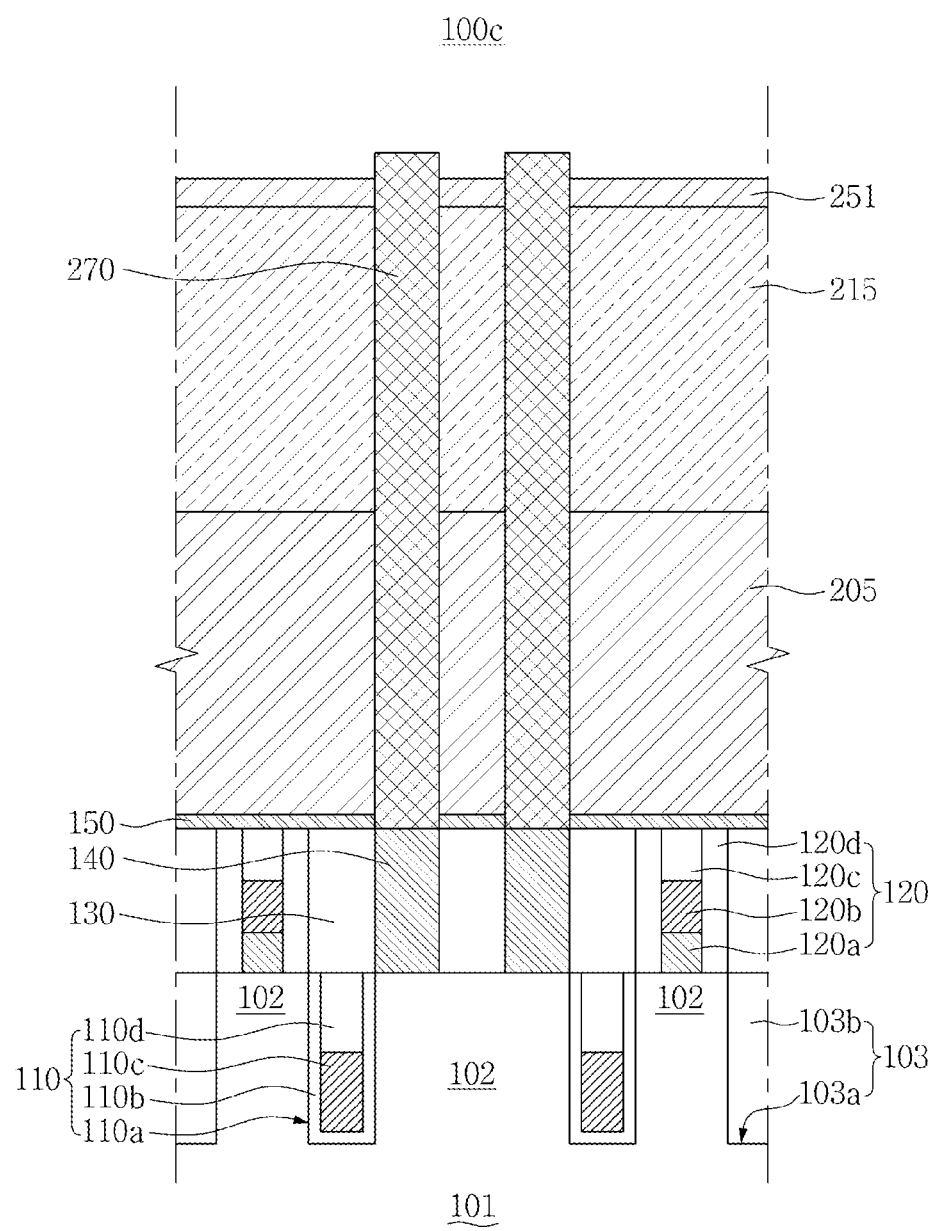

Referring to FIG. 3H, the second buffer layer 252 is removed.

Figure 3I:
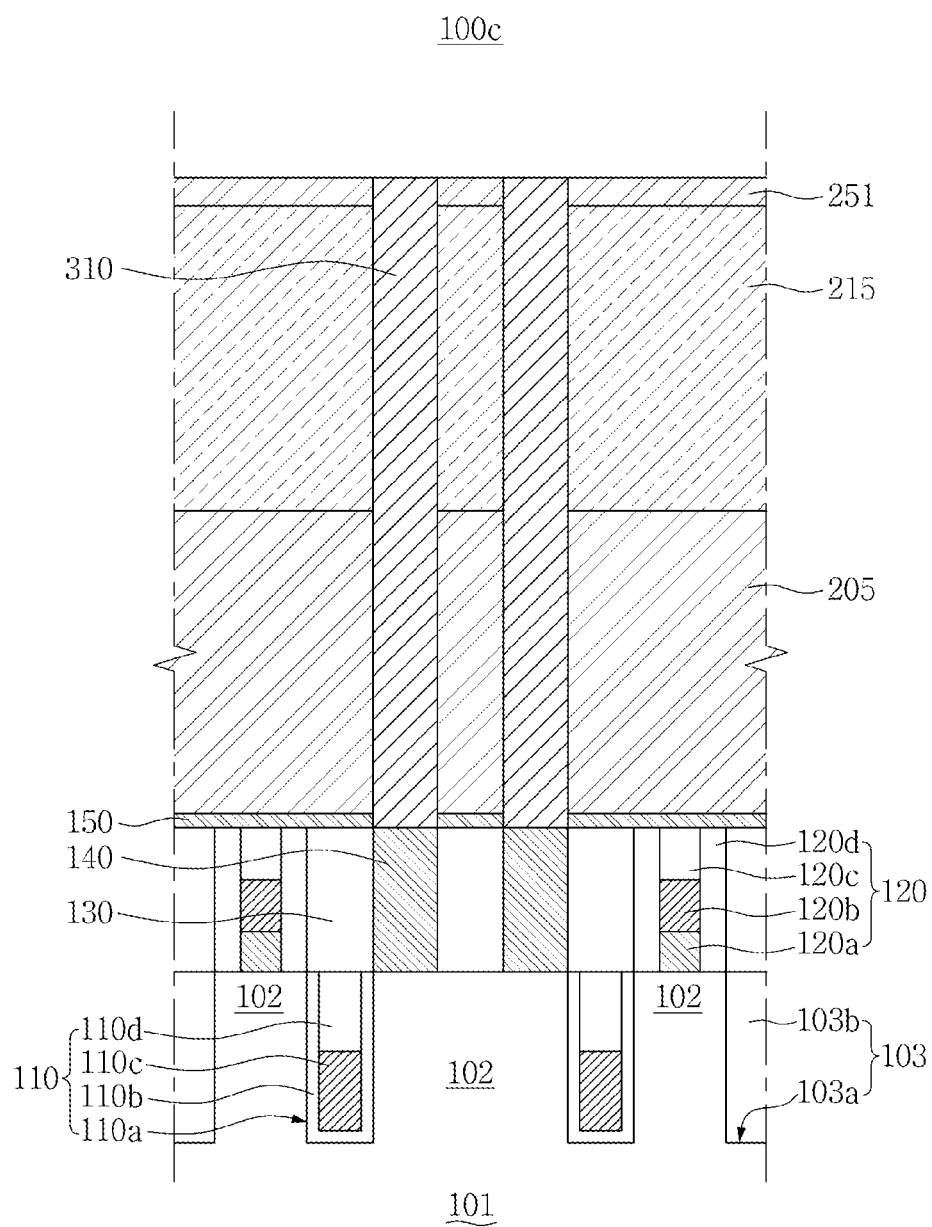

Referring to FIG. 3I, the sacrificial layer 270 is removed to empty the holes H, and the holes H are filled with conductive material to form storage electrodes 310.

Figure 3J:
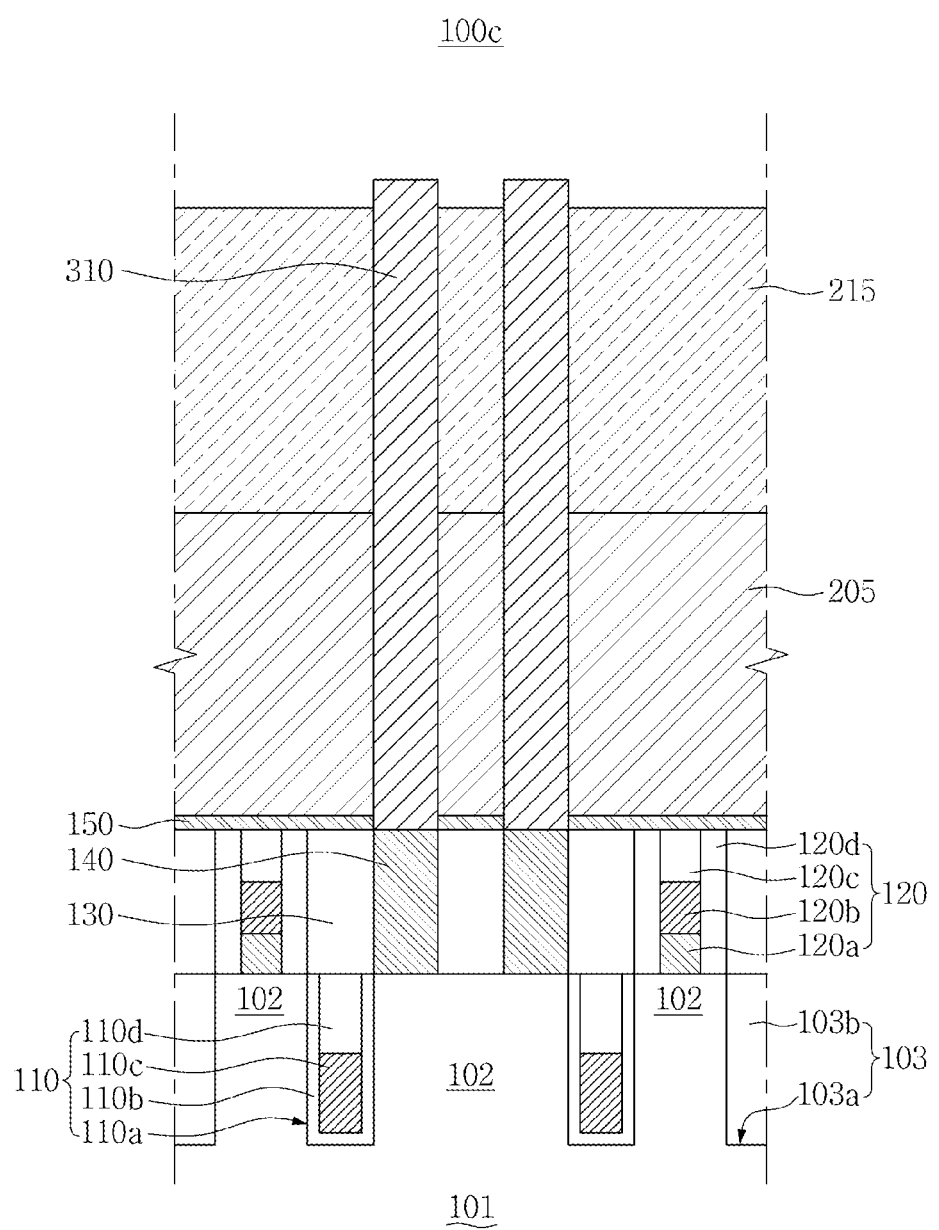

Referring to FIG. 3J, the first buffer layer 251 is removed.

Figure 3K:
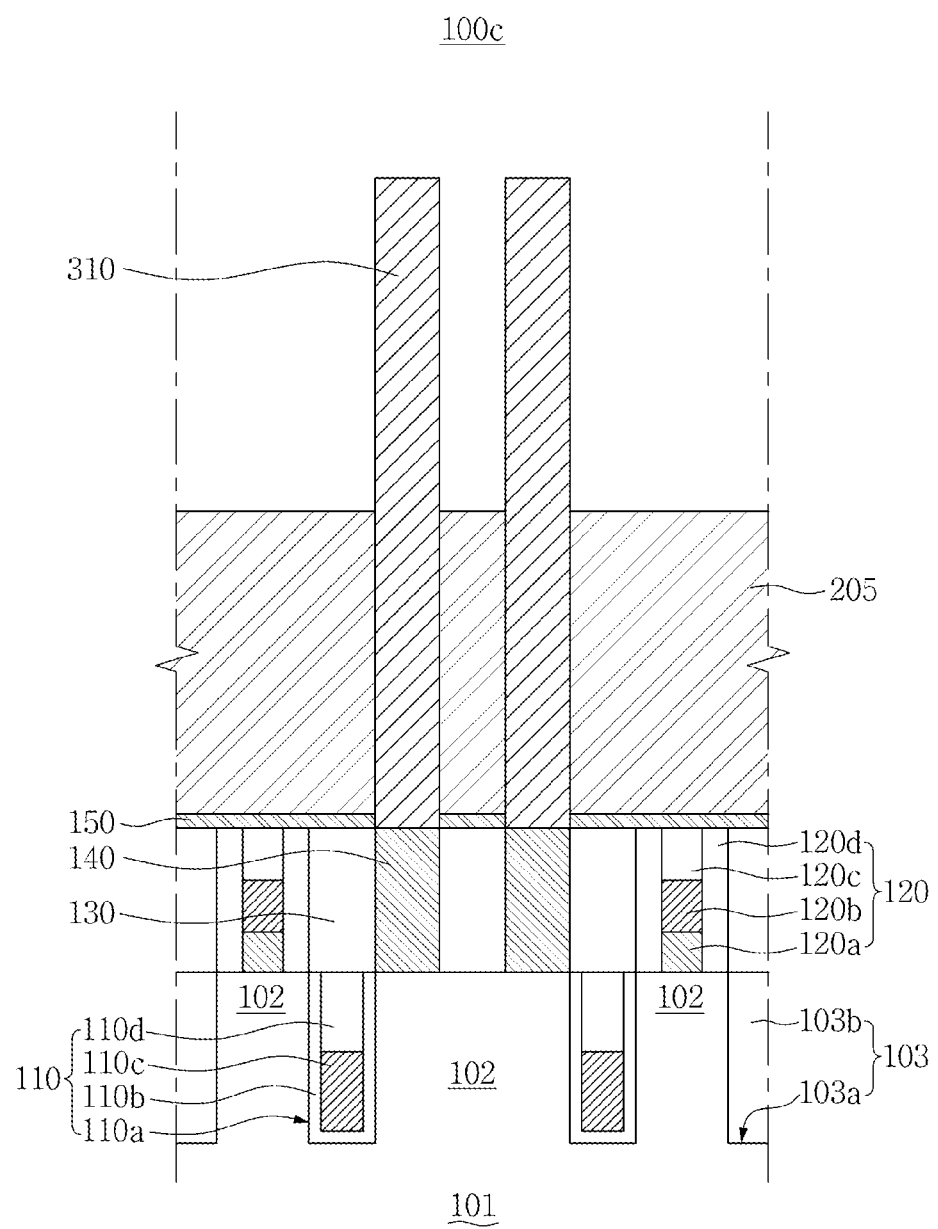

Referring to FIG. 3K, the upper molding layer 215 is removed. As a result, the lower molding layer 205 is exposed.

Figure 3L:
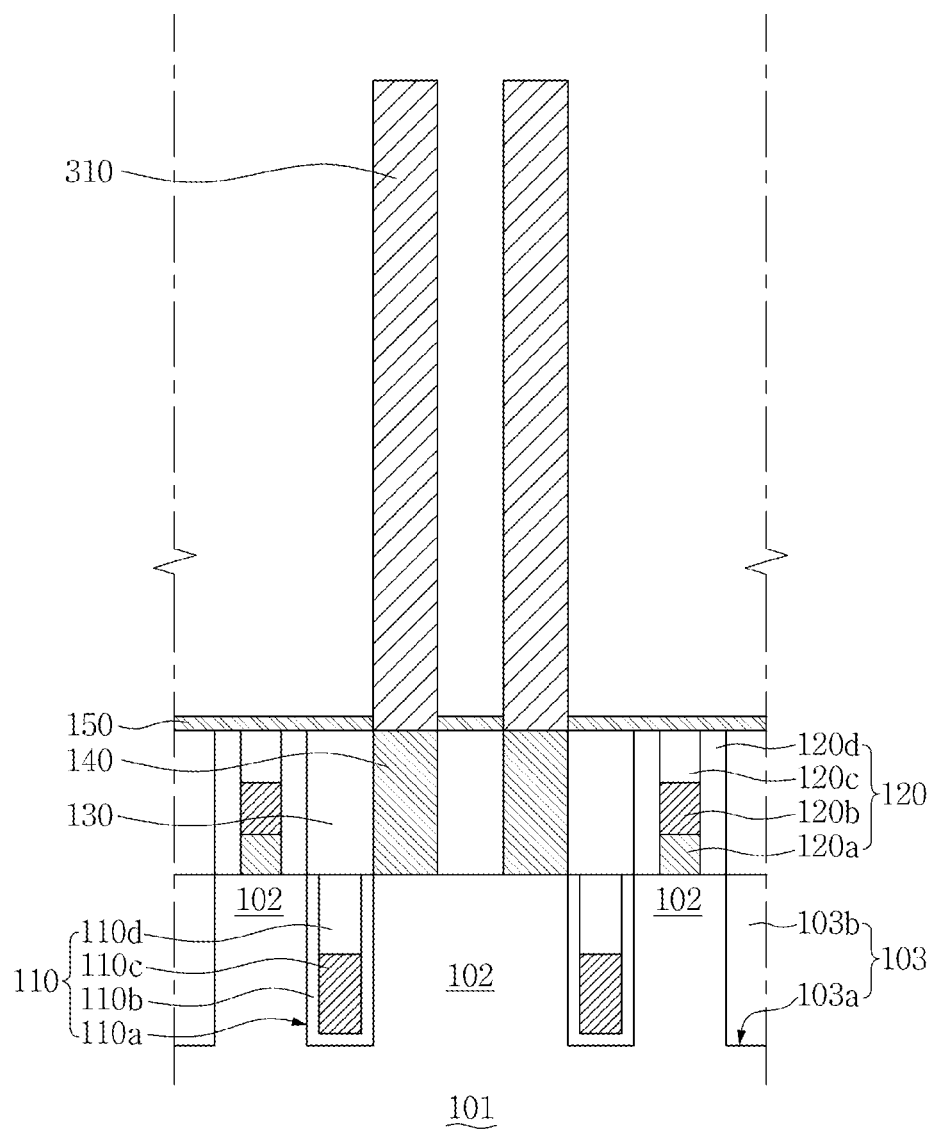

Referring to FIG. 3L, the lower molding layer 205 is removed. Thus, the stopping insulating layer 150 is exposed.

Figure 3M:
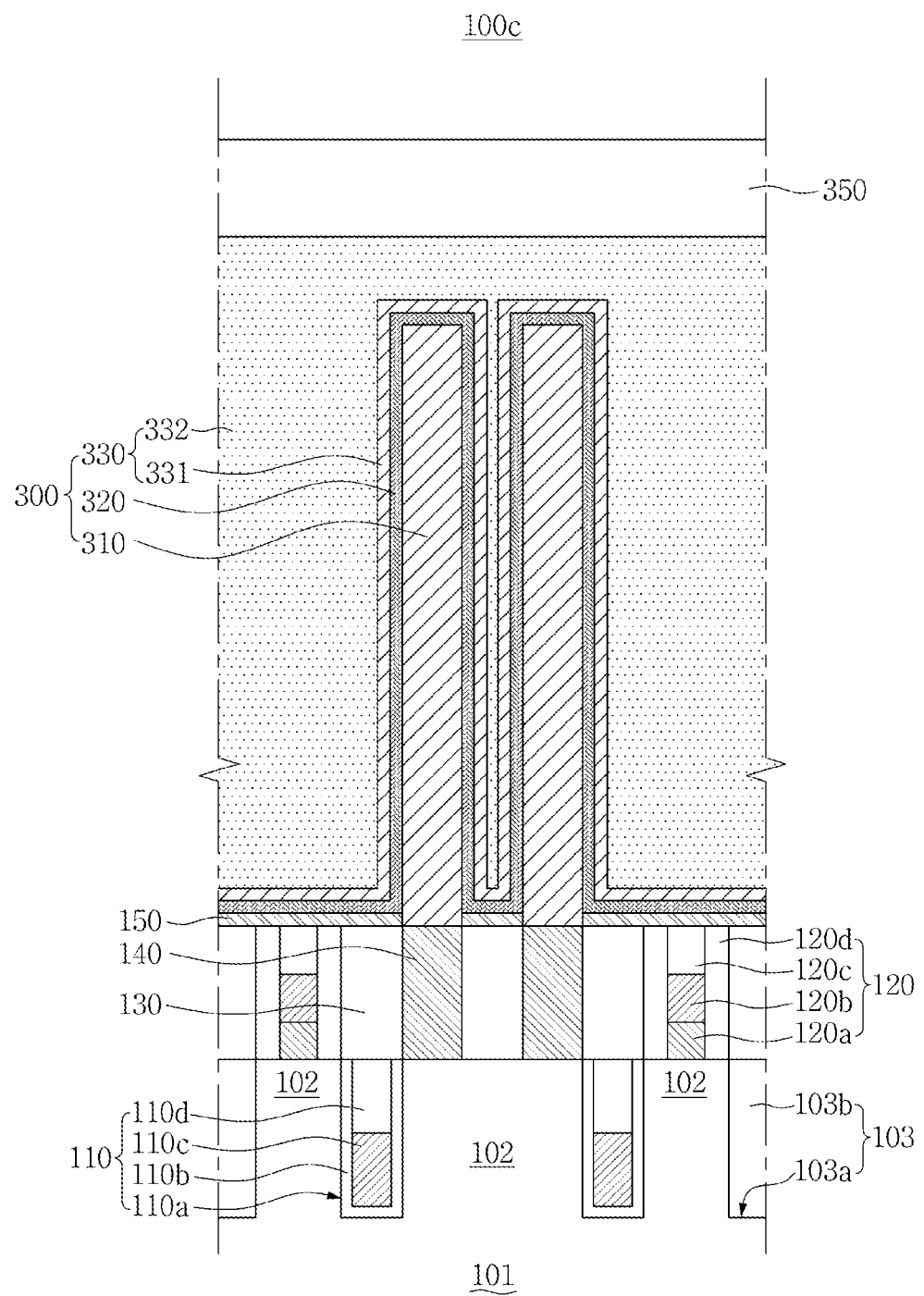

Referring to FIG. 3M, a capacitor 300 is completed by forming a capacitor dielectric layer 320 and a plate electrode 330. The forming of the capacitor dielectric layer 320 may include conformally forming a dielectric material on the surfaces of the storage electrodes 310 and the stopping insulating layer 150. The plate electrode 330 may include a first plate electrode layer 331 and a second plate electrode layer 332. The forming of the first plate electrode layer 331 may include conformally forming a barrier metal layer such as TiN on the capacitor dielectric layer 320. The forming of the second plate electrode layer 332 may include forming a conductive material on the first plate electrode layer 331. For example, the second plate electrode layer 332 may include polysilicon or amorphous silicon. A cell capping insulating layer 350 is formed on the capacitor 300. The forming of the cell capping insulating layer 350 may include forming an insulating layer such as silicon oxide on the second plate electrode layer 332 to cover the capacitor structure 300.

Figure 4A:
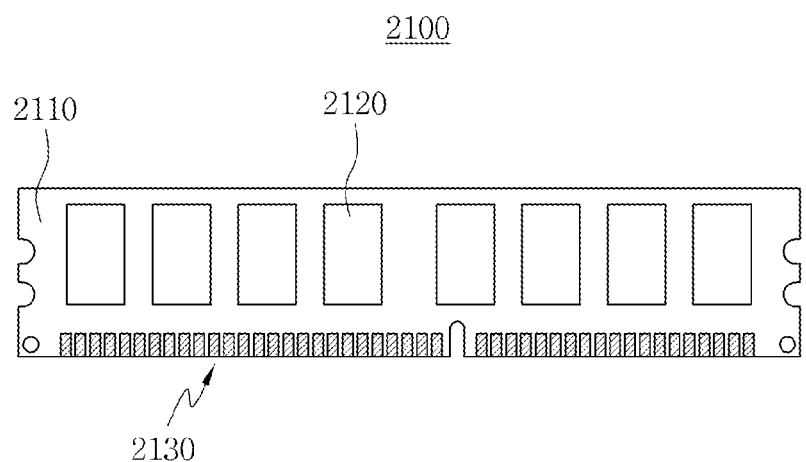
FIG. 4A is a schematic diagram of a memory module including at least one semiconductor device fabricated in accordance with the inventive concepts.

A memory module 2100 including at least one semiconductor device 100a to 100c fabricated in accordance with the inventive concepts is illustrated in FIG. 4A.

The memory module 2100 includes a memory module substrate 2110, and a plurality of memory devices 2120 and terminals 2130 arranged on the memory module substrate 2110. The memory module substrate 2110 may include a printed circuit board or a wafer. The memory devices 2120 may each include one of the semiconductor devices 100a to 100c, or a semiconductor package including one of the semiconductor devices 100a to 100c in accordance with the inventive concepts. The plurality of terminals 2130 may each be of a conductive metal. The terminals 2130 are be electrically connected to the memory devices 2120. Because a semiconductor device fabricated in accordance with the inventive concepts has low leakage current and superior on/off current characteristics, the memory module 2100 offers high performance.

Figure 4B:
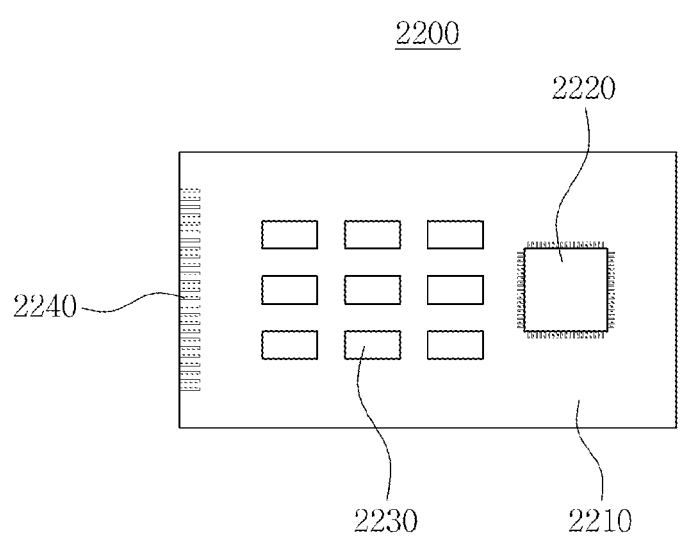
FIG. 4B is a schematic diagram of a memory card including at least one semiconductor device fabricated in accordance with the inventive concepts.

FIG. 4B illustrates a memory card 2200 including at least one of semiconductor device 100a to 100c fabricated in accordance with the inventive concepts.

The memory card 2200 includes a memory card substrate 2210, and at least one of the semiconductor devices 100a to 100c fabricated in accordance with the inventive concepts is mounted on the memory card substrate 2210. The memory card 2200 may further include a microprocessor 2220 mounted on the memory card substrate 2210. Input/output terminals 2240 may be disposed on at least one side of the memory card substrate 2210.

Figure 4C:
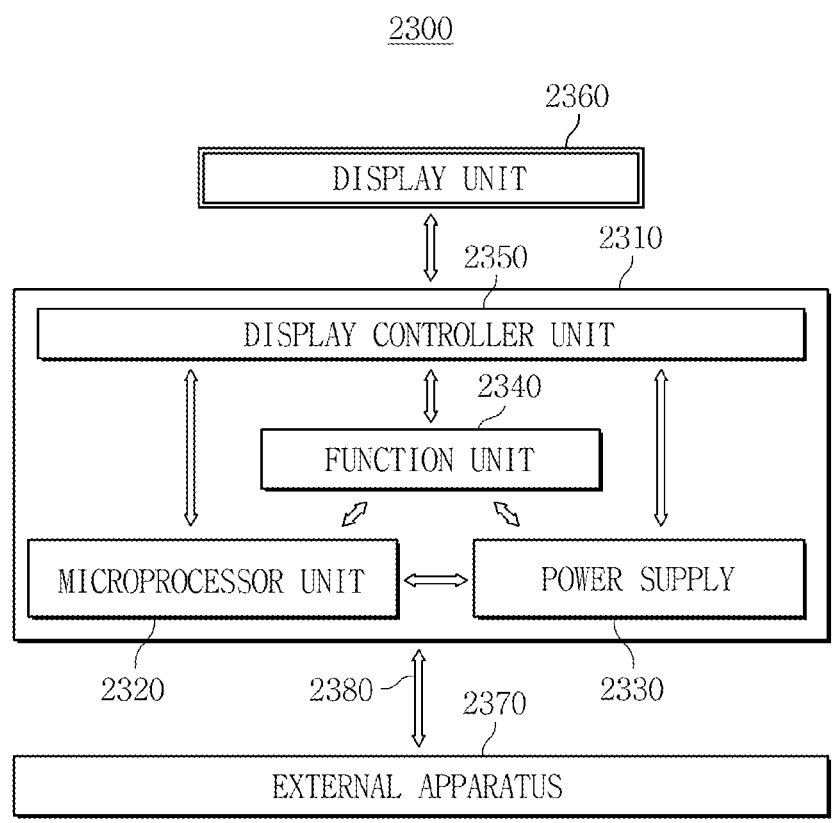
FIG. 4C is a block diagram of an electronic system including at least one semiconductor device fabricated in accordance with the inventive concepts.

FIG. 4C is a block diagram schematically illustrating an electronic system 2300 including at least one of the semiconductor devices 100a to 100c in accordance with various the inventive concepts.

The electronic system 2300 may include a body 2310. The body 2310 may include a microprocessor unit 2320, a power supply (unit) 2330, a function unit 2340, and/or a display controller unit 2350. The body 2310 may be a system board or motherboard including a printed circuit board (PCB). The microprocessor unit 2320, the power supply (unit) 2330, the function unit 2340, and the display controller unit 2350 may be mounted or installed on the body 2310. A display unit 2360 may be arranged on a top surface or outside of the body 2310. For example, the display unit 2360 may be arranged on a surface of the body 2310 and display an image processed by the display controller unit 2350. The power supply (unit) 2330 may receive a constant voltage from an external power source, divide the voltage into various levels, and supply those voltages to the microprocessor unit 2320, the function unit 2340, and the display controller unit 2350, respectively. The microprocessor unit 2320 may receive a voltage from the power supply (unit) 2330 to control the function unit 2340 and the display unit 2360. The function unit 2340 may perform various functions of the electronic system 2300. For example, if the electronic system 2300 is a mobile electronic apparatus such as a mobile phone, the function unit 2340 may have several components which can perform functions of wireless communications such as video output to the display unit 2360, or sound output to a speaker through dialing or communication with an external apparatus 2370. And if the electronic system 2300 includes a camera, the function unit 2340 may function as an image processor. In other embodiments, when the electronic system 2300 is connected to a memory card or the like to expand the memory capacity of the system, the function unit 2340 may be a memory card controller. The function unit 2340 may exchange signals with the external apparatus 2370 through a wired or wireless communications unit 2380. In addition, when the electronic system 2300 requires a universal serial bus (USB) or the like to expand its functionality, the function unit 2340 may function as an interface controller. The microprocessor unit 2320 and the function unit 2340 may each include at least one of the semiconductor devices 100a to 100c fabricated in accordance with the inventive concepts.

Figure 4D:
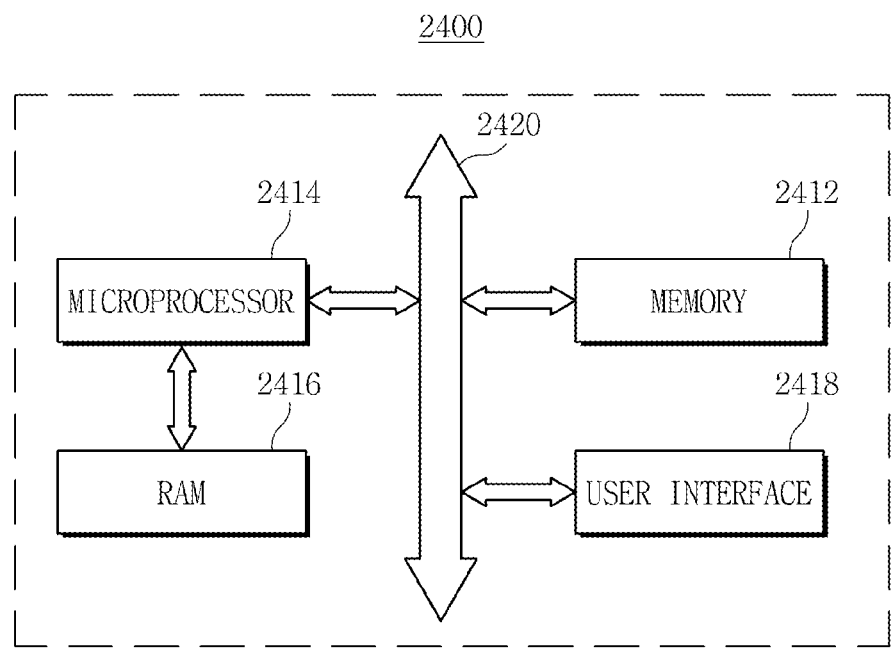
FIG. 4D is a block diagram of another electronic system including at least one semiconductor device fabricated in accordance with the inventive concepts.

FIG. 4D illustrates another electronic system 2400 including at least one of the semiconductor devices 100a to 100c fabricated in accordance with the inventive concepts.

The electronic system 2400 may be employed by a mobile apparatus or a stationary, e.g., desktop, computer. In any case, the electronic system 2400 may include a memory system 2412, a microprocessor 2414 performing data communication using a bus 2420, a random access memory (RAM) 2416, and a user interface 2418. The microprocessor 2414 may program and control the electronic system 2400. The RAM 2416 may be used as an operation memory of the microprocessor 2414. The microprocessor 2414 or the RAM 2416 may include at least one semiconductor device fabricated in accordance with the inventive concepts.

Also, the microprocessor 2414, the RAM 2416, and/or other components of the electronic system 2400 can be assembled in a single package. The user interface 2418 may be used to input/output data to/from the electronic system 2400. The memory system 2412 may store codes for operating the microprocessor 2414, data processed by the microprocessor 2414, or external input data. The memory system 2412 may include a controller and a memory device.

Figure 4E:
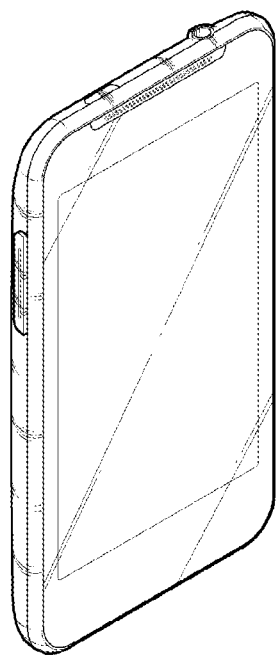
FIG. 4E is a perspective view of a mobile wireless phone or tablet PC including at least one semiconductor device fabricated in accordance with the inventive concepts.

FIG. 4E illustrates a mobile wireless phone or tablet PC 2500 including at least one of the semiconductor devices 100a to 100c fabricated in accordance with the inventive concepts.

The above are just some examples of devices and systems which may semiconductor devices fabricated in accordance with the inventive concepts. In addition, semiconductor devices fabricated in accordance with the inventive concepts may be used in a notebook computer, an MPEG-1 Audio Layer 3 (MP3) player, an MP4 player, a navigation apparatus, a solid state drive (SSD), and in automobiles or home appliances.

According to the methods described above, the lower molding layer 205 and the upper molding layer 215 are of different materials from each other. Therefore, a portion of the lower molding layer 205 and a portion of the upper molding layer 215 may be respectively removed using separate processes in the forming of the holes H constituting a mold cavity to be filled with the storage electrodes 310. Accordingly, the holes H forming the mold cavity for the storage electrodes 310 may have a relatively great overall height and a small aspect ratio, and relatively vertical and smooth sides. Since the sides of the holes are vertical, the spacing between or pitch of the storage electrodes 310 may be relatively small, and the semiconductor devices 100*a*, 100*b*, and 100*c* may have a high degree of integration density.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A method of forming a semiconductor device, comprising:
   forming a landing pad;
   forming a stopping insulating layer on the landing pad;
   forming a lower molding layer including a first material on the stopping insulating layer;
   forming an upper molding layer including a second material of a different type from the first material on the lower molding layer;
   forming a stack of buffer layers on the upper molding layer, wherein the buffer layers comprise respective layers of the first and second materials;
   patterning the buffer layers;
   forming a hole passing vertically through the upper molding layer and the lower molding layer and exposing the landing pad including by:
   selectively etching the upper molding layer with a first etchant while using patterned ones of the buffer layers as an etch mask to form an upper section of the hole passing vertically through the upper molding layer, wherein one of the buffer layers is etched by the first etchant during the etching of the upper molding layer, and
   selectively etching the lower molding layer with a second etchant different from the first etchant and while using only one or more of the buffer layers remaining after the upper section of the hole has been formed as an etch mask, to extend the upper section of the hole vertically through the lower molding layer;
   forming a first electrode in the hole;
   removing the upper molding layer to expose a part of a surface of the first electrode;
   removing the lower molding layer to expose another part of the surface of the first electrode;
   forming a dielectric layer on the exposed parts of the surface of the first electrode; and
   forming a second electrode on the dielectric layer.

2. The method of claim 1, further comprising forming a first supporter on the upper molding layer, and wherein the hole is formed to vertically pass through the first supporter.

3. The method of claim 2, wherein the first supporter comprises silicon nitride.

4. The method of claim 2, further comprising forming a second supporter including silicon nitride on the lower molding layer before the upper molding layer is formed, and wherein the hole is formed to pass vertically through the second supporter.

5. The method of claim 4, wherein the removal of the upper molding layer comprises:
   forming a hard mask after the first electrode is formed, and exposing a part of the first supporter through the hard mask;
   removing the exposed part of the first supporter to form a first opening exposing the upper molding layer; and
   introducing an etchant into the first opening to etch away the upper molding layer.

6. The method of claim 5, wherein the removing of the upper molding layer exposes an upper surface of the second supporter; and
   the removal of the lower molding layer comprises:
   removing a part of the second supporter vertically aligned with the first opening to form a second opening exposing a part of an upper surface of the lower molding layer; and
   introducing an etchant into the second opening to remove the lower molding layer.

7. The method of claim 1, wherein the forming of the first electrode comprises:
   forming a sacrificial layer filling the hole;
   removing the sacrificial layer to empty the hole; and
   filling the emptied hole with conductive material.

8. The method of claim 7, wherein the sacrificial layer includes a material having etch selectivity with respect to the lower and upper molding layers.

9. The method of claim 1, wherein the forming of the stack of buffer layers comprises:
   forming a first buffer layer having etch selectivity with respect to the upper molding layer on the upper molding layer,
   forming a second buffer layer having etch selectivity with respect to the first buffer layer on the first buffer layer, and
   forming a third buffer layer having etch selectivity with respect to the second buffer on the second buffer layer; and
   the patterning of the buffer layers comprises:
   forming a mask pattern having etch selectivity with respect to the third buffer layer on the third buffer layer,
   selectively etching the third buffer layer using the mask pattern as an etch mask,
   selectively etching the second buffer layer using the third buffer layer as an etch mask, and
   selectively etching the first buffer layer using the second buffer layer as an etch mask.

10. The method of claim 9, wherein the first buffer layer is of the same type of material as the lower molding layer, the second buffer layer is of the same type of material as the upper molding layer, and the third buffer layer is of a different material than each of the lower and upper molding layers.

11. The method of claim 9, wherein the forming of the stack of buffer layers further comprises:
    forming a fourth buffer layer having etch selectivity with respect to the third buffer layer on the third buffer layer before the mask pattern is formed so that the mask pattern is formed on the fourth buffer layer; and
    the patterning of the buffer layers comprises:
    selectively etching the fourth buffer layer using the mask pattern as an etch mask, and
    selectively etching the third buffer layer using the fourth buffer layer as an etch mask.

12. The method of claim 11, wherein the first buffer layer, the third buffer layer, and the upper molding layer are of the same type of material, and the second buffer layer and the lower molding layer are of the same type of material.

13. A method of forming a semiconductor device, comprising:
    forming a buried type gate structure in a substrate;
    forming a bit line structure and a plurality of landing pads on the substrate;
    forming a stopping insulating layer on the bit line structure and the landing pads;
    forming a lower molding layer on the stopping insulating layer;
    forming an upper molding layer on the lower molding layer;
    forming a first supporter on the upper molding layer;
    forming a stack of buffer layers on the first supporter including by forming a first buffer layer on the first supporter, forming a second buffer layer on the first buffer layer and forming a third buffer layer on the second buffer layer;
    patterning the buffer layers to form patterned first, second and third buffer layers;
    forming holes each passing vertically through the first supporter, the upper molding layer, the lower molding layer, and the stopping insulating layer and exposing the landing pads, respectively, including by:
    selectively etching the first supporter with a first etchant while using the patterned first, second and third buffer layers as an etch mask to form an initial section of each of the holes passing vertically through the first supporter, and wherein the first etchant etches the patterned third buffer layer and leaves the first and second patterned buffer layers on the first supporter,
    selectively etching the upper molding layer with a second etchant different from that first etchant and while using the first and second patternend buffer layers as an etch mask to extend the initial section of each of the holes vertically through the upper molding layer, wherein the second etchant etches the second patterned buffer layer and leaves the first patterned buffer layer on the first supporter;
    selectively etching the lower molding with an etchant different from the second etchant and while using the first patterned buffer layer as an etch mask to further extend each of the holes vertically through the lower molding layer;
    forming storage electrodes in the holes;
    removing a part of the first supporter located between the storage electrodes to expose the upper molding layer between the storage electrodes;
    removing the upper molding layer to expose parts of surfaces of the storage electrodes;
    removing the lower molding layer to expose other parts of the surfaces of the storage electrodes;
    forming a capacitor dielectric layer on the exposed parts of the surfaces of the storage electrodes, a surface of the stopping insulating layer and a surface of the first supporter; and
    forming a plate electrode on the capacitor dielectric layer.

14. The method of claim 13, further comprising:
    forming a second supporter of the same type of material as the first supporter on the lower molding layer before the upper molding layer is formed so that the second supporter is interposed between the lower molding layer and the upper molding layer, and
    wherein the holes each pass vertically through the second supporter;
    the removing of the upper molding layer exposes a surface of the second supporter, and
    an exposed part of the second supporter is removed to expose part of the lower molding layer.

15. The method of claim 13, further comprising:
    forming a fourth buffer layer on the third buffer layer; and
    forming a mask pattern on the fourth buffer layer, and
    wherein the forming of the holes comprises etching the fourth buffer layer, the third buffer layer, the second buffer layer, and the first buffer layer using the mask pattern as an etch mask, and
    wherein the stopping insulating layer, the first supporter, and the fourth buffer layer are each of a first material, the lower molding layer and the second buffer layer are each of a second material of a type different from the first material, and the upper molding layer, the first buffer layer, and the third buffer layer are each of a third material of a type different from the second material.

16. A method of forming a semiconductor device, comprising:
    forming a pad of electrically conductive material;
    forming an etch stop layer of insulating material on the pad;
    forming a lower molding layer on the etch stop layer;
    forming an upper molding layer on the lower molding layer, and wherein the upper molding layer has an etch selectivity with respect to the lower molding layer;
    forming a stack of buffer layers on the upper molding lower, and wherein the buffer layers comprise layers of the same types of materials as those of the upper and lower molding layers, respectively, such that one of the buffer layers has an etch selectivity with respect to another of the buffer layers;
    selectively etching the upper molding layer, the lower molding layer and the etch stop layer to form a hole that exposes the pad, including by:
    patterning the buffer layers,
    selectively etching the upper molding layer using a first etchant that has an etch selectivity with respect to the lower molding layer, and wherein said one of the patterned buffer layers is etched by the first etchant, and
    selectively etching the lower molding layer with a second etchant different from the first after said one of the patterned buffer layers has been etched by the first etchant, and wherein said another of the patterned buffer layers is etched by the first etchant;
    forming a first electrode in the hole after the hole has been extended to expose the pad;
    after the first electrode is formed, removing the upper molding layer with a third etchant of the same type as the first etchant to form a space that exposes a part of a side surface of the first electrode;
    subsequently removing the lower molding layer with a fourth etchant of the same type as the second etchant to expand the space such that the expanded space also exposes another part of the side surface of the first electrode;
    forming a dielectric layer on the exposed parts of the side surface of the first electrode; and
    forming a second electrode on the dielectric layer.

17. The method of claim 16, wherein the lower molding layers is formed of silicon oxide, and the upper molding layer is formed of polysilicon or amorphous silicon.

18. The method of claim 17, wherein the etch stop layer is formed of silicon nitride.

19. The method of claim 16, further comprising forming a first supporter on the upper molding layer, and
    wherein the selective etching includes selectively etching the first supporter such that the hole also passes vertically through the first supporter, the first electrode is formed to pass through the first supporter, and the removal of the upper molding layer comprises:

forming a hard mask on the first supporter, and which exposes a part of the first supporter, removing the exposed part of the first supporter to form a first opening exposing the upper molding layer, and introducing the third etchant into the first opening to etch away the upper molding layer without etching the lower molding layer.

20. The method of claim 19, wherein the forming of the first electrode comprises:

forming a sacrificial layer that fills the hole that extends through at least the lower and upper molding layers;

removing the sacrificial layer to empty the hole; and filling the emptied hole with conductive material.

* * * * *